(12) United States Patent
Ooishi

(10) Patent No.: US 6,849,888 B2
(45) Date of Patent: Feb. 1, 2005

(54) SEMICONDUCTOR MEMORY DEVICE, NONVOLATILE MEMORY DEVICE AND MAGNETIC MEMORY DEVICE PROVIDED WITH MEMORY ELEMENTS AND INTERCONNECTIONS

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/387,540

(22) Filed: Mar. 14, 2003

(65) Prior Publication Data

US 2004/0056289 A1 Mar. 25, 2004

(30) Foreign Application Priority Data

Sep. 24, 2002 (JP) ........................... 2002-277500

(51) Int. Cl.[7] ........................................... H01L 31/119
(52) U.S. Cl. ................. 257/295; 257/751; 257/758; 257/773; 365/97; 365/158; 365/200
(58) Field of Search ....................... 257/295, 751, 257/758, 773, 659; 365/97, 158, 200, 171; 438/128, 240, 622, 3, 253

(56) References Cited

U.S. PATENT DOCUMENTS

| | | | | |
|---|---|---|---|---|
| 6,043,118 A | * | 3/2000 | Suwanai et al. | ............ 438/253 |
| 6,245,663 B1 | * | 6/2001 | Zhao et al. | ................. 438/622 |
| 6,258,654 B1 | * | 7/2001 | Gocho | ........................ 438/240 |
| 6,485,988 B2 | * | 11/2002 | Ma et al. | ....................... 438/3 |
| 6,560,135 B2 | * | 5/2003 | Matsuoka et al. | ............ 365/97 |
| 6,707,085 B2 | * | 3/2004 | Jang et al. | .................. 257/295 |
| 6,754,098 B2 | * | 6/2004 | Kunikiyo | ..................... 365/158 |

FOREIGN PATENT DOCUMENTS

| | | |
|---|---|---|
| JP | 60-113445 | 6/1985 |
| JP | 2001-244435 | 9/2001 |
| JP | 2002-117669 | 4/2002 |

OTHER PUBLICATIONS

M. Durlam et al., "Nonvolatile RAM based on Magnetic Tunnel Junction Elements", ISSCC Digest of Technical Papers, TA 7.3, Feb. 2000, pp. 130–131.

* cited by examiner

Primary Examiner—David Nelms
Assistant Examiner—Dao H. Nguyen
(74) Attorney, Agent, or Firm—Burns, Doane, Swecker & Mathis, L.L.P.

(57) ABSTRACT

A semiconductor memory device, a nonvolatile memory device and a magnetic memory device of high reliability are obtained. A semiconductor device as the magnetic memory device includes TMR cells as memory elements, and a stacked interconnection as an interconnection. The stacked interconnection has a first interconnection made of a barrier metal film and a conductor, and a second interconnection made of another barrier metal film and another conductor and stacked on the first interconnection. The stacked interconnection is arranged opposite to the TMR cells. The stacked interconnection is made thicker in the portions facing the TMR cells than in the portions not facing the TMR cells.

10 Claims, 43 Drawing Sheets

SEMICONDUCTOR MEMORY DEVICE, NONVOLATILE MEMORY DEVICE AND MAGNETIC MEMORY DEVICE PROVIDED WITH MEMORY ELEMENTS AND INTERCONNECTIONS

BACKGROUND OF THE INVENTION

1. Field of the Invention

The present invention relates to semiconductor memory devices, nonvolatile memory devices and magnetic memory devices, and more particularly to a semiconductor memory device, a nonvolatile memory device and a magnetic memory device of high reliability.

2. Description of the Background Art

In recent years, a magnetic random access memory (MRAM) has been studied as a next-generation semiconductor memory device.

For example, "Nonvolatile RAM based on Magnetic Tunnel Junction Elements", ISSCC Digest of Technical Papers, February 2000, pp. 130–131, discloses a memory cell of an MRAM that is a so-called "1 MTJ+1 transistor type" nonvolatile memory device formed of a tunneling magneto-resistive (TMR) element including a magnetic tunnel junction (MTJ) and a transistor (see FIG. 7.3.1 of the paper). The memory cell of the MRAM disclosed in the paper as an example of the magnetic memory device or nonvolatile memory device has a digit line arranged beneath the TMR element with an insulating layer interposed therebetween. A bit line is arranged in contact with an upper surface of the TMR element. Currents are passed through the digit line and the bit line to generate a magnetic field, which is used to change a magnetization direction of a ferromagnetic layer as a free layer constituting the MTJ of the TMR element, thereby allowing data rewriting in the corresponding memory cell.

In the case where a memory cell portion including the memory cell of the MRAM as described above is to be formed additionally on a semiconductor substrate on which a logic portion including a control circuit and others has been formed, it would be possible to form conductor layers such as the digit line and the bit line in the memory cell portion with the same layers as interconnection layers in the logic portion. The interconnection layers in the logic portion, however, have a distance therebetween (thickness of an interlayer insulating film located between two of the interconnection layers stacked one on another) that is determined taking account of parasitic capacitance and others of the interconnection structure in the logic portion. Thus, forming the digit line and the bit line in the memory cell portion simply with the same layers as the interconnection layers in the logic portion would make the interval between the digit line and the TMR element formed beneath the bit line (thickness of an interlayer insulating film between the TMR element and the digit line) unnecessarily large from the standpoint of the characteristics required for the memory cell.

With such an unnecessarily large interval (distance) between the digit line and the TMR element, the magnetic field generated by the current passed through the digit line and applied to the TMR element would be insufficient in strength, with which the magnetization direction of the free layer as described above would not be changed accurately (hindering data rewriting), thereby degrading reliability.

SUMMARY OF THE INVENTION

An object of the present invention is to provide a semiconductor memory device, a nonvolatile memory device and a magnetic memory device that are high in reliability.

The semiconductor memory device according to an aspect of the present invention includes a memory element and an interconnection. The interconnection is arranged to face the memory element. A portion of the interconnection facing the memory element has a thickness greater than that of a portion of the interconnection not facing the memory element.

With this configuration, it is possible to increase a cross section of the portion of the interconnection facing the memory element. Accordingly, interconnection resistance can be reduced, and thus, a delay in operation and malfunction and others of the semiconductor memory device attributable to the interconnection resistance can be restricted. As a result, reliability of the semiconductor memory device improves. Further, provided that the current amount passed through the interconnection is constant, the current density on the interconnection can also be reduced.

The nonvolatile memory device according to another aspect of the present invention includes a memory cell portion having a memory cell formed therein, and a logic portion having a logic circuit formed therein, on a substrate. The logic portion includes a first interconnection and a second interconnection. The first interconnection is formed on the substrate. The second interconnection is formed above the first interconnection, with only a layer other than a conductor layer constituting the logic circuit interposed therebetween. The memory cell portion includes a third interconnection, a fourth interconnection, a memory element and a conductor layer. The third interconnection is formed with the same layer as the first interconnection. The fourth interconnection is formed with the same layer as the second interconnection. The memory element and the conductor layer are formed between the third interconnection and the fourth interconnection. The memory element and the conductor layer constitute the memory cell.

Here, if the conductor layer and others of the memory cell were to be formed using the interconnection layers formed of the same layers as the first and second interconnections, it would be necessary to provide an additional interconnection layer to form the interconnection structure constituting the logic portion located in different layer from the conductor layer. However, according to the configuration as described above, the interconnection layers formed with the same layers as the first and second interconnections can be used for the interconnection structure constituting the logic portion. In other words, the present invention eliminates the need to form an additional interconnection layer for the interconnection structure of the logic portion.

The magnetic memory device according to a further aspect of the present invention includes a magneto-resistive element operating as a memory element, and an interconnection arranged to contact the magneto-resistive element. In the interconnection, a portion facing the magneto-resistive element has a thickness greater than that of a portion other than the portion facing the magneto-resistive element.

With this configuration, the cross section of the interconnection is increased to reduce interconnection resistance. This makes it possible to lessen potential decrease of the interconnection, and thus, to narrow channel width of a driver transistor for causing a current to pass through the interconnection. As a result, a magnetic memory device reduced in size and increased in density can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The inventors studied to implement a semiconductor device having an MRAM and a logic circuit mounted together on a same semiconductor substrate, by adding the MRAM to the semiconductor device having the logic circuit already formed therein. The semiconductor device associated with the present invention is described with reference to FIG. 43.

Figure 43:
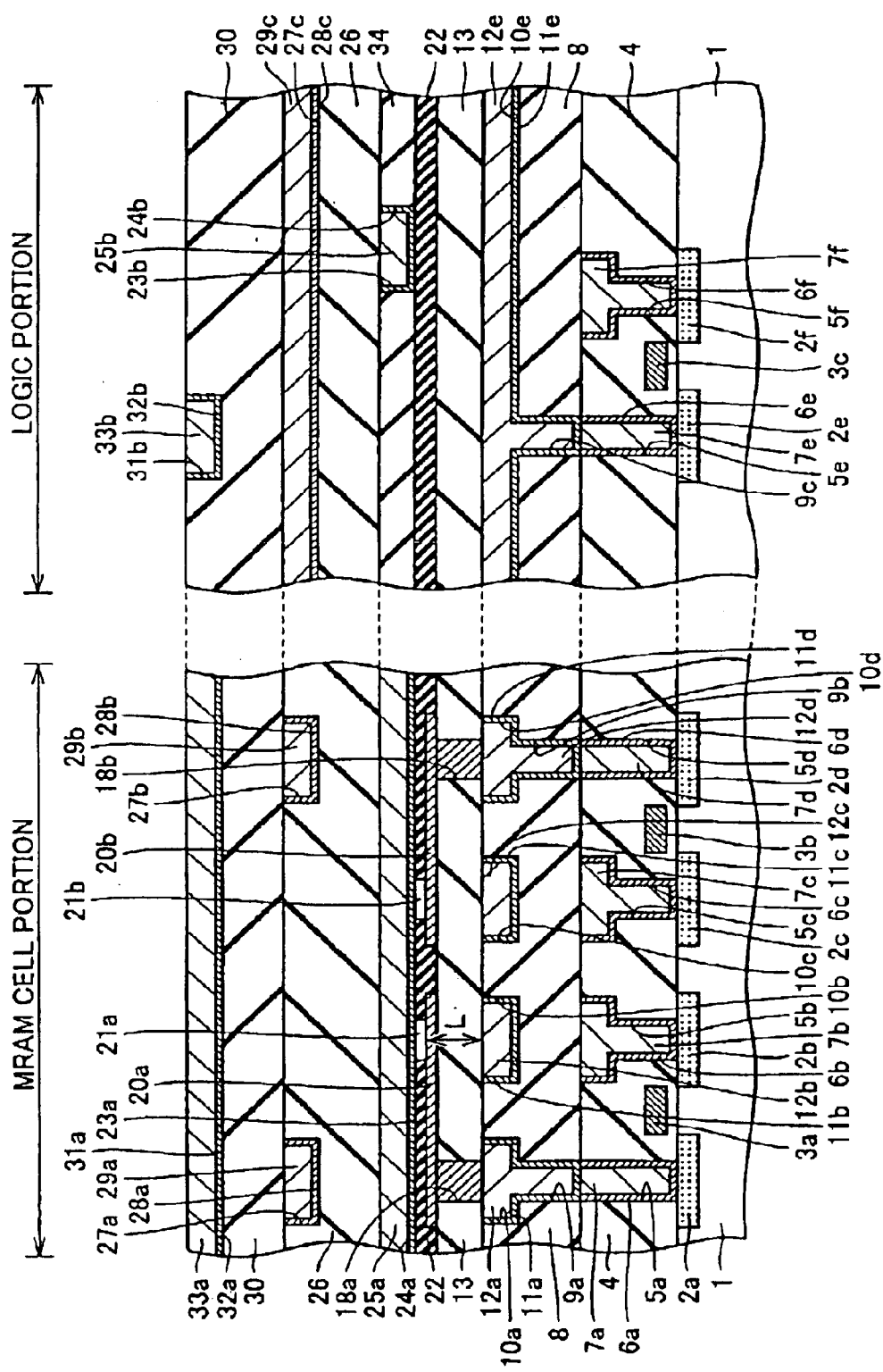
FIG. 43 is a schematic cross sectional view of a semiconductor device associated with the present invention studied by the inventors.

Referring to FIG. 43, the semiconductor device is provided with an MRAM cell portion and a logic portion. The MRAM cell portion has memory cells of the MRAM (or MRAM cells) utilizing TMR cells 21a, 21b formed therein. The logic portion has a field effect transistor constituting the logic circuit for control of the MRAM cells and others. Hereinafter, the structure of the semiconductor device is described specifically.

In the MRAM cell portion of the semiconductor device shown in FIG. 43, source/drain regions 2a–2d of the field effect transistors are formed in a main surface of a semiconductor substrate 1. Source/drain regions 2a, 2b are arranged on opposite sides of a channel region, and a gate electrode 3a is formed above the channel region with a gate insulating film interposed therebetween. Gate electrode 3a, the gate insulating film and source/drain regions 2a, 2b constitute the field effect transistor as switching means of the MRAM cell. Similarly, a gate electrode 3b is formed above a channel region between source/drain regions 2c, 2d formed in the main surface of semiconductor substrate 1, with a gate insulating film interposed therebetween. Gate electrode 3b, the gate insulating film and source/drain regions 2c, 2d constitute another field effect transistor as the switching means.

A first interlayer insulating film 4 is formed on gate electrodes 3a, 3b of the field effect transistors. In first interlayer insulating film 4, contact holes 5a–5d are formed in the regions immediately above source/drain regions 2a–2d, respectively. Barrier metal films 6a–6d are formed on the inner walls of respective contact holes 5a–5d. Conductor plugs 7a–7d are formed on barrier metal films 6a–6d, respectively, to fill in contact holes 5a–5d.

A second interlayer insulating film 8 is formed on first interlayer insulating film 4. In second interlayer insulating film 8, through holes 9a, 9b are formed in the regions immediately above contact holes 5a, 5d, respectively, and grooves for formation of interconnections therein (hereinafter, referred to as "interconnection grooves" or simply "grooves") 10a, 10d are formed in the upper portions of respective through holes 9a, 9b. Grooves 10b, 10c are formed in the upper surface of second interlayer insulating film 8 in the regions immediately above contact holes 5b, 5c, respectively, formed in first interlayer insulating film 4. Barrier metal films 11a–11d and conductors 12a–12d are formed inside through holes 9a, 9b and interconnection grooves 10a–10d.

A third interlayer insulating film 13 is formed on second interlayer insulating film 8. In third interlayer insulating film 13, openings 18a, 18b are formed in the regions immediately above respective grooves 10a, 10d. Openings 18a, 18b are filled with conductors.

On third interlayer insulating film 13, straps 20a, 20b of conductors extend from the positions on openings 18a, 18b to the regions above conductors 12b, 12c, respectively.

TMR cells 21a, 21b as magneto-resistive elements are formed on straps 20a, 20b, in the regions above conductors 12b, 12c. A fourth interlayer insulating film 22 is formed on straps 20a, 20b. TMR cells 21a, 21b are buried in fourth interlayer insulating film 22, although the upper surfaces of TMR cells 21a, 21b are exposed from the upper surface of fourth interlayer insulating film 22.

Formed on fourth interlayer insulating film 22 and TMR cells 21a, 21b is a fifth interlayer insulating film (not shown) that is of the same layer as a fifth interlayer insulating film 34 formed in the logic portion. An interconnection groove 23a is formed in this interlayer insulating film through the regions immediately above TMR cells 21a, 21b. A barrier metal film 24a and a conductor 25a are formed inside groove 23a. This interconnection formed of barrier metal film 24a and conductor 25a inside interconnection groove 23a constitutes the bit line of the MRAM cells.

A sixth interlayer insulating film 26 is formed on conductor 25a. Interconnection grooves 27a, 27b are formed in the upper surface of sixth interlayer insulating film 26. Barrier metal films 28a, 28b and conductors 29a, 29b are formed inside grooves 27a, 27b. A seventh interlayer insulating film 30 is formed on sixth interlayer insulating film 26. An interconnection groove 31a is formed in the upper surface of seventh interlayer insulating film 30. A barrier metal film 32a and a conductor 33a are formed within groove 31a.

Two memory cells are shown in the MRAM cell portion of the semiconductor device in FIG. 43. One MRAM cell consists of: the field effect transistor as the switching means formed of gate electrode 3a, the gate insulating film and source/drain regions 2a, 2b; strap 20a electrically connected to source/drain region 2a of the field effect transistor; TMR cell 21a arranged on an end of strap 20a, the interconnection as a digit line formed of conductor 12b and barrier metal film 11b in the region located beneath TMR cell 21a; and the interconnection as a bit line formed of barrier metal film 24a and conductor 25a electrically connected to the upper surface of TMR cell 21a. The digit line is used to change the magnetization direction of the TMR cell (to rewrite information in the TMR cell) by applying a magnetic field to TMR cell 21a. Gate electrode 3a of the field effect transistor constitutes a read word line.

Another MRAM cell formed in the MRAM cell portion shown in FIG. 43 has the same structure as the MRAM cell described above. Specifically, it consists of: the field effect transistor as the switching means formed of gate electrode 3b, the gate insulating film and source/drain regions 2c, 2d formed in the main surface of semiconductor substrate 1; strap 20b electrically connected to source/drain region 2d of the field effect transistor; TMR cell 21b arranged on an end of strap 20b, the interconnection as a bit line formed of barrier metal film 24a and conductor 25a electrically connected to the upper surface of TMR cell 21b; and the interconnection constituting a digit line formed of barrier metal film 11c and conductor 12c. The MRAM cells described above are arranged on semiconductor substrate 1 in a matrix.

The structure of the logic portion is now explained. In the logic portion, source/drain regions 2e, 2f of a field effect transistor constituting a logic circuit of the logic portion are formed in the main surface of semiconductor substrate 1, on opposite sides of a channel region. A gate electrode 3c is formed above the channel region, with a gate insulating film (not shown) interposed therebetween. Gate electrode 3c, the gate insulating film, source/drain regions 2e, 2f constitute the field effect transistor as an element constituting the logic circuit.

First interlayer insulating film 4 is formed on the field effect transistor to cover the main surface of semiconductor substrate 1. In first interlayer insulating film 4, contact holes 5e, 5f are formed in the regions immediately above source/drain regions 2e, 2f, respectively. Barrier metal films 6e, 6f and conductor plugs 7e, 7f are formed inside respective contact holes 5e, 5f.

Second interlayer insulating film 8 is formed on first interlayer insulating film 4. In second interlayer insulating film 8, a through hole 9c is formed in the region immediately above conductor plug 7e. An interconnection groove 10e is formed on the upper surface of second interlayer insulating film 8, in connection with through hole 9c. A barrier metal film 11e and a conductor 12e are formed inside interconnection groove 10e and through hole 9c. The interconnection made of barrier metal film 11e and conductor 12e is configured with the same layer as the interconnections made of barrier metal layers 11b, 11c and conductors 12b, 12c constituting the digit lines in the MRAM cell portion.

Third interlayer insulating film 13 is formed on second interlayer insulating film 8. Fourth interlayer insulating film 22 is formed on the upper surface of third interlayer insulating film 13. Fifth interlayer insulating film 34 is formed on the upper surface of fourth interlayer insulating film 22. An interconnection groove 23b is formed in the upper surface of fifth interlayer insulating film 34. A barrier metal film 24b and a conductor 25b are formed inside groove 23b.

The interconnection made of barrier metal film 24b and conductor 25b is configured with the same layer as the interconnection made of barrier metal film 24a and conductor 25a as the bit line in the MRAM cell portion.

Sixth interlayer insulating film 26 is formed on fifth interlayer insulating film 34. An interconnection groove 27c is formed in the upper surface of sixth interlayer insulating film 26. A barrier metal film 28c and a conductor 29c are formed inside groove 27c.

Seventh interlayer insulating film 30 is formed on sixth interlayer insulating film 26. An interconnection groove 31b is formed in the upper surface of seventh interlayer insulating film 30. A barrier metal film 32b and a conductor 33b are formed inside groove 31b.

In the case where the interconnections (digit lines of the MRAM cells) made of barrier metal films 11b, 11c and conductors 12b, 12c are formed with the same layer as the interconnection made of barrier metal film 11e and conductor 12e in the logic portion, and the interconnection (bit line of the MRAM cell) made of barrier metal film 24a and conductor 25a is formed with the same layer as the interconnection made of barrier metal film 24b and conductor 25b in the logic portion as shown in FIG. 43, a distance L between the digit lines and TMR cells 21a, 21b formed to connect to the bit line would become long. In this case, a magnetic field generated by a current passed through the digit lines and applied to TMR cells 21a, 21b would be insufficient in strength, since the thickness of interlayer insulating film 13 is determined from the standpoint of optimizing, e.g., parasitic capacitance of the interconnection structure in the logic portion. If interlayer insulating film 13 is made thin to cause a sufficiently strong magnetic field to be applied to TMR cells 21a, 21b, however, the parasitic capacitance and others of the interconnection structure in the logic portion would change, requiring revision in design of the entire interconnection structure of the logic portion (including recalculation of delay and others), thereby elongating development time of the semiconductor device. The manufacturing cost of the semiconductor device would also increase.

The inventors have completed the present invention through the studies to solve the above-described problems. Hereinafter, embodiments of the present invention will be described with reference to the drawings, in which the same or corresponding portions are denoted by the same reference characters and description thereof will not be repeated.

First Embodiment

The first embodiment of the semiconductor device according to the present invention is described with reference to FIG. 1.

Figure 1:
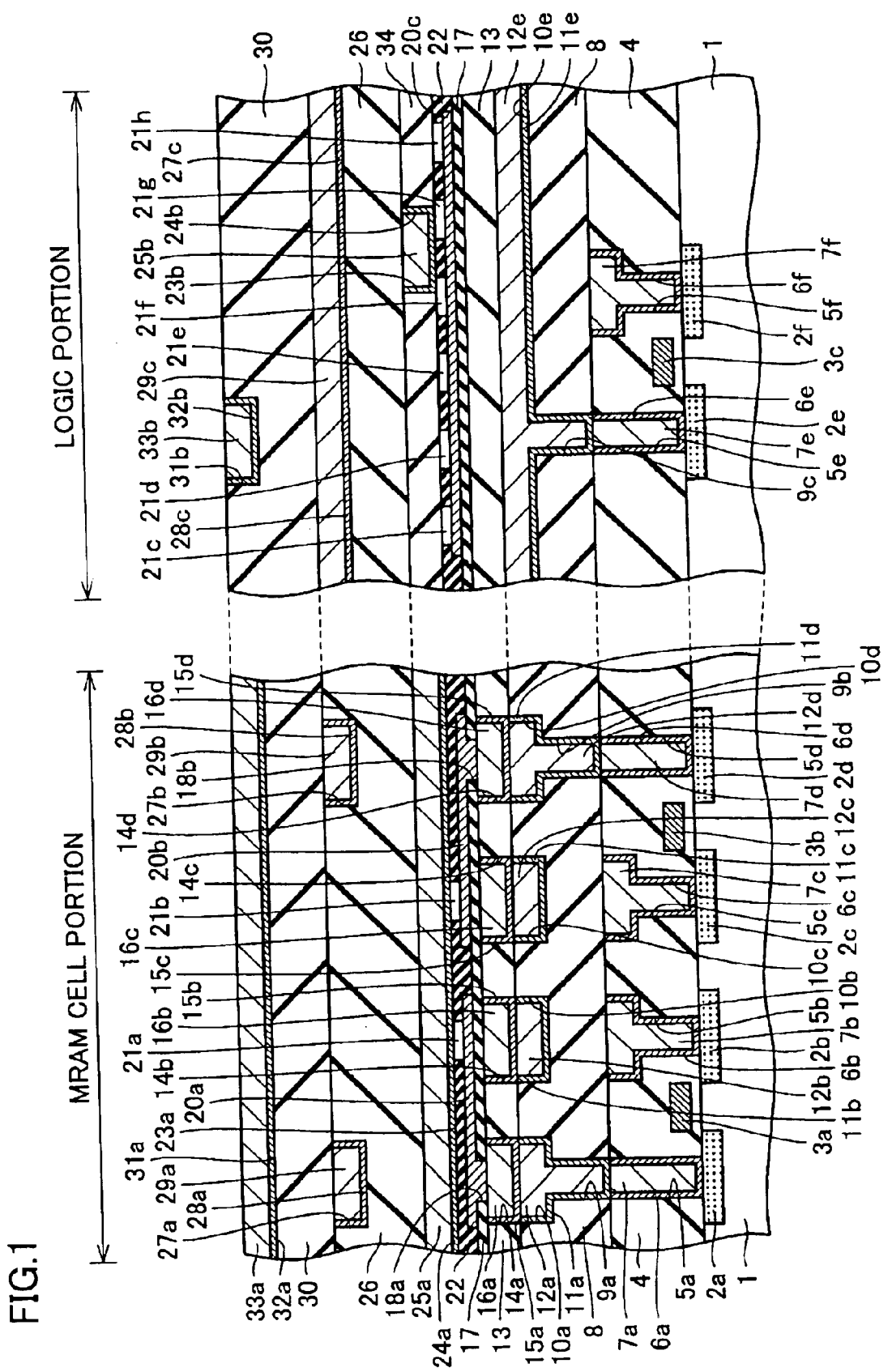
FIG. 1 is a schematic cross sectional view of a first embodiment of the semiconductor device according to the present invention.

The first embodiment of the semiconductor device according to the present invention shown in FIG. 1 includes an MRAM cell portion as the memory cell region, and a logic portion. In the MRAM cell portion, MRAM memory cells are formed employing TMR cells 21a, 21b as the magneto-resistive elements, as will be described later. In the logic portion, a field effect transistor constituting a logic circuit is formed for controlling the MRAM cells and for performing other controls and operations, as will be described later. Hereinafter, the structure of the semiconductor device is explained specifically.

In the MRAM cell portion of the semiconductor device in FIG. 1, source/drain regions 2a–2d of field effect transistors are formed in a main surface of a semiconductor substrate 1. Source/drain regions 2a, 2b are arranged on opposite sides of a channel region. A gate electrode 3a is formed above the channel region between source/drain regions 2a, 2b, with a gate insulating film interposed therebetween. Gate electrode 3a, the gate insulating film and source/drain regions 2a, 2b constitute the field effect transistor as switching means. Likewise, source/drain regions 2c, 2d are arranged on opposite sides of a channel region, above which a gate electrode 3b is formed with a gate insulating film interposed therebetween. Gate electrode 3b, the gate insulating film and source/drain regions 2c, 2d constitute another field effect transistor as the switching means.

A first interlayer insulating film 4 is formed on gate electrodes 3a, 3b of the field effect transistors. In first interlayer insulating film 4, contact holes 5a–5d are formed in the regions immediately above source/drain regions 2a–2d, respectively. The surfaces of source/drain regions 2a–2d are exposed at the bottoms of respective contact holes 5a–5d. In interlayer insulating film 4, interconnection grooves are formed in the upper portions of respective contact holes 5b, 5c, each extending in a direction approximately perpendicular to the plane constituting the drawing of FIG. 1.

Barrier metal films 6a–6d of titanium nitride (TiN) or the like are formed on the inner walls of contact holes 5a–5d, respectively. Conductor plugs 7a–7d are formed on barrier metal films 6a–6d, respectively, to fill in respective contact holes 5a–5d. Conductor plugs 7a–7d may be formed of copper (Cu) by plating, for example.

A second interlayer insulating film 8 is formed on first interlayer insulating film 4. In second interlayer insulating film 8, through holes 9a, 9b are formed in the regions immediately above respective contact holes 5a, 5d, and interconnection grooves 10a, 10b are formed in the upper portions of respective through holes 9a, 9b. Interconnection grooves 10b, 10c are formed in the upper surface of second interlayer insulating film 8, in the regions immediately above contact holes 5b, 5c formed in first interlayer insulating film 4. Grooves 10a–10d are each formed to extend in a direction approximately perpendicular to the plane of FIG. 1.

Barrier metal films 11a–11d are formed to cover the inner walls of through holes 9a, 9b and grooves 10a–10d. Conductors 12–12d are formed on barrier metal films 11a–11d to fill in through holes 9a, 9b and grooves 10a, 10d. Conductors 12a–12d may be formed of, e.g., copper (Cu).

A third interlayer insulating film 13 is formed on second interlayer insulating film 8. In third interlayer insulating film 13, interconnection grooves 14a–14d are formed in the regions immediately above interconnection grooves 10a–10d. Although grooves 14b, 14c are formed only beneath TMR cells 21a, 21c, such a groove may be formed in another region. The upper surfaces of conductors 12a–12d formed inside respective grooves 10a–10d are exposed at the bottoms of interconnection grooves 14a–14d. Barrier metal films 15a–15d are formed to cover the inner walls of grooves 14a–14d, respectively. Conductors 16a–16d are formed on barrier metal films 15a–15d to fill in respective grooves 14a–14d. Copper (Cu), for example, may be used to form conductors 16a–16d. The interconnections as the first interconnection layer made of barrier metal films 11b, 11c and conductors 12b, 12c formed in respective grooves 10b, 10c and the interconnections as the second interconnection layer made of barrier metal films 15b, 15c and conductors 16b, 16c formed in respective grooves 14b, 14c constitute the digit lines of the MRAM cells. The digit lines are used for rewriting of TMR cells 21 a, 21b.

Next, a fourth interlayer insulating film 17 is formed on third interlayer insulating film 13. In fourth interlayer insulating film 17, openings 18a, 18b are formed in the regions immediately above conductors 16a, 16d. Straps 20a, 20b of conductors are formed to fill in respective openings 18a, 18b and to extend on the upper surface of fourth interlayer insulating film 17. Straps 20a, 20b may be formed of titanium nitride (TiN), polysilicon or the like. Straps 20a, 20b are electrically connected to conductors 16a, 16d inside grooves 14a, 14d, respectively. Straps 20a, 20b each have its one end extending to a position immediately above the corresponding conductor 16b, 16c constituting the digit line.

TMR cells 21a, 21b as the magneto-resistive elements are formed on respective straps 20a, 20b, in the regions above conductors 16b, 16c. A fifth interlayer insulating film 22 is formed on straps 20a, 20b. Fifth interlayer insulating film 22 has its upper surface approximately on the same plane as the upper surfaces of TMR cells 21a, 21b. That is, TMR cells 21a, 21b buried in fifth interlayer insulating film 22 have their upper surfaces exposed from the upper surface of the film 22.

A sixth interlayer insulating film (not shown) is formed on fifth interlayer insulating film 22 and TMR cells 21a, 21b, which is formed with the same layer as interlayer insulating film 34 in the logic portion. In this interlayer insulating film, an interconnection groove 23a is formed through the regions immediately above TMR cells 21a, 21b. A barrier metal film 24a is formed on the inner wall of groove 23a, and a conductor 25a is formed on-barrier metal film 24a to fill in groove 23a. Conductor 25a may be formed, e.g., of copper (Cu). The interconnection made of barrier metal film 24a and conductor 25a formed inside interconnection groove 23a constitutes the bit line of the MRAM cells.

A seventh interlayer insulating film 26 is formed on conductor 25a. Interconnection grooves 27a, 27b are formed in the upper surface of seventh interlayer insulating film 26. Barrier metal films 28a, 28b are formed to cover the inner walls of respective interconnection grooves 27a, 27b, and conductors 29a, 29b are formed on barrier metal films 28a, 28b to fill in grooves 27a, 27b, respectively. Copper (Cu), for example, may be used to form conductors 29a, 29b.

An eighth interlayer insulating film 30 is formed on seventh interlayer insulating film 26. An interconnection groove 31a is formed in the upper surface of eighth interlayer insulating film 30. A barrier metal film 32a is formed to cover the inner wall of interconnection groove 31a, and a conductor 33a is formed on barrier metal film 32a to fill in groove 31a. Conductor 33a may be copper (Cu), for example.

Two memory cells are indicated in the MRAM cell portion of the semiconductor device in FIG. 1. Specifically, one MRAM memory cell consists of: the field effect transistor as switching means made of gate electrode 3a as the word line, the gate insulating film and source/drain regions 2a, 2b; strap 20a electrically connected to source/drain region 2a of the field effect transistor; TMR cell 21a arranged on an end of strap 20a; the stacked interconnection as the digit line made of conductors 12b, 16b and barrier metal films 11b, 15b formed in the region immediately beneath TMR cell 21a; and the interconnection as the bit line made of barrier metal film 24a and conductor 25a electrically connected to the upper surface of TMR cell 21a.

The digit line described above is arranged beneath TMR cell 21a with strap 20a and interlayer insulating film 22 interposed therebetween. The distance between TMR cell 21a and the stacked interconnection as the digit line is sufficiently small. The digit line is used for rewriting of TMR cell 21a, as described above. Gate electrode 3a of the field effect transistor functions as a read word line.

Another MRAM memory cell (also referred to as the "MRAM cell") formed in the MRAM cell portion in FIG. 1 has the same structure as the MRAM memory cell described above. That is, it consists of: the field effect transistor as switching means formed in the main surface of semiconductor substrate 1 with gate electrode 3b, source/drain regions 2c, 2d and the gate insulating film; strap 20b electrically connected to source/drain region 2d of the field effect transistor; TMR cell 21b arranged on an end of strap 20b; the interconnection as the bit line made of barrier metal film 24a and conductor 25a connected to the upper surface of TMR cell 21b; and the stacked interconnection as the digit line made of barrier metal films 11c, 15c and conductors 12c, 16c. The MRAM cells are arranged on semiconductor substrate 1 in a matrix.

When writing to or reading from MRAM cells, each MRAM cell is selected by its field effect transistor individually. Data is rewritten to or read out of the MRAM cell by causing a current to pass through the word line, the bit line and the digit line described above, as appropriate.

The structure of the logic portion is now explained. In the logic portion, a field effect transistor constituting the logic circuit of the logic portion is formed in the main surface of semiconductor substrate 1. Source/drain regions 2e, 2f of the field effect transistor are formed in the main surface of semiconductor substrate 1 on opposite sides of a channel region. A gate electrode 3c is formed above the channel region, with a gate insulating film interposed therebetween. Gate electrode 3c, the gate insulating film and source/drain regions 2e, 2f constitute the field effect transistor as the element constituting the logic circuit.

First interlayer insulating film 4 is formed on the field effect transistor to cover the main surface of semiconductor substrate 1. In first interlayer insulating film 4, contact holes 5e, 5f are formed in the regions immediately above source/drain regions 2e, 2f, respectively. An interconnection groove is formed in the upper portion of contact hole 5f to extend in a direction approximately perpendicular to the plane of FIG. 1. Barrier metal films 6e, 6f are formed on the inner walls of contact holes 5e, 5f, and conductor plugs 7e, 7f are formed on barrier metal films 6e, 6f to fill in respective contact holes 5e, 5f.

Second interlayer insulating film 8 is formed on first interlayer insulating film 4. In second interlayer insulating film 8, a through hole 9c is formed in the region immediately above conductor plug 7e. An interconnection groove 10e is formed in the upper surface of second interlayer insulating film 8 in connection with through hole 9c. A barrier metal film 11e is formed to cover the inner walls of groove 10e and through hole 9c, and a conductor 12e is formed on barrier metal film 11e to fill in through hole 9c and groove 10e. The interconnection made of barrier metal film 11e and conductor 12e is one formed with the same layer as the interconnections made of barrier metal films 11b, 11c and conductors 12b, 12c as the first interconnection layer constituting the digit lines in the MRAM cell portion.

Third interlayer insulating film 13 is formed on second interlayer insulating film 8. Fourth interlayer insulating film 17 is formed on the upper surface of third interlayer insulating film 13. On the upper surface of fourth interlayer insulating film 17, a conductor film 20c is formed with the same layer as straps 20a, 20b in the MRAM cell portion. On conductor film 20c, TMR dummy cells 21c–21h are formed with the same layer as TMR cells 21a, 21b. Fifth interlayer insulating film 22 is formed on conductor film 20c to fill in gaps between TMR dummy cells 21c–21h. Sixth interlayer insulating film 34 is formed on fifth interlayer insulating film 22.

An interconnection groove 23b is formed in the upper surface of sixth interlayer insulating film 34. A barrier metal film 24b is formed on the inner wall of groove 23b, and a conductor 25b is formed on barrier metal film 24b to fill in groove 23b. The interconnection made of barrier metal film 24b and conductor 25b is one formed with the same layer as the interconnection made of barrier metal film 24a and conductor 25a as the bit line in the MRAM cell portion.

Seventh interlayer insulating film 26 is formed on sixth interlayer insulating film 34. An interconnection groove 27c is formed in the upper surface of seventh interlayer insulating film 26. A barrier metal film 28c is formed on the inner wall of groove 27c, and a conductor 29c is formed on barrier metal film 28c to fill in groove 27c. The interconnection made of barrier metal film 28c and conductor 29c is formed with the same layer as the interconnections made of barrier metal films 28a, 28b and conductors 29a, 29b in the MRAM cell portion.

Eighth interlayer insulating film 30 is formed on seventh interlayer insulating film 26. An interconnection groove 31b is formed in the upper surface of eighth interlayer insulating film 30. A barrier metal film 32b is formed on the inner wall of groove 31b, and a conductor 33b is formed on barrier metal film 32b to fill in groove 31b.

To briefly describe the characteristic configuration of the semiconductor device described above as an example of the semiconductor memory device according to the present invention, the semiconductor device shown in FIG. 1 operating as a magnetic memory device includes: TMR cells 21a, 21b as the magneto-resistive elements constituting (or included in) the memory elements; and the stacked interconnection as the interconnection (having the first interconnections made of barrier metal films 11b, 11c and conductors 12b, 12c and the second interconnections made of barrier metal films 15b, 15c and conductors 16b, 16c stacked on the first interconnections). The stacked interconnection is arranged to face TMR cells 21a, 21b, and serves to apply a magnetic field to TMR cells 21a, 21b as the magneto-resistive elements. The stacked interconnection is thicker in the portions facing TMR cells 21a, 21b than in the remaining portions. That is, while the second interconnection is provided on the first interconnection in the portions immediately beneath TMR cells 21a, 21b, it is unprovided in the portions where TMR cells do not exist.

Using the stacked interconnection having the second interconnection stacked on the first interconnection as the digit line as described above allows thickening of the digit line (i.e., the cross section of the digit line increases). This leads to reduction of an interconnection current density of the current passed through the digit line. As a result, reliability of writing operation and others in the MRAM cells, and hence, reliability of the semiconductor device can be improved.

As the digit line is thickened with the stacked structure, the distances between TMR cells 21a, 21b and the digit lines become small. This intensifies the magnetic field generated by the digit lines and applied to TMR cells 21a, 21b. Accordingly, polarities of TMR cells 21a, 21b can readily be changed by the magnetic field. As a result, it is possible to reduce the current passed through the digit lines and to downsize digit line driver elements and others.

In the structure shown in FIG. 1, it is unnecessary to change cross sectional structures in the logic portion, such as thicknesses of interlayer insulating films 4, 8, 13, 22, 34 and others, to mount the circuit in the logic portion and the MRAM cells on a single chip. Conditions in the circuit of the logic portion, such as parasitic capacitance between interconnections and others, are basically unchanged when the MRAM cells are being mounted together. Thus, it is unnecessary to recalculate delays in the logic portion because of such combination of the MRAM cells and the logic circuit, and accordingly, the development time of the semiconductor device can be reduced.

Further, the semiconductor device shown in FIG. 1 as an example of the magnetic memory device of the present invention is provided with TMR dummy cells 21c–21h as dummy elements, as seen from FIG. 1. TMR dummy cells 21c–21h are formed with the same layer as TMR cells 21a, 21b as the magneto-resistive elements.

Provision of such TMR dummy cells 21c–21h as the dummy elements is advantageous in that, when the insulating film (interlayer insulating film 34) on TMR cells 21a, 21b or the like is being planarized by CMP or the like, the polishing speed can be made approximately the same in the region (memory cell region) where TMR cells 21a, 21b are arranged and in the region (logic region other than the memory cell region) where the dummy elements (TMR dummy cells 21c–21h) are arranged. This prevents a step from being created between the MRAM cell portion and the logic portion.

Still further, as shown in FIG. 1, in the semiconductor device, TMR cells 21a, 21b as the magneto-resistive elements and the interconnection (the stacked interconnection with the second interconnections stacked on the first interconnections) are formed in the memory cell region (MRAM cell portion) on semiconductor substrate 1 as the substrate. TMR cells 21a, 21b are arranged above the stacked interconnection to overlie the same. The stacked interconnection includes the first interconnection layer (the first interconnections made of barrier metal films 11b, 11c and conductors 12b, 12c) and the second interconnection layer (the second interconnections made of barrier metal films 15b, 15c and conductors 16b, 16c), as described above. The second interconnections are stacked on the first interconnections in the regions located immediately beneath TMR cells 21a, 21b. The semiconductor device further includes the damascene interconnection as an upper interconnection (the interconnection made of barrier metal film 24a and conductor 25a), the damascene interconnection as a logic interconnection (the interconnection made of barrier metal film 11e and conductor 12e), and the damascene interconnection as an upper logic interconnection (the interconnection made of barrier metal film 24b and conductor 25b). The upper interconnection is formed to contact the upper surfaces of TMR cells 21a, 21b. The logic interconnection is formed in the logic portion being the region other than the memory cell region, with the same layer as the first interconnections in the MRAM cell portion. The upper logic interconnection is formed in the logic portion, with the same layer as the upper interconnection in the MRAM cell portion.

In the present embodiment, the interconnection layers constituting the memory cells are formed utilizing the same layers as the logic interconnection and the upper logic interconnection in the logic portion, and the second interconnections (made of barrier metal films 15b, 15c and conductors 16b, 16c) are provided to thicken the stacked interconnections as the digit lines. As a result, it is unnecessary to change the distance (thicknesses of interlayer insulating films 13, 22) between the logic interconnection and the upper logic interconnection in the logic portion to conform to the MRAM cells, and thus, the MRAM cells can be formed while maintaining the conditions, such as parasitic capacitance and others, related to the interconnection structure in the logic portion. In the MRAM cell portion as the memory cell region, the stacked interconnections thus thickened by provision of the second interconnections ensure sufficiently small distances between the stacked interconnections as the digit lines and corresponding TMR cell 21a, 21b.

A manufacturing method of the semiconductor device shown in FIG. 1 is now described with reference to FIGS. 2–11.

Firstly, the field effect transistors as switching means of MRAM cells and the field effect transistor constituting a circuit in the logic portion are formed in the main surface of semiconductor substrate 1 with conventional processes of deposition, photolithography, doping and others. Specifically, referring to FIG. 2, an insulating film to be a gate insulating film is formed on the main surface of semiconductor substrate 1. A conductor film to be gate electrodes 3a–3c is formed on the insulating film. A resist film having a pattern is formed on the conductor film. Using the resist film as a mask, the conductor film and the insulating film are partially removed by etching. The resist film is then removed. Gate electrodes 3a–3c and the gate insulating film are thus formed.

Using gate electrodes 3a–3c as masks, impurity of a conductive type is introduced into the main surface of semiconductor substrate 1 to form source/drain regions 2a–2e. Accordingly, the field effect transistors serving as the switching elements and the field effect transistor constituting the logic circuit in the logic portion are obtained.

Next, first interlayer insulating film 4 is formed to cover the entire surface of semiconductor substrate 1. A resist film having a pattern is formed on first interlayer insulating film 4 by photolithography. Using this resist film as a mask, first interlayer insulating film 4 is partially removed by etching, and the resist film is removed. As a result, contact holes 5a–5f are formed in first interlayer insulating film 4.

A barrier metal film is formed on the inner walls of contact holes 5a–5f and on the upper surface of first interlayer insulating film 4. A conductor film is formed on the barrier metal film to fill in contact holes 5a–5f and to cover the upper surface of first interlayer insulating film 4. Thereafter, CMP (Chemical Mechanical Polishing) is used to remove the conductor film and the barrier metal film on the upper surface of first interlayer insulating film 4. Thus, barrier metal films 6a–6f and conductor plugs 7a–7f are formed in respective contact holes 5a–5f.

Figure 2:
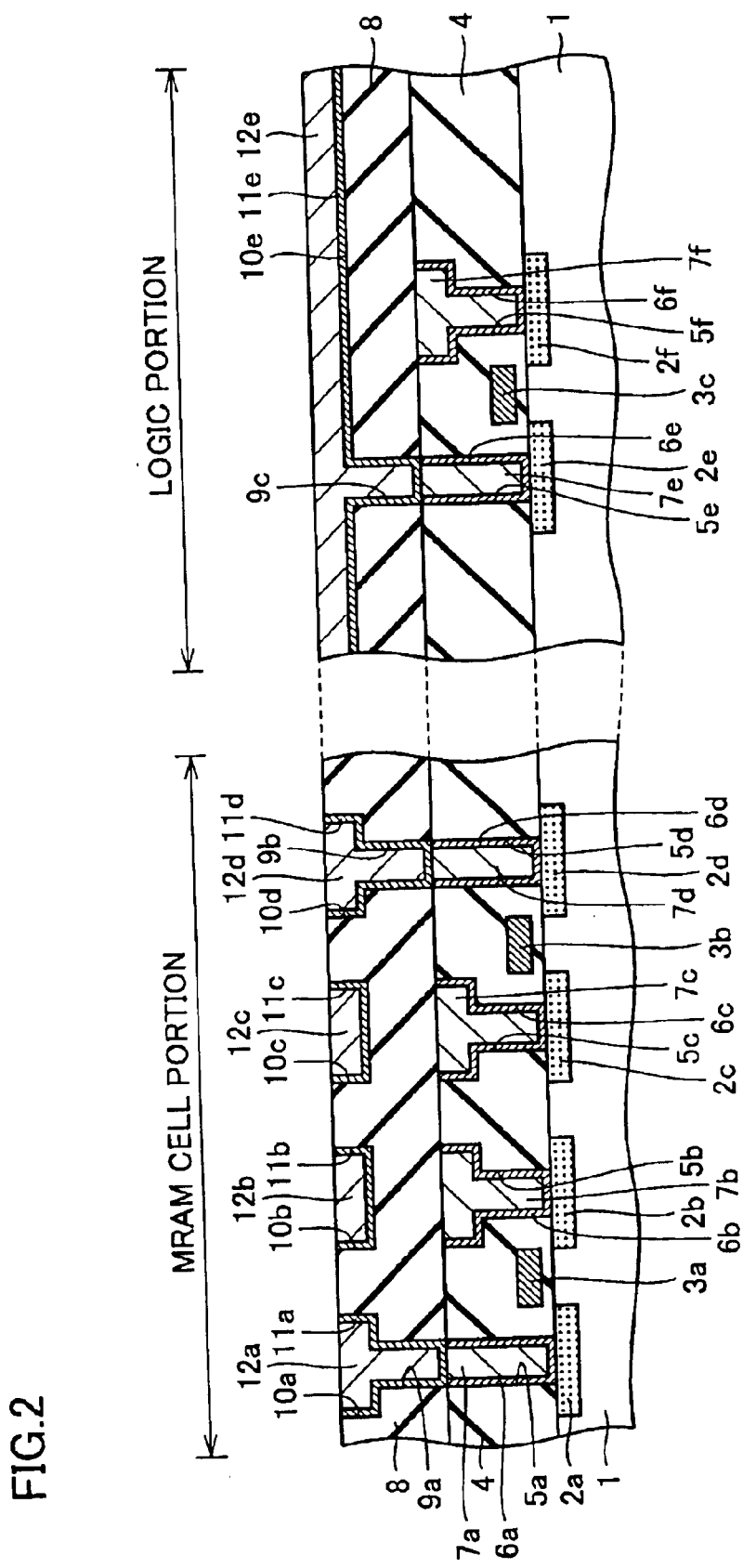
FIGS. 2–11 are schematic cross sectional views illustrating first through tenth steps of the manufacturing method of the semiconductor device shown in FIG. 1.

Next, second interlayer insulating film 8 is formed on first interlayer insulating film 4. A resist film having a pattern is formed on second interlayer insulating film 8 by photolithography. Using the resist film as a mask, second interlayer insulating film 8 is partially removed by etching to form through holes 9a–9c. In addition, using another resist mask having a pattern corresponding to interconnection grooves 10a–10e as a mask, second interlayer insulating film 8 is partially removed by etching to form interconnection grooves 10a–10e. A barrier metal film is formed on the inner walls of through holes 9a–9c and grooves 10a–10e and on the upper surface of second interlayer insulating film 8. A conductor is formed on the barrier metal film to fill in through holes 9a–9c and grooves 10a–10e and to cover the upper surface of second interlayer insulating film 8. Thereafter, the conductor film and the barrier metal film located on the upper surface of second interlayer insulating film 8 are removed by CMP. As a result, barrier metal films 11a–11e and conductors 12a–12e filling through holes 9a–9c and grooves 10a–10e are formed. The structure shown in FIG. 2 is obtained accordingly.

Figure 3:
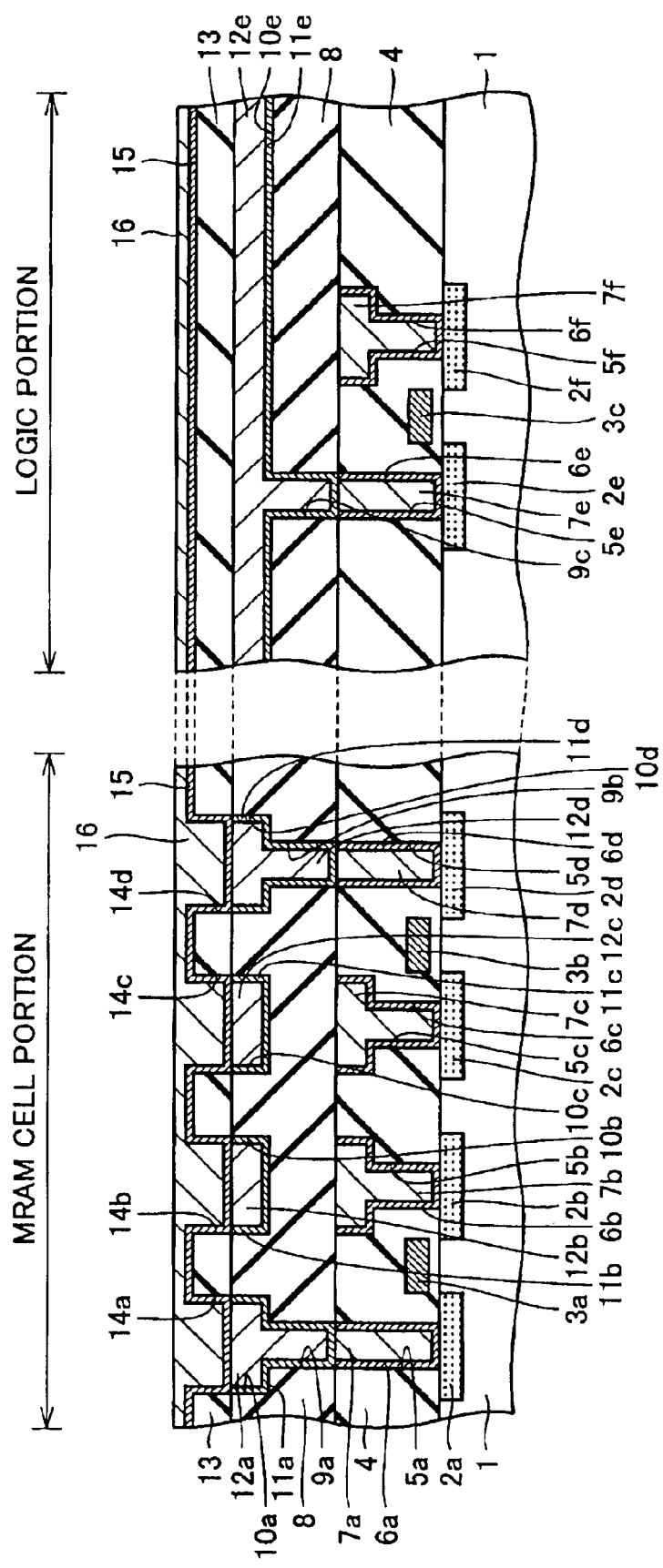

Next, referring to FIG. 3, third interlayer insulating film 13 is formed on second interlayer insulating film 8. A resist film (not shown) having a pattern is formed on third interlayer insulating film 13 by photolithography. Using this resist film as a mask, third interlayer insulating film 13 is partially removed by etching to form interconnection grooves 14a–14d, and the resist mask is removed. A barrier metal film 15 is formed on the inner walls of grooves 14a–14d and on the upper surface of third interlayer insulating film 13. A conductor 16 is formed on barrier metal film 15 to fill in grooves 14a–14d and to cover the upper surface of third interlayer insulating film 13.

Barrier metal film 15 and conductor 16 located on the upper surface of third interlayer insulating film 13 are removed by CMP. As a result, as shown in FIG. 4, interconnections made of barrier metal films 15a–15d and conductors 16a–16d are formed in respective grooves 14a–14d.

Figure 4:
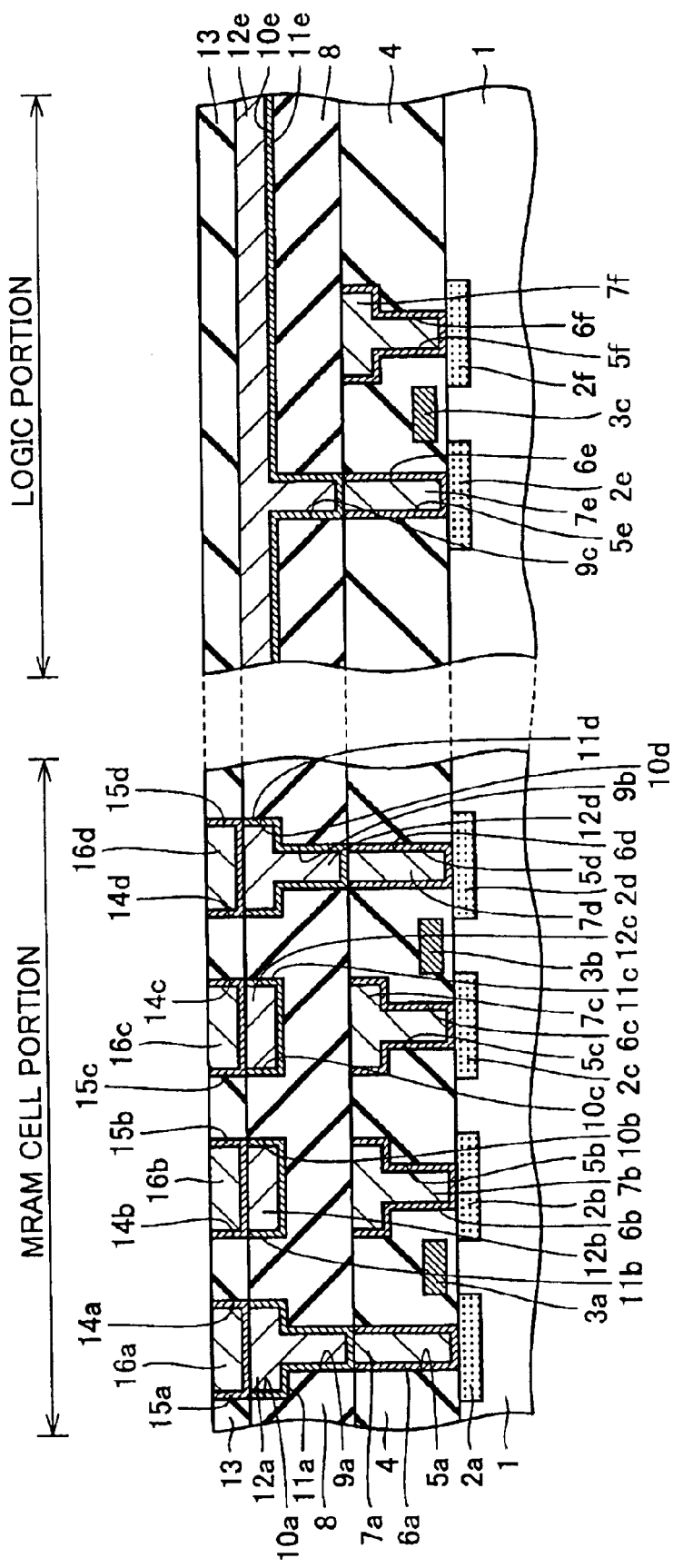

In the present embodiment, an interconnection layer may be formed in the logic portion with the same layer as barrier metal films 15a–15d and conductors 16a–16d shown in FIG. 4. In this case, it is preferable to form such an interconnection layer in a portion where reduction of interconnection resistance is particularly desired. For example, to reduce the interconnection resistance of the interconnection made of barrier metal film 11e and conductor 12e in FIG. 4, the interconnection layer may be formed on the conductor 12e in direct contact therewith. This enables reduction of the interconnection resistance of the interconnection in the logic portion.

Figure 5:
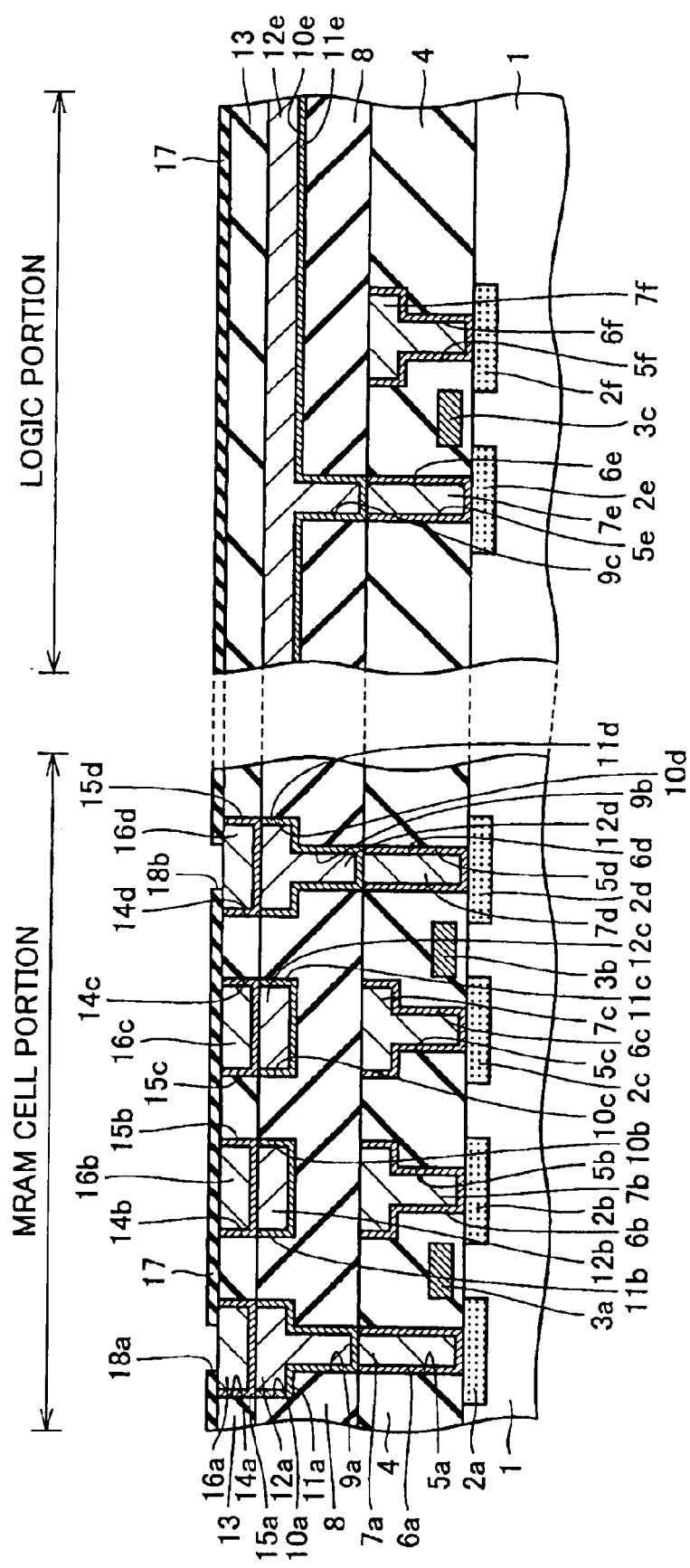

Next, referring to FIG. 5, fourth interlayer insulating film 17 is formed on third interlayer insulating film 13. A resist film having a pattern (not shown) is formed on fourth interlayer insulating film 17. Using this resist film as a mask, fourth interlayer insulating film 17 is partially removed by etching, and the resist film is removed. As a result, openings 18a, 18b are formed in fourth interlayer insulating film 17 in the regions immediately above conductors 16a, 16d. The structure shown in FIG. 5 is thus obtained. Fourth interlayer insulating film 17 is made sufficiently thinner than first through third interlayer insulating films 4, 8 and 13 to make the distance between the digit lines and TMR cells 21a, 21b (see FIG. 1) sufficiently small. The distance between the digit lines and TMR cells 21a, 21b can be changed by changing the thickness of fourth interlayer insulating film 17 as appropriate.

Figure 6:
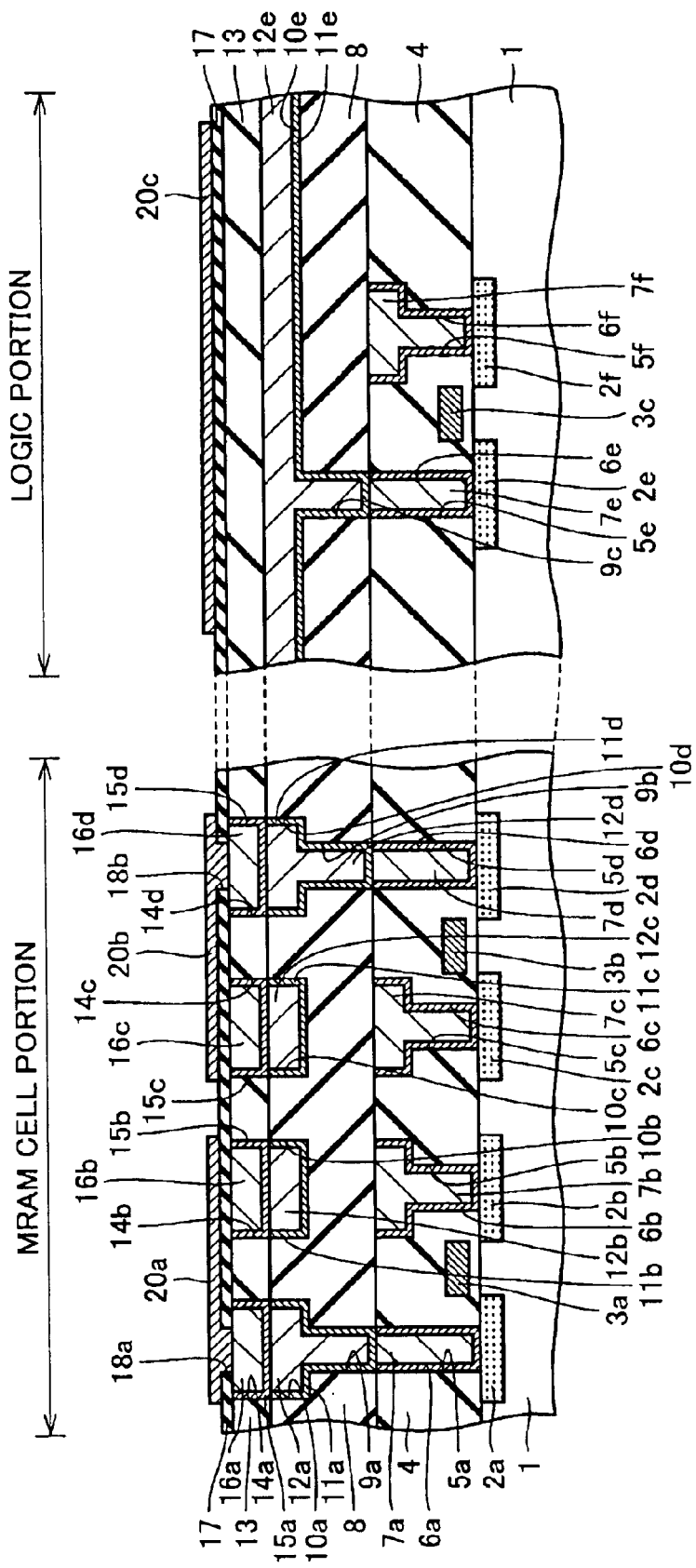

Next, referring to FIG. 6, a conductor film to be straps 20a, 20b and conductor film 20c is formed on fourth interlayer insulating film 17. A resist film (not shown) having a pattern is formed on the conductor film. Using this resist film as a mask, the conductor film is partially removed by etching, and the resist film is removed. As a result, straps 20a, 20b and conductor film 20c are formed as shown in FIG. 6. Openings 18a, 18b can be filled when forming the conductor film, since fourth interlayer insulating film 17 is sufficiently thin.

Figure 7:
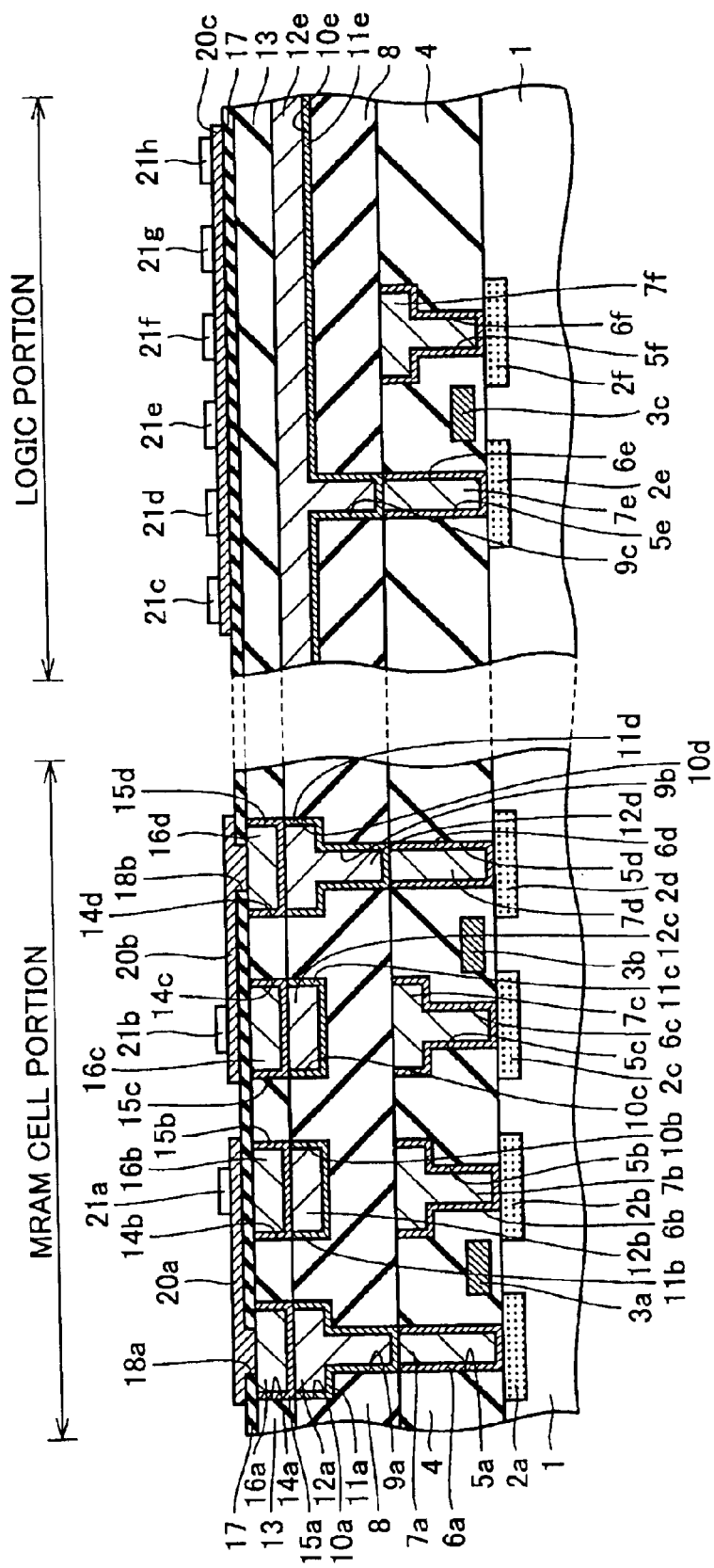

Next, referring to FIG. 7, a stacked film to be TMR cells is formed on straps 20a, 20b and conductor film 20c. A resist film (not shown) having a pattern is formed on the stacked film. Using the resist film as a mask, the stacked film is partially removed, and the resist film is then removed. As a result, TMR cells 21a, 21b and TMR dummy cells 21c–21h are formed as shown in FIG. 7. TMR cells 21a, 21b and TMR dummy cells 21c–21h each have an MTJ (Magnetic Tunneling Junction) made of two ferromagnetic layers and a thin insulating layer sandwiched therebetween, and an antiferromagnetic layer in contact with one of the ferromagnetic layers.

Figure 8:
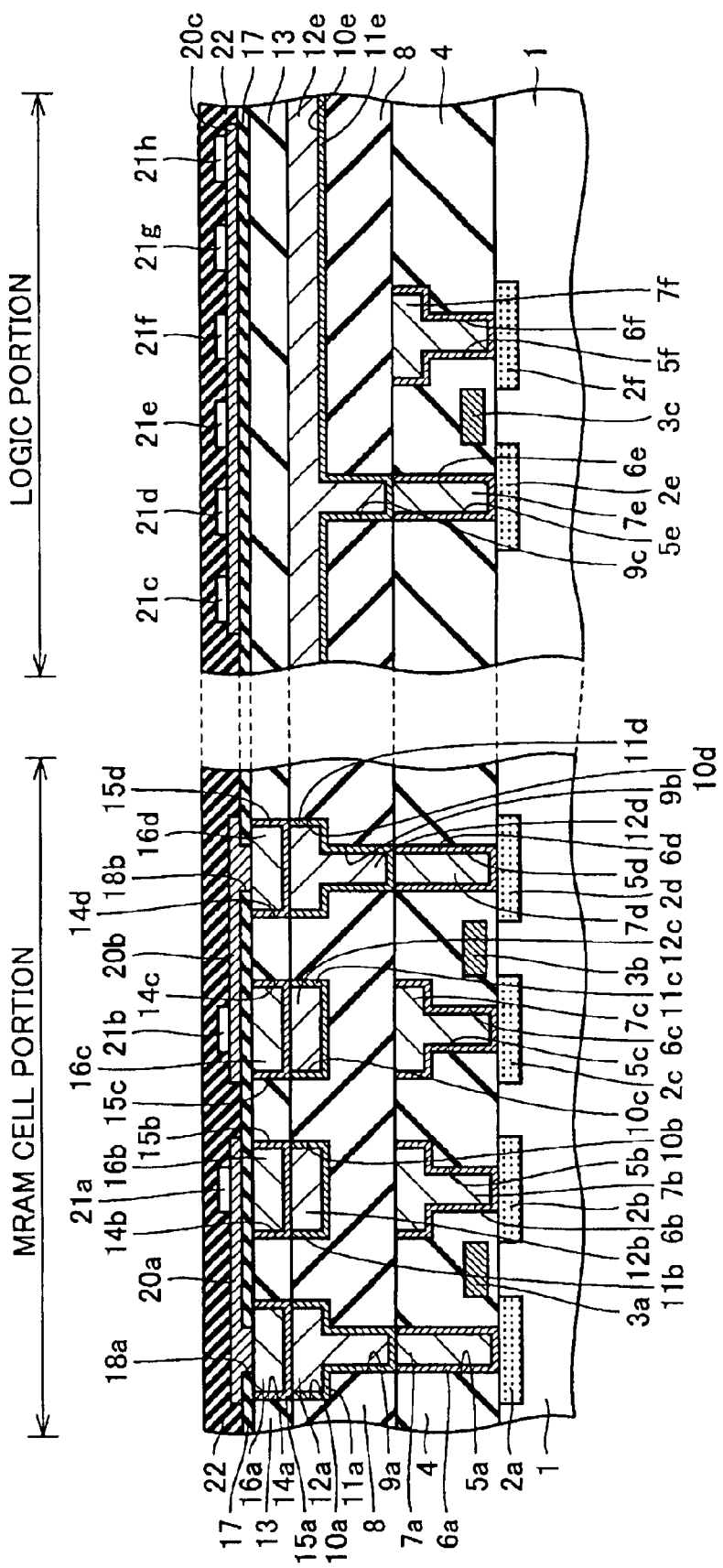

Next, fifth interlayer insulating film 22 is formed on TMR cells 21a, 21b and TMR dummy cells 21c–21h. The structure shown in FIG. 8 is thus obtained.

Figure 9:
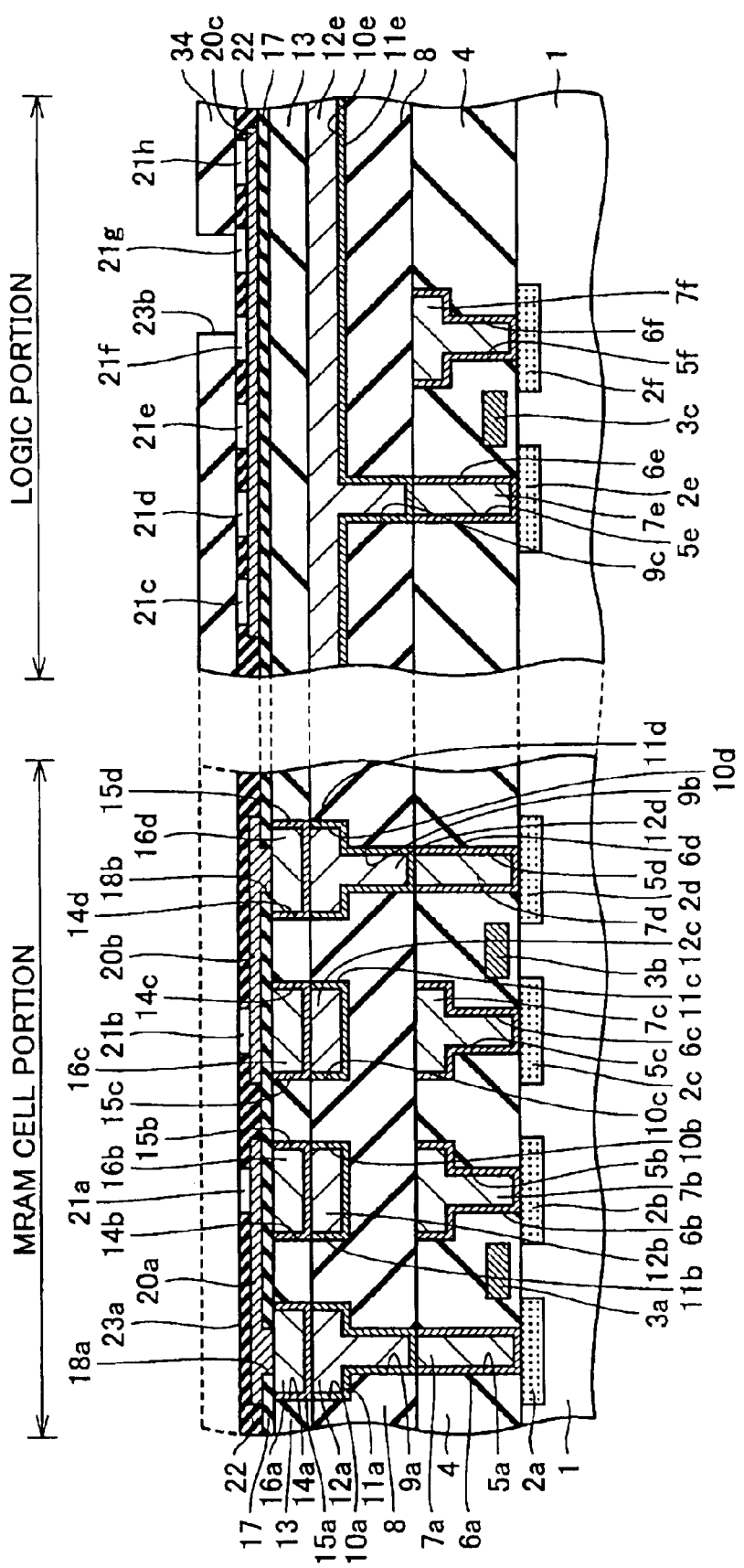

Thereafter, referring to FIG. 9, fifth interlayer insulating film 22 is removed to expose the upper surfaces of TMR cells 21a, 21b and TMR dummy cells 21c–21h. Sixth interlayer insulating film 34 is then formed on fifth interlayer insulating film 22. A resist film (not shown) having a pattern is formed on sixth interlayer insulating film 34. Using this resist film as a mask, sixth interlayer insulating film 34 is partially removed by etching. As a result, interconnection grooves 23a, 23b are formed in sixth interlayer insulating film 34. The resist film is then removed. The structure shown in FIG. 9 is thus obtained. TMR dummy cells 21c–21h formed in the logic portion serve as etching stoppers during etching for formation of interconnection groove 23b, thereby improving precision of the etching.

Figure 10:
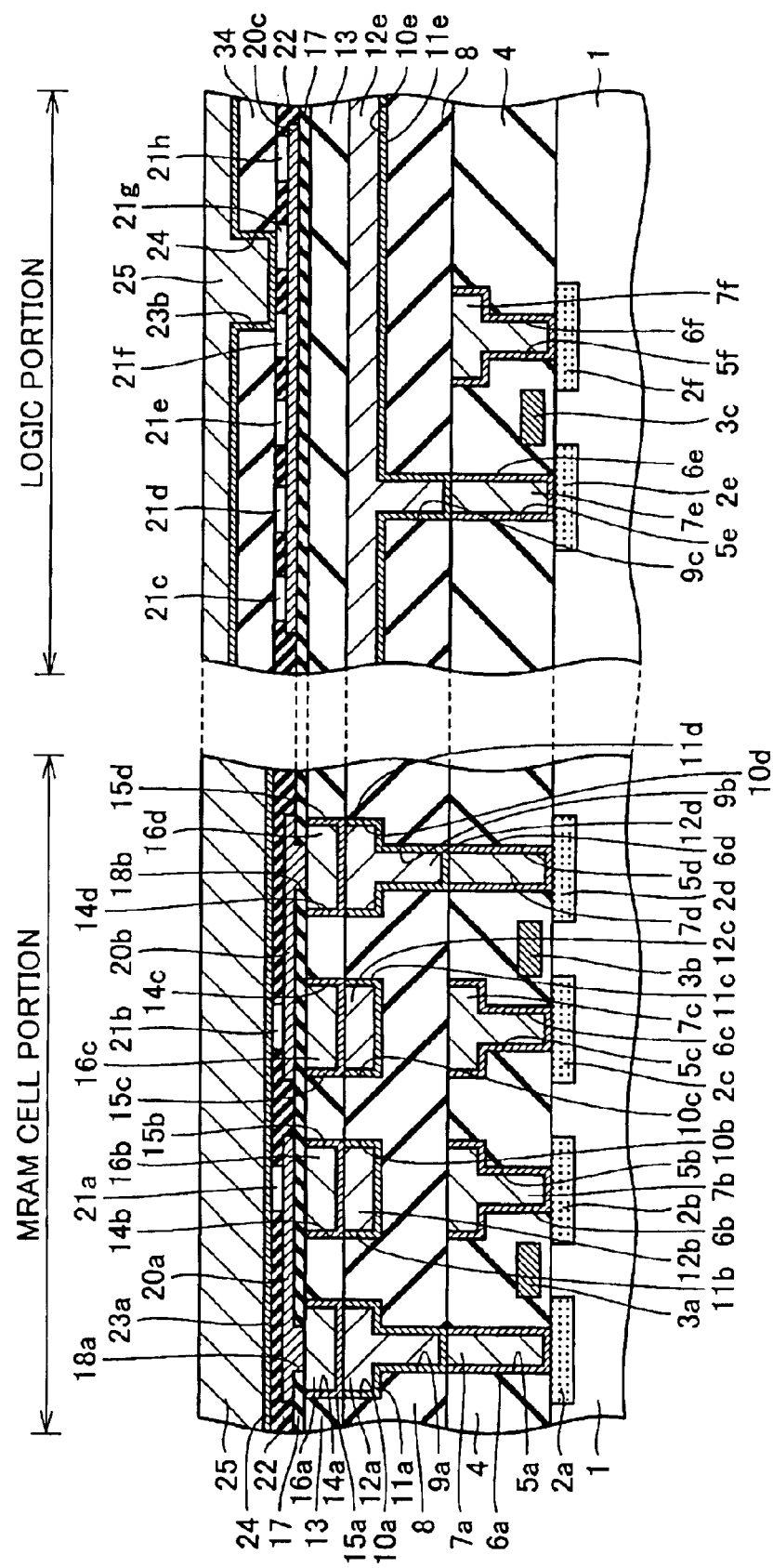

Next, referring to FIG. 10, barrier metal film 24 is formed on the inner walls of grooves 23a, 23b and on the upper surface of sixth interlayer insulating film 34. Conductor 25 is formed on barrier metal film 24 to fill in grooves 23a, 23b and to cover the upper surface of sixth interlayer insulating film 34. The structure shown in FIG. 10 is thus obtained.

Figure 11:
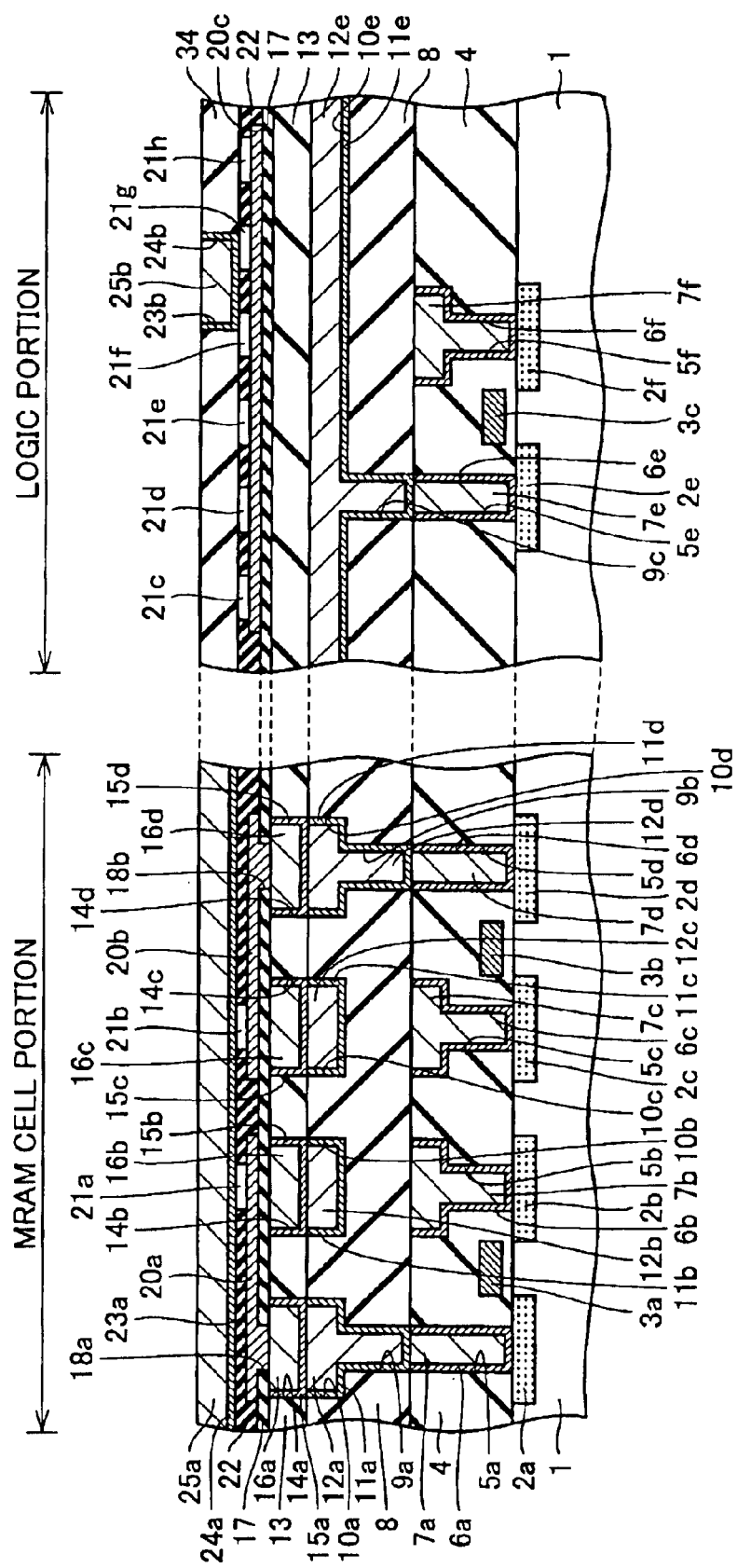

Barrier metal film 24 and conductor 25 located on the upper surface of sixth interlayer insulating film 34 are removed by CMP. As a result, interconnections made of barrier metal films 24a, 24b and conductors 25a, 25b filling grooves 23a, 23b are formed as shown in FIG. 11. Conductors 25a, 25b may be formed of copper (Cu) by plating, for example.

The structure overlying sixth interlayer insulating film 34 can be formed using conventional processes of deposition, photolithography and others. Specifically, referring to FIG. 1, seventh interlayer insulating film 26 is formed on the upper surface of sixth interlayer insulating film 34. A resist film (not shown) having a pattern is formed on seventh interlayer insulating film 26. Using this resist film as a mask, seventh interlayer insulating film 26 is partially removed to form interconnection grooves 27a–27c. The resist film is then removed. A barrier metal film is formed on the inner surfaces of grooves 27a–27c and on the upper surface of seventh interlayer insulating film 26. A conductor is formed on the barrier metal film to fill in grooves 27a–27c and to cover the upper surface of seventh interlayer insulating film 26. The barrier metal film and the conductor located on the upper surface of seventh interlayer insulating film 26 are removed by CMP. As a result, interconnections made of barrier metal films 28a–28c and conductors 29a–29c arranged in respective grooves 27a–27c are obtained.

Next, eighth interlayer insulating film 30 is formed on seventh interlayer insulating film 26. A resist film (not shown) having a pattern is formed on the upper surface of eighth interlayer insulating film 30. Using the resist film as a mask, eighth interlayer insulating film 30 is partially removed to form interconnection grooves 31a, 31b, and the resist film is then removed. A barrier metal film is formed on the inner surfaces of grooves 31a, 31b and on the upper surface of eighth interlayer insulating film 30. A conductor is formed on the barrier metal film to fill in grooves 31a, 31b and to cover the upper surface of eighth interlayer insulating film 30. The conductor and the barrier metal film located on the upper surface of eighth interlayer insulating film 30 are then removed by CMP. As a result, interconnections are formed with barrier metal films 32a, 32b and conductors 33a, 33b arranged in respective grooves 31a, 31b. The structure shown in FIG. 1 is obtained accordingly.

Second Embodiment

The second embodiment of the semiconductor device according to the present invention is described with reference to FIG. 12.

Figure 12:
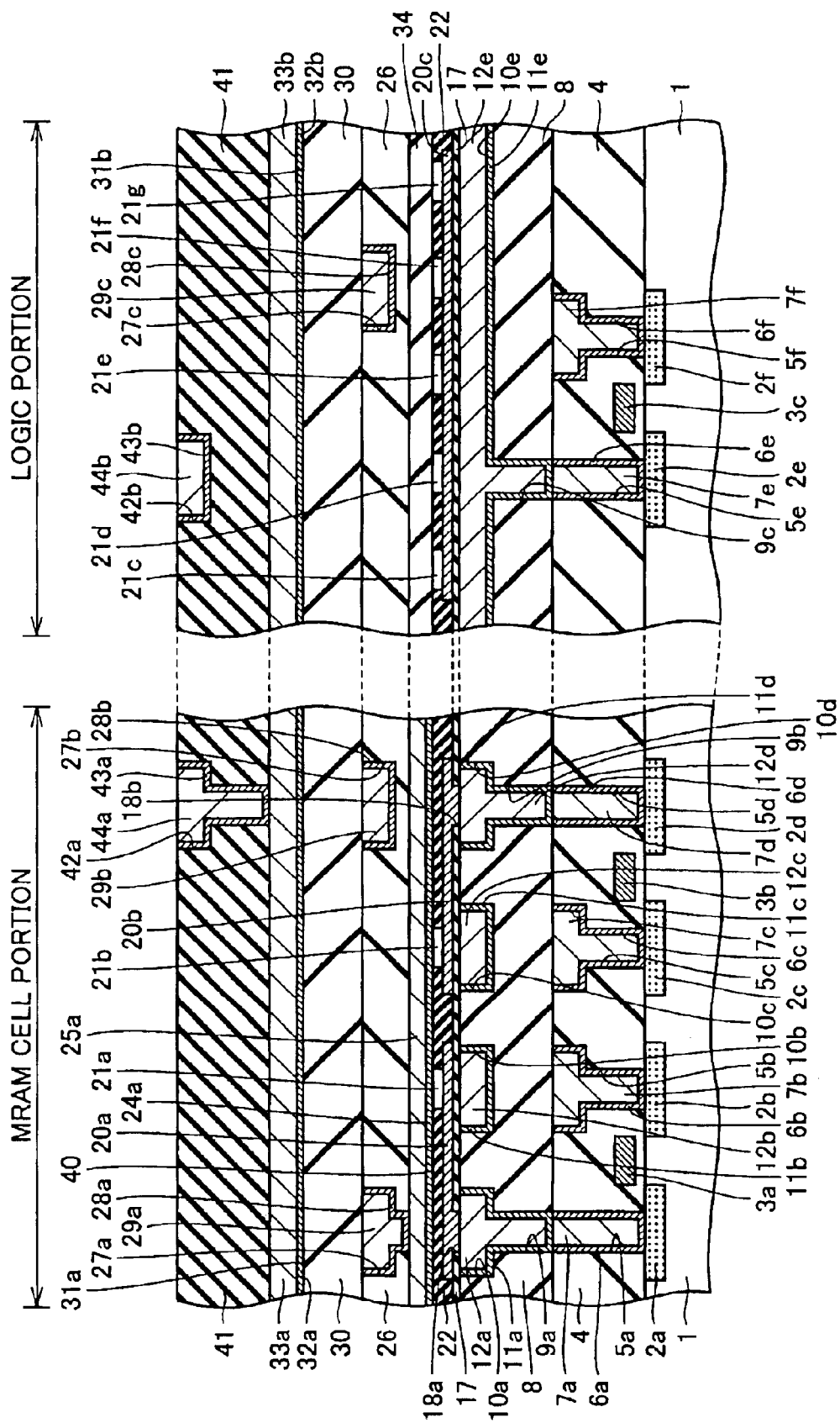
FIG. 12 is a schematic cross sectional view of a second embodiment of the semiconductor device according to the present invention.

As shown in FIG. 12, the semiconductor device is provided with an MRAM cell portion and a logic portion. The structure of the MRAM cell portion is identical to that of the semiconductor device shown in FIG. 1 from the semiconductor substrate 1 to the layer having second interlayer insulating film 8 formed therein. In the MRAM cell portion of the semiconductor device shown in FIG. 12, however, straps 20a, 20b, TMR cells 21a, 21b, constituting the MRAM cells, and the interconnection as the bit line made of barrier metal film 24a and conductor 25a are arranged between the layer in which the interconnections made of barrier metal films 11a–11e and conductors 12a–12e are formed and the layer in which the interconnections made of barrier metal films 28a–28c and conductors 29a–29c are formed.

Specifically, a thin third interlayer insulating film 17 is formed on the upper surface of second interlayer insulating film 8. In third interlayer insulating film 17, openings 18a, 18b are formed in the regions immediately above conductors 12a, 12d. Straps 20a, 20b of conductors are formed on interlayer insulating film 17 to each extend from the region on corresponding opening 18a, 18b to the region immediately above the corresponding interconnection as the digit line made of barrier metal film 11b, 11c and conductor 12b, 12c. TMR cells 21a, 21b as the memory elements are arranged on respective straps 20a, 20b in the regions above conductors 12b, 12c constituting the digit lines.

A fourth interlayer insulating film 22 is formed on straps 20a, 20b to bury TMR cells 21a, 21b therein. A fifth interlayer insulating film 34 is formed on fourth interlayer insulating film 22. An interconnection groove 40 is formed in fifth interlayer insulating film 34 to expose the upper surfaces of TMR cells 21a, 21b. A barrier metal film 24a is formed to cover the inner wall of groove 40. A conductor 25a is formed on barrier metal film 24a to fill in groove 40. Conductor 25a and barrier metal film 24a constitute a bit line.

A sixth interlayer insulating film 26 is formed on fifth interlayer insulating film 34. Interconnection grooves 27a, 27b are formed in the upper surface of interlayer insulating film 26. Barrier metal films 28a, 28b are formed on the inner walls of grooves 27a, 27b. Conductors 29a, 29b are formed on barrier metal films 28a, 28b to fill in grooves 27a, 27b. Barrier metal films 28a, 28b and conductors 29a, 29b constitute an interconnection layer.

A seventh interlayer insulating film 30 is formed on sixth interlayer insulating film 26. An interconnection groove 3 1a is formed in the upper surface of interlayer insulating film 30. A barrier metal film 32a is formed on the inner wall of groove 31a, and a conductor 33a is formed on barrier metal film 32a to fill in groove 31a. Barrier metal film 32a and conductor 33a constitute an interconnection layer.

An eighth interlayer insulating film 41 is formed on conductor 33a constituting the interconnection layer. An interconnection groove 42a is formed on interlayer insulating film 41. The lower wall of groove 42a partly forms a through hole which extends down to the semiconductor substrate 1 side to expose a portion of the upper surface of conductor 33a at the bottom. A barrier metal film 43a is formed to cover the inner wall of groove 42a. A conductor 44a is formed on barrier metal film 43a to fill in groove 42a. Conductor film 44a and barrier metal film 43a constitute an upper interconnection layer.

In the logic portion of the semiconductor device shown in FIG. 12, the structure from the semiconductor substrate 1 to the layer in which the interconnection layer is formed of barrier metal film 11e and conductor 12e is the same as the corresponding structure in the semiconductor device shown in FIG. 1. On this structure, interlayer insulating film 17 is formed on conductor 12e to cover the upper surface of interlayer insulating film 8. On interlayer insulating film 17, a conductor film 20c is formed with the same layer as straps 20a, 20b in the MRAM cell portion. On conductor film 20c, TMR dummy cells 21c–21g are formed with the same layer as TMR cells 21a, 21b. Interlayer insulating film 22 is formed on conductor film 20c to bury TMR dummy cells 21c–21g therein. The upper surfaces of TMR dummy cells 21c–21g are exposed at the upper surface of interlayer insulating film 22.

Interlayer insulating film 34 is formed on interlayer insulating film 22. Interlayer insulating film 26 is formed on interlayer insulating film 34. An interconnection groove 27c is formed in the upper surface of interlayer insulating film 26. A barrier metal film 28c is formed on the inner wall of groove 27c, and a conductor 29c is formed on barrier metal film 28c to fill in groove 27c. The interconnection made of barrier metal film 28c and conductor 29c is formed with the same layer as the interconnections made of barrier metal films 28a, 28b and conductors 29a, 29b in the MRAM cell portion.

Interlayer insulating film 30 is formed on interlayer insulating film 26. An interconnection groove 31b is formed in the upper surface of interlayer insulating film 30. A barrier metal film 32b is formed on the inner wall of groove 31b, and a conductor 33b is formed on barrier metal film 32b to fill in groove 31b. The interconnection made of barrier metal film 32b and conductor 33b is formed with the same layer as the interconnection made of barrier metal film 32a and conductor 33a in the MRAM cell portion.

On conductor 33b, interlayer insulating film 41 is formed to cover the upper surface of interlayer insulating film 30. An interconnection groove 42b is formed in the upper surface of interlayer insulating film 41. A barrier metal film 43b is formed on the inner wall of groove 42b, and a conductor 44b is formed on barrier metal film 32b to fill in groove 42b.

To briefly describe the characteristic configuration of the semiconductor device shown in FIG. 12 as an example of the nonvolatile memory device according to the present invention, the semiconductor device includes the memory cell portion (MRAM cell portion) having the MRAM cells as the memory cells formed therein, and the logic portion having the logic circuit formed therein, on semiconductor substrate 1 as the substrate. The logic portion includes the interconnection as the first interconnection made of barrier metal film 11e and conductor 12e, and the interconnection as the second interconnection made of barrier metal film 28c and conductor 29c. The interconnection as the first interconnection is formed above semiconductor substrate 1. The interconnection as the second interconnection is formed above the interconnection as the first interconnection, with only the layers (interlayer insulating films 17, 22, 34, 26 and TMR dummy cells 21c–21g) other than the conductor layer constituting the logic circuit interposed therebetween.

The MRAM cell portion includes the digit lines as the third interconnections made of barrier metal films 11b, 11c and conductors 12b, 12c, the upper interconnections as the fourth interconnections made of barrier metal films 28a, 28b and conductors 29a, 29b, TMR cells 21a, 21b as the memory elements, and straps 20a, 20b and the bit line made of barrier metal film 24a and conductor 25a as the conductor layers. The conductor layers are not limited thereto; they may be, e.g., the second interconnections made of barrier metal films 15b, 15c and conductors 16b, 16c shown in FIG. 1. The digit lines as the third interconnections are formed with the same layer as the interconnection as the first interconnection (11e, 12e) in the logic portion. The upper interconnections as the fourth interconnections are formed with the same layer as the interconnection as the second interconnection (28c, 29c) in the logic portion. TMR cells 21a, 21b, the bit line and straps 20a, 20b, constituting the memory cells, are formed between the digit lines and the upper interconnections. That is, the conductor layers in the semiconductor device shown in FIG. 12 are formed between the digit lines as the third interconnections and the upper interconnections as the fourth interconnections, and include the bit line as the fifth interconnection that is connected to TMR cells 21a, 21b.

As described above, in the semiconductor device shown in FIG. 12, straps 20a, 20b, TMR cells 21a, 21b and the interconnection as the bit line made of barrier metal film 24a and conductor 25a, are arranged between the interconnection layer made of barrier metal films 11a–11e and conductors 12a–12e and the interconnection layer made of barrier metal films 28a–28c and conductors 29a–29c. Accordingly, it is possible to employ the interconnection layers located above the interconnection (24a, 25a) as the bit line (i.e., the interconnection layer made of barrier metal films 28a–28c and conductors 29a–29c, the interconnection layer made of barrier metal films 32a, 32b and conductors 33a, 33b, and the interconnection layer made of barrier metal films 43a, 43b and conductors 44a, 44b) as the interconnection layers constituting the logic circuit in the logic portion. As a result, in contrast to the case in FIG. 1 where the interconnection made of barrier metal film 24a and conductor 25a formed with the same layer as the interconnection layer in the logic portion is utilized as the bit line, it is possible to employ the above-described interconnection layers located above the bit line, without modification, as the interconnections (as a shunt interconnection select line for lowering resistance and others) constituting the logic portion.

More specifically, in the semiconductor device shown in FIG. 12, the lowermost interconnection layer (the interconnections made of barrier metal films 6b, 6c and conductors 7b, 7c) formed by so-called damascene in the upper surface of interlayer insulating film 4 is utilized as the source lines, and the second interconnection layer (the interconnections made of barrier metal films 11b, 11c and conductors 12b, 12c) is utilized as the digit lines. The bit line (the interconnection made of barrier metal film 24a and conductor 25a) is formed between the second interconnection layer and the third interconnection layer (the interconnections made of barrier metal films 28a, 28b and conductors 29a, 29b), so that the interconnections in the third interconnection layer and the interconnection (made of barrier metal film 32a and conductor 33a) in the fourth interconnection layer can be utilized as the shunt interconnection select line for lowering resistance of the word lines and others. In other words, formation of the bit line (of barrier metal film 24a and conductor 25a) additionally between the above-described second and third interconnection layers makes it possible to reduce the number of necessary interconnection layers than in the case where the interconnection (bit line) necessary for implementation of the MRAM cells is realized employing the same layer (e.g., the third interconnection layer) as the interconnection layer used in the logic portion.

Further, in the semiconductor device shown in FIG. 12, TMR cells 21a, 21b as the memory elements are ones including the magneto-resistive elements. Provision of TMR cells 21a, 21b between the upper interconnections (28a, 28b, 29a, 29a) and the digit lines (11b, 11c, 12b, 12c) makes it possible to ensure sufficiently small distances between TMR cells 21a, 21b and the corresponding digit lines for causing the magnetic field for use in writing in TMR cells 21a, 21b. This allows reduction in amount of the current (passed through the digit lines) necessary to generate the magnetic field. In addition, the distance between the digit lines and the interconnection as the bit line (made of barrier metal film 24a and conductor 25a) can be made small.

A manufacturing method of the semiconductor device shown in FIG. 12 is now described with reference to FIGS. 13–18.

Figure 13:
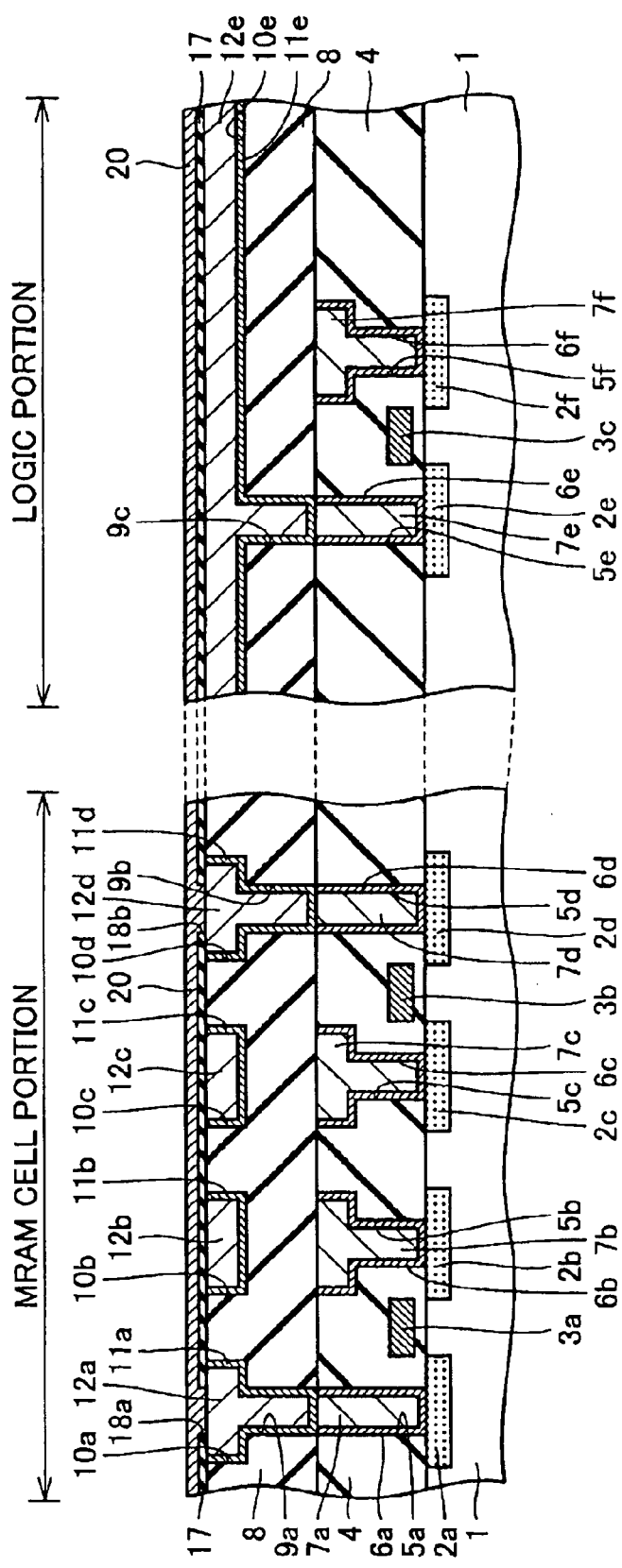
FIGS. 13–18 are schematic cross sectional views illustrating first through sixth steps of the manufacturing method of the semiconductor device shown in FIG. 12.

Firstly, the steps in the manufacturing method of the semiconductor device of the first embodiment explained in conjunction with FIG. 2 are carried out. Thereafter, referring to FIG. 13, a relatively thin interlayer insulating film 17 is formed on the upper surface of interlayer insulating film 8. A resist film (not shown) having a pattern is formed on interlayer insulating film 17. Using the resist film as a mask, interlayer insulating film 17 is partially removed by etching, and the resist film is then removed. As a result, openings 18a, 18b are formed in interlayer insulating film 17 in the regions immediately above conductors 12a, 12d. Thereafter, a conductor film 20 is formed on the inner walls of openings 18a, 18b and to cover the upper surface of interlayer insulating film 17. The structure shown in FIG. 13 is thus obtained.

Figure 14:
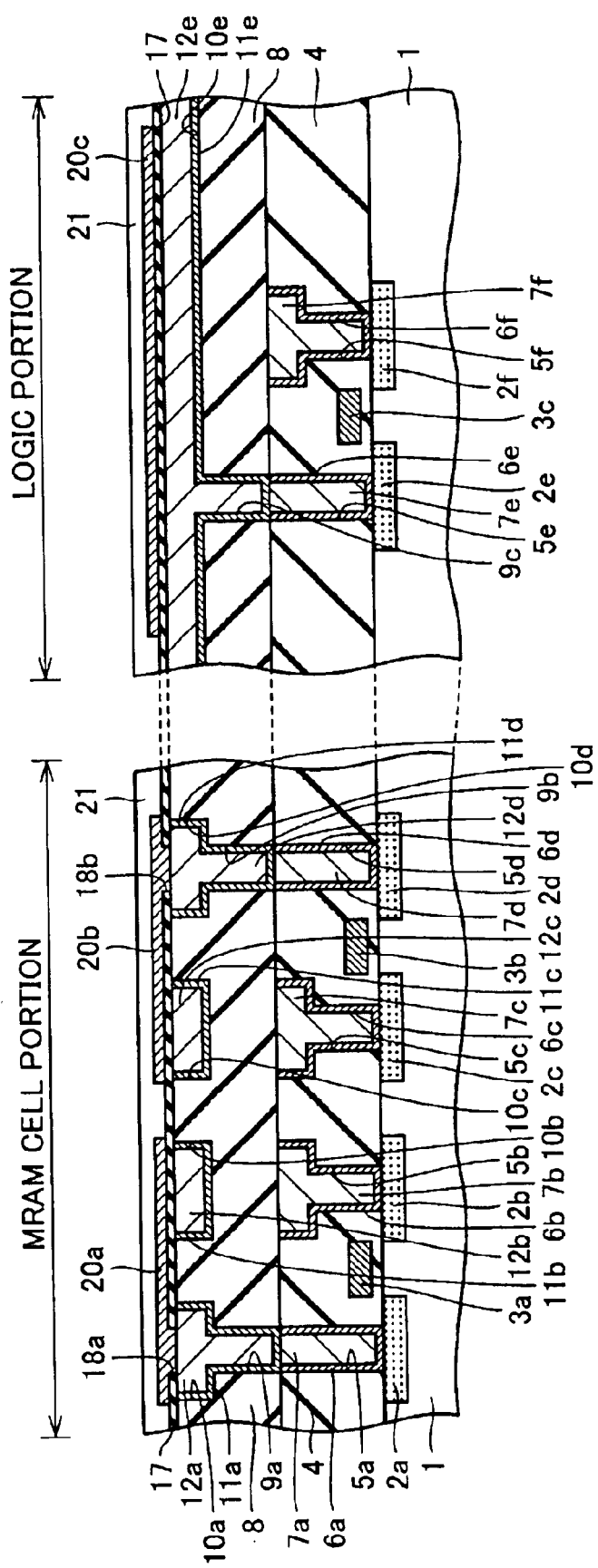

Next, a resist film having a pattern is formed on conductor film 20. Using the resist film as a mask, conductor film 20 is partially removed by etching. The resist film is then removed. As a result, straps 20a, 20b and conductor film 20c in the logic region are formed as shown in FIG. 14. A stacked film 21 to be TMR cells 21a, 21b (see FIG. 12) and TMR dummy cells 21c–21g (FIG. 12) is formed on straps 20a, 20b and conductor film 20c. The structure shown in FIG. 14 is thus obtained.

Figure 15:
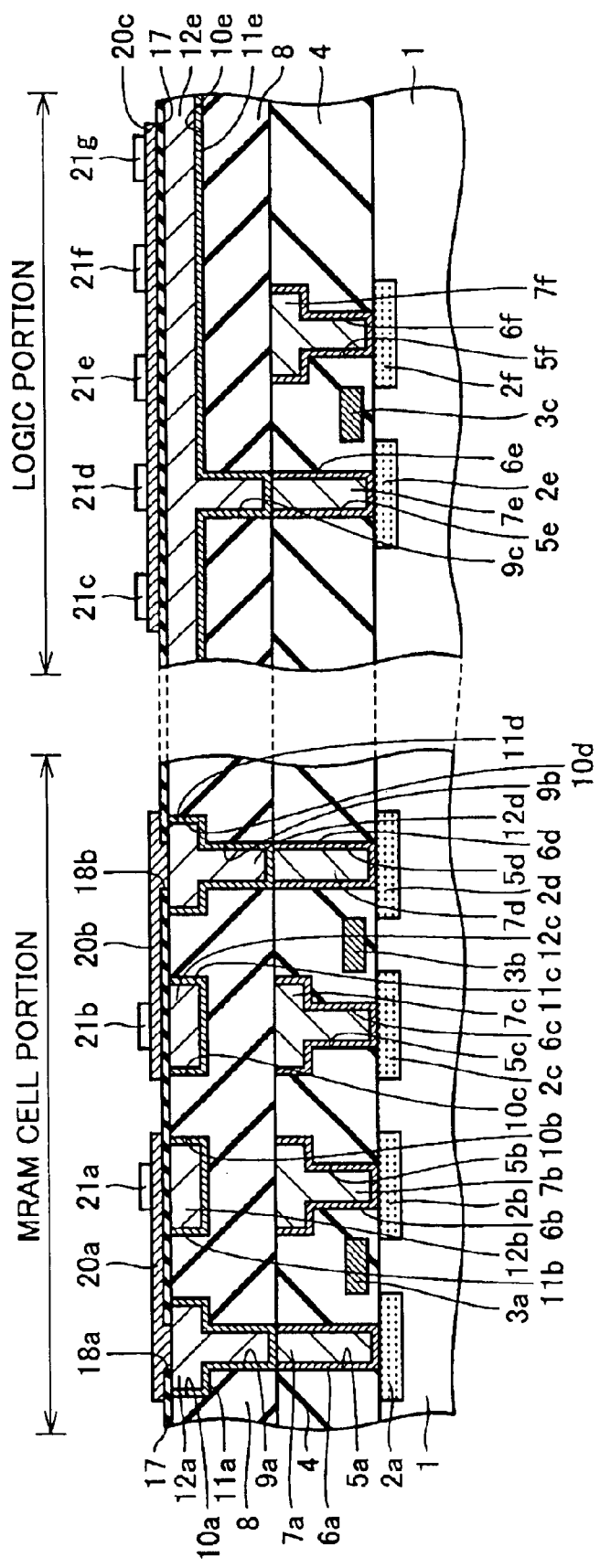

Next, a resist film having a pattern is formed on stacked film 21. Using this resist film as a mask, stacked film 21 is partially removed by etching. The resist film is then removed. As a result, TMR cells 21a, 21b and TMR dummy cells 21c–21g are formed as shown in FIG. 15.

Figure 16:
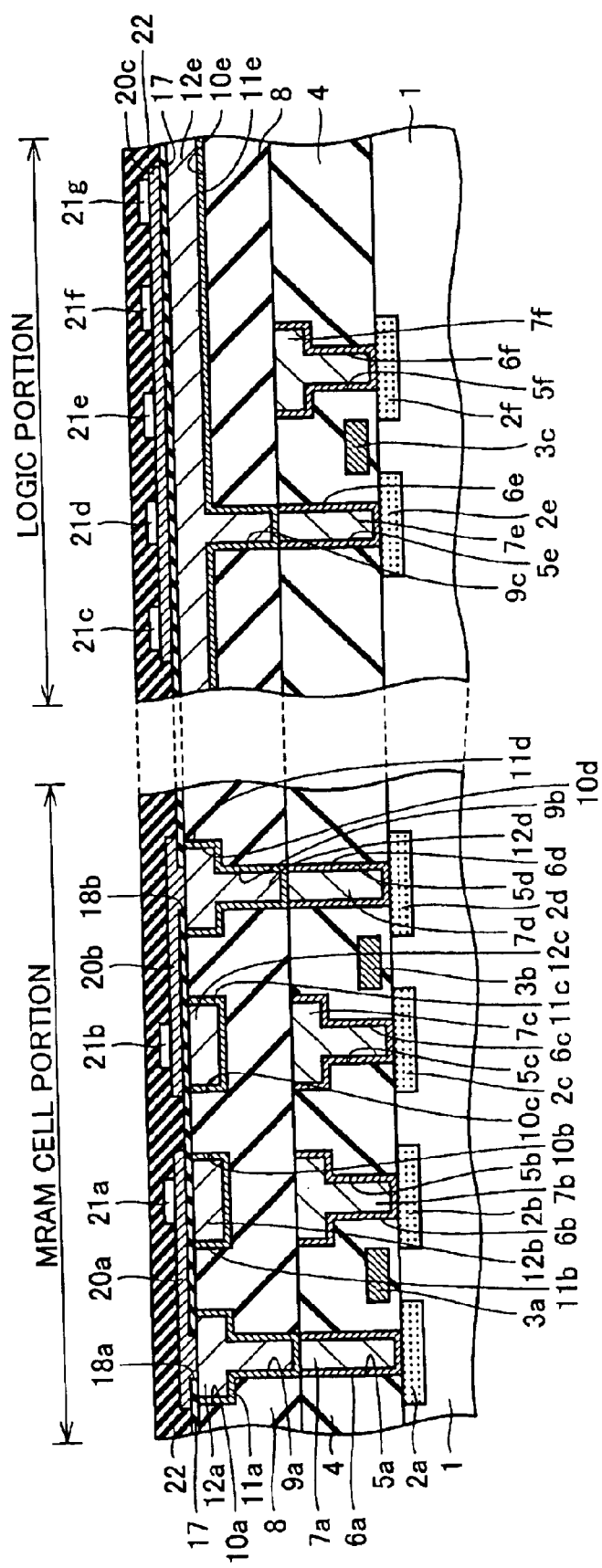
Figure 17:
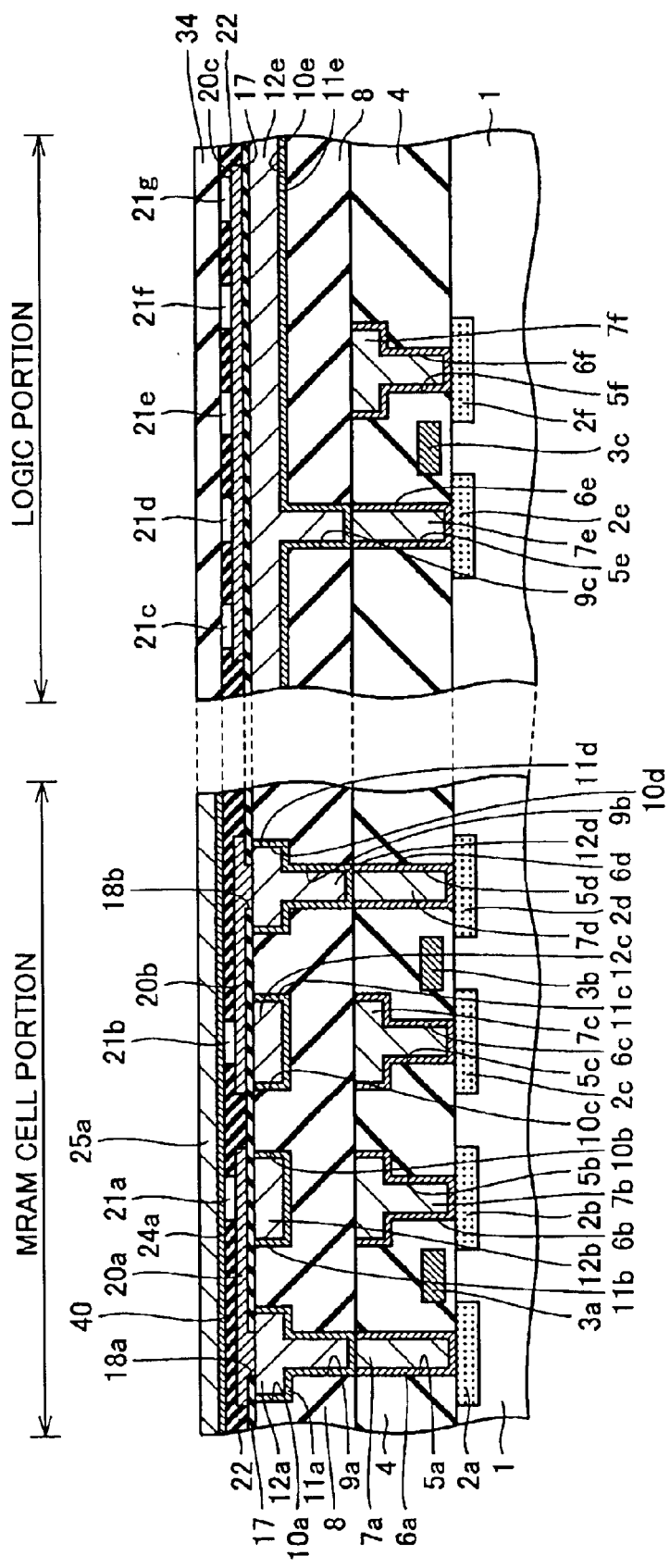

Interlayer insulating film 22 is formed on TMR cells 21a, 21b and TMR dummy cells 21c–21g. The structure shown in FIG. 16 is thus obtained.

Next, the surface layer of interlayer insulating film 22 is removed by CMP while being planarized. This polishing is continued until the upper surfaces of TMR cells 21a, 21b and TMR dummy cells 21c–21g are exposed from the upper surface of interlayer insulating film 22. Thereafter, referring to FIG. 17, interlayer insulating film 34 is formed on interlayer insulating film 22. A resist film (not shown) having a pattern is formed on interlayer insulating film 34. Using this resist film as a mask, interlayer insulating film 34 is partially removed. The resist film is then removed. As a result, interconnection groove 40 is formed in the MRAM cell portion through the regions overlying TMR cells 21a, 21b. The upper surfaces of TMR cells 21a, 21b are exposed at the bottom of groove 40.

A barrier metal film is formed on the inner wall of groove 40 and on the upper surface of interlayer insulating film 34.

A conductor film is formed on the barrier metal film to fill in groove 40 and to cover the upper surface of interlayer insulating film 34. Thereafter, the conductor film and the barrier metal film located on the upper surface of interlayer insulating film 34 are removed by CMP. As a result, the interconnection made of barrier metal film 24a and conductor 25a in groove 40 is obtained, which is used as the bit line.

Figure 18:
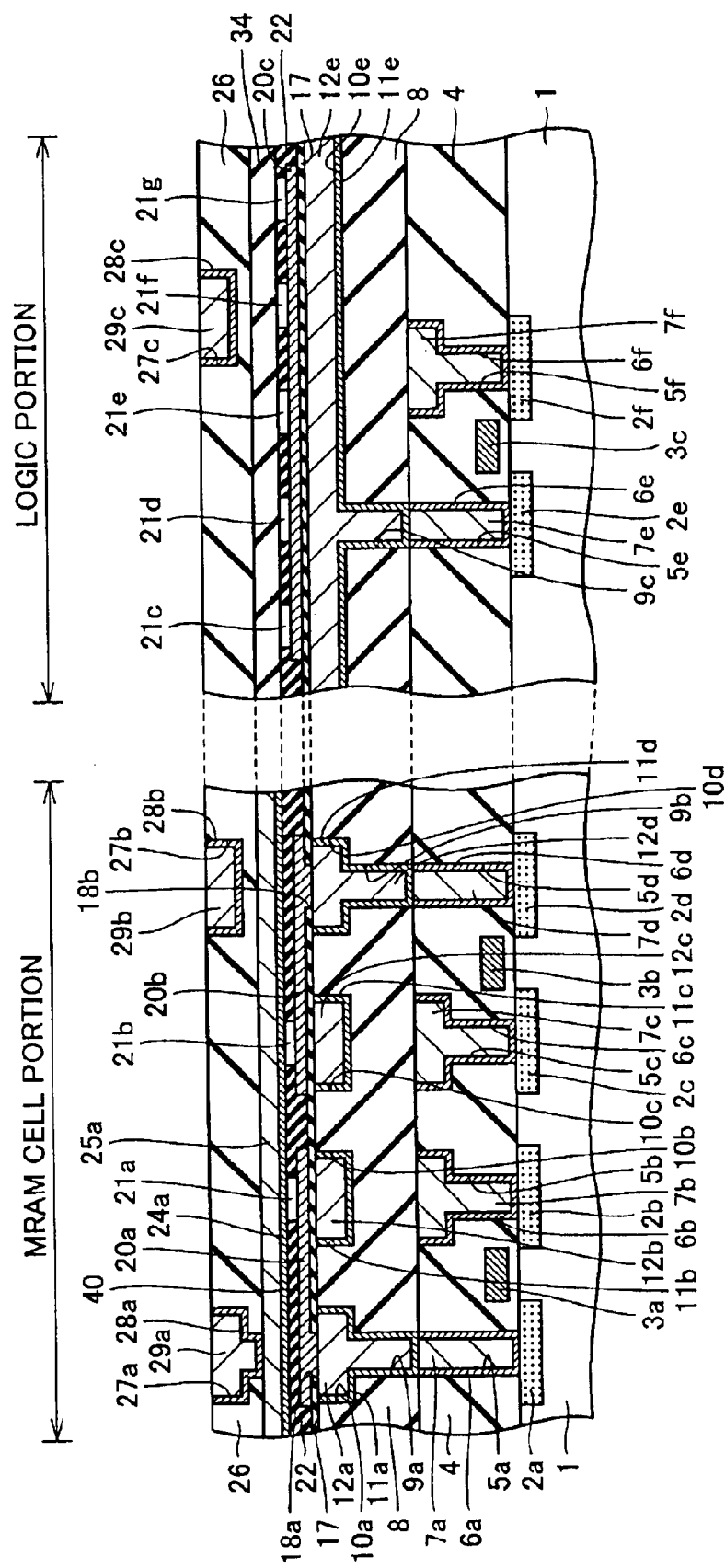

Next, referring to FIG. 18, interlayer insulating film 26 is formed on the upper surfaces of conductor 25a and interlayer insulating film 34. A resist film (not shown) having a pattern is formed on the upper surface of interlayer insulating film 26. Using this resist film as a mask, interlayer insulating film 26 is partially removed by etching, and the resist film is removed. As a result, interconnection grooves 27a–27c are formed in interlayer insulating film 26. An opening reaching conductor 25a is formed at the bottom of interconnection groove 27a by photolithography.

Thereafter, a barrier metal film is formed on the inner surfaces of grooves 27a–27c and on the upper surface of interlayer insulating film 26. A conductor is formed on the barrier metal film to fill in grooves 27a–27c and to cover the upper surface of interlayer insulating film 26. The conductor and the barrier metal film located on the upper surface of interlayer insulating film 26 are removed by CMP. As a result, the interconnections made of barrier metal films 28a–28c and conductors 29a–29c formed in respective grooves 27a–27c are obtained as shown in FIG. 18.

Thereafter, returning to FIG. 12, the same steps as the steps of forming interlayer insulating film 26, interconnection grooves 27a–27c, barrier metal films 28a–28c and conductors 29a–29c, are repeated to form interlayer insulating films 30, 41, interconnection grooves 31a, 31b, 42a, 42b, barrier metal films 32a, 32b, 43a, 43b, and conductors 33a, 33b, 44a, 44b. The semiconductor device shown in FIG. 12 is thus obtained.

In the second embodiment as described above, the semiconductor device having the MRAM cells and the logic circuit mounted together on a single chip has been described as an example of the nonvolatile memory device of the present invention. However, the present invention is applicable to any other nonvolatile memory device.

Third Embodiment

The third embodiment of the semiconductor device according to the present invention is now described with reference to FIG. 19.

Figure 19:
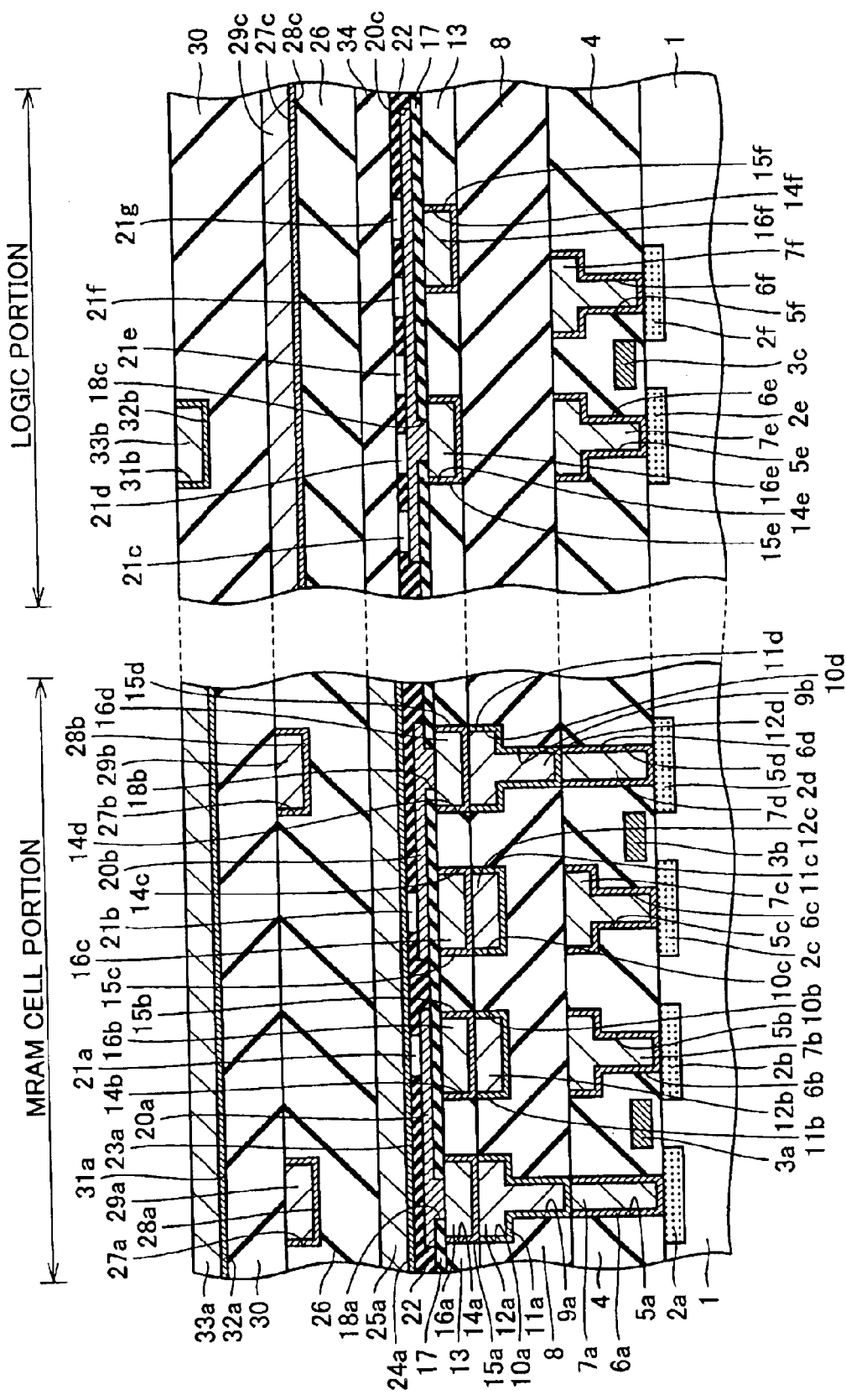
FIG. 19 is a schematic cross sectional view of a third embodiment of the semiconductor device according to the present invention.

As shown in FIG. 19, the semiconductor device of the present embodiment is provided with an MRAM cell portion and a logic portion, and has basically the same structure as in the first embodiment shown in FIG. 1. The present embodiment differs from the first embodiment in the structure including interlayer insulating films 4, 8, 13 in the logic portion. The structure of the MRAM cell portion is identical to that of the semiconductor device shown in FIG. 1.

In the logic portion of the semiconductor device shown in FIG. 19, interconnection grooves are formed in the upper portions of contact holes 5e, 5f in the portions immediately above respective source/drain regions 2e, 2f formed in the main surface of semiconductor substrate 1. Barrier metal films 6e, 6f are formed on the inner walls of the respective interconnection grooves and contact holes 5e, 5f. Conductor plugs 7e, 7f are formed on respective barrier metal films 6e, 6f to fill in the grooves and contact holes 5e, 5f. The interconnections made of conductor plugs 7e, 7f and barrier metal films 6e, 6f in the grooves extend in a direction perpendicular to the plane of FIG. 19.

In the semiconductor device shown in FIG. 1, interconnection groove 10e, barrier metal film 11e and conductor 12e have been formed in interlayer insulating film 8. By comparison, in the semiconductor device shown in FIG. 19, interlayer insulating film 8 is unprovided with an interconnection groove, a barrier metal film and a conductor. Further, in interlayer insulating film 13 in the logic portion of the present embodiment, an interconnection layer is formed with the same layer as barrier metal films 15a–15d and conductors 16a–16d in the MRAM cell portion. Specifically, interconnection grooves 14e, 14f are formed in interlayer insulating film 13 in the logic portion. Barrier metal films 15e, 15f are formed on the inner walls of grooves 14e, 14f, and conductors 16e, 16f are formed on barrier metal films 15e, 15f to fill in grooves 14e, 14f. Barrier metal films 15e, 15f and conductors 16e, 16f constitute dummy interconnections. Further, an opening 18c is formed in interlayer insulating film 17 in the region immediately above conductor 16e. A conductor film 20c is formed to fill in opening 18c and to cover the upper surface of interlayer insulating film 17.

The same effects as in the semiconductor device in FIG. 1 can be obtained by the semiconductor device shown in FIG. 19.

To briefly describe the characteristic configuration of the semiconductor device shown in FIG. 19 as an example of the magnetic memory device, the semiconductor device is provided with the MRAM cell portion having the same structure as in the semiconductor device of FIG. 1, and is further provided with the dummy interconnections made of barrier metal films 15e, 15f and conductors 16e, 16f. The dummy interconnections are formed above semiconductor substrate 1 as the substrate, in the logic portion being the region other than the MRAM cell portion. The dummy interconnections are formed with the same layer as the second interconnections made of barrier metal films 15b, 15c and conductors 16b, 16c in the MRAM cell portion.

Thus forming the interconnections (dummy interconnections) of barrier metal films 15e, 15f and conductors 16e, 16f in the logic portion with the same layer as the interconnections of barrier metal films 15a–15d and conductors 16a–16d in the MRAM cell portion prevents excessive polishing of the logic portion compared to the MRAM cell portion during CMP or the like as will be described later. In other words, it is possible to prevent creation of a stepped boundary between the MRAM cell portion and the logic portion.

A manufacturing method of the semiconductor device shown in FIG. 19 is now described with reference to FIGS. 20–29.

Figure 20:
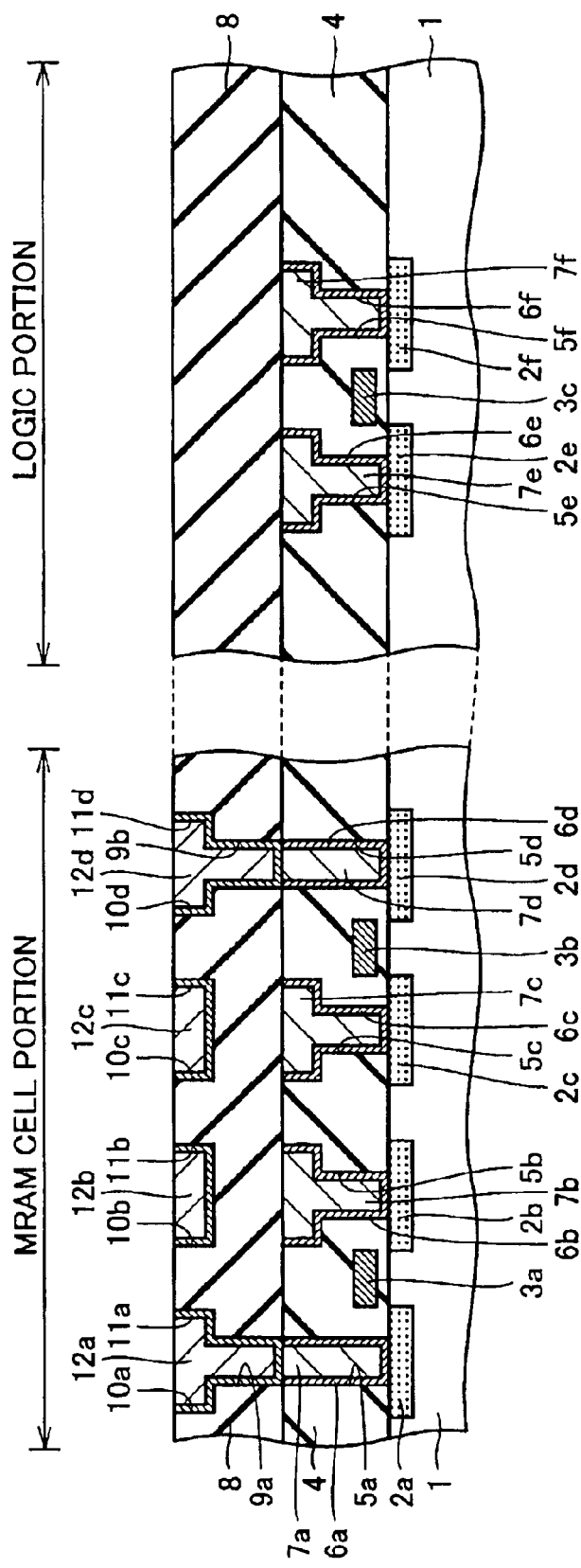
FIGS. 20–29 are schematic cross sectional views illustrating first through tenth steps of the manufacturing method of the semiconductor device shown in FIG. 19.

Firstly, referring to FIG. 20, the same steps as in FIG. 2 in the manufacturing method of the semiconductor device of the first embodiment are carried out to form the field effect transistors and interlayer insulating film 4 on the main surface of semiconductor substrate 1, and to form contact holes 5a–5f, barrier metal films 6a–6f, and conductor plugs 7a–7f. Interconnection grooves are formed in the upper portions of respective contact holes 5b, 5c, 5e, 5f at this time. Damascene interconnections extending in a direction perpendicular to the plane of FIG. 20 are thus formed in the upper portions of contact holes 5b, 5c, 5e and 5f.

Next, interlayer insulating film 8 is formed on interlayer insulating film 4. In the same manner as shown in FIG. 2, through holes 9a, 9b, interconnection grooves 10a–10d, barrier metal films 11a–11d and conductors 12a–12d are formed in interlayer insulating film 8. The structure shown in FIG. 20 is thus obtained.

Figure 21:
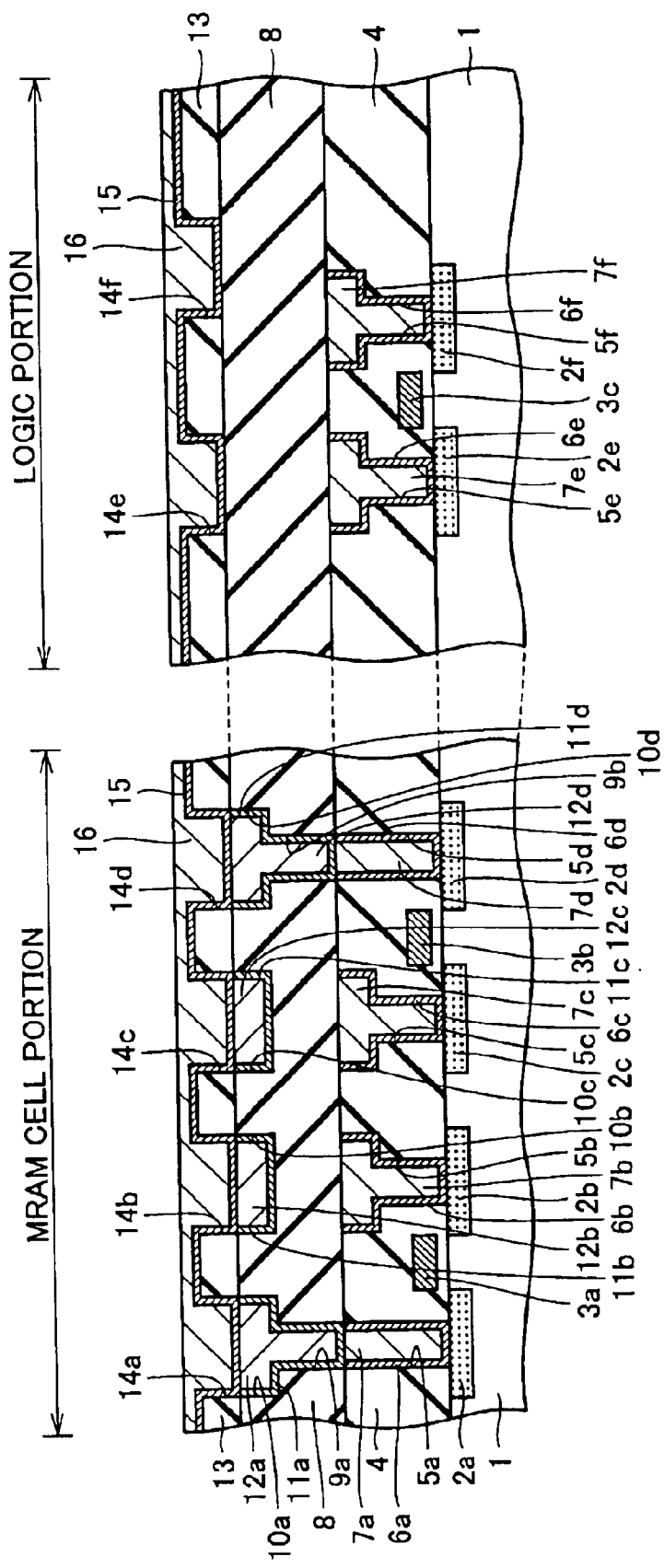

Next, referring to FIG. 21, interlayer insulating film 13 is formed on interlayer insulating film 8. A resist film (not shown) having a pattern is formed on interlayer insulating film 13. Using this resist film as a mask, interlayer insulating film 13 is partially removed by etching, and the resist film is removed. As a result, interconnection grooves 14a–14f are formed in interlayer insulating film 13. Barrier metal film 15 is formed on the inner surfaces of grooves 14a–14f and on the upper surface of interlayer insulating film 13. Conductor 16 is formed on barrier metal film 15. Thus, the structure shown in FIG. 21 is obtained. When copper (Cu) is used as conductor 16, it may be formed by plating.

Next, barrier metal film 15 and conductor 16 located on the upper surface of interlayer insulating film 13 are removed by CMP. As a result, the structure shown in FIG. 22 is obtained.

In the logic portion, interconnection grooves 14a, 14f have been formed and barrier metal film 15 (FIG. 21) and conductor 16 (FIG. 21) have been filled therein, as in the grooves in the MRAM cell portion. This allows the polishing conditions during CMP to be maintained approximately the same in the MRAM cell portion and in the logic portion. Accordingly, it is possible to suppress occurrence of a step on the upper surface of interlayer insulating film 13 at the boundary between the MRAM cell portion and the logic portion during the CMP.

In other words, provision of interconnection grooves 14a, 14f, barrier metal film 15 and conductor 16 in the logic portion makes the polishing speeds in the logic portion and in the MRAM cell portion approximately equal to each other. This suppresses occurrence of a physical step between the MRAM cell portion and the logic portion, and accordingly, short circuit or disconnection of the interconnections, defective opening of the contact holes and other problems due to such a step can be prevented. As a result, it is possible to reduce the probability of defects in the semiconductor device, and hence to improve reliability of the semiconductor device. Productivity and yield thereof are also improved.

Figure 22:
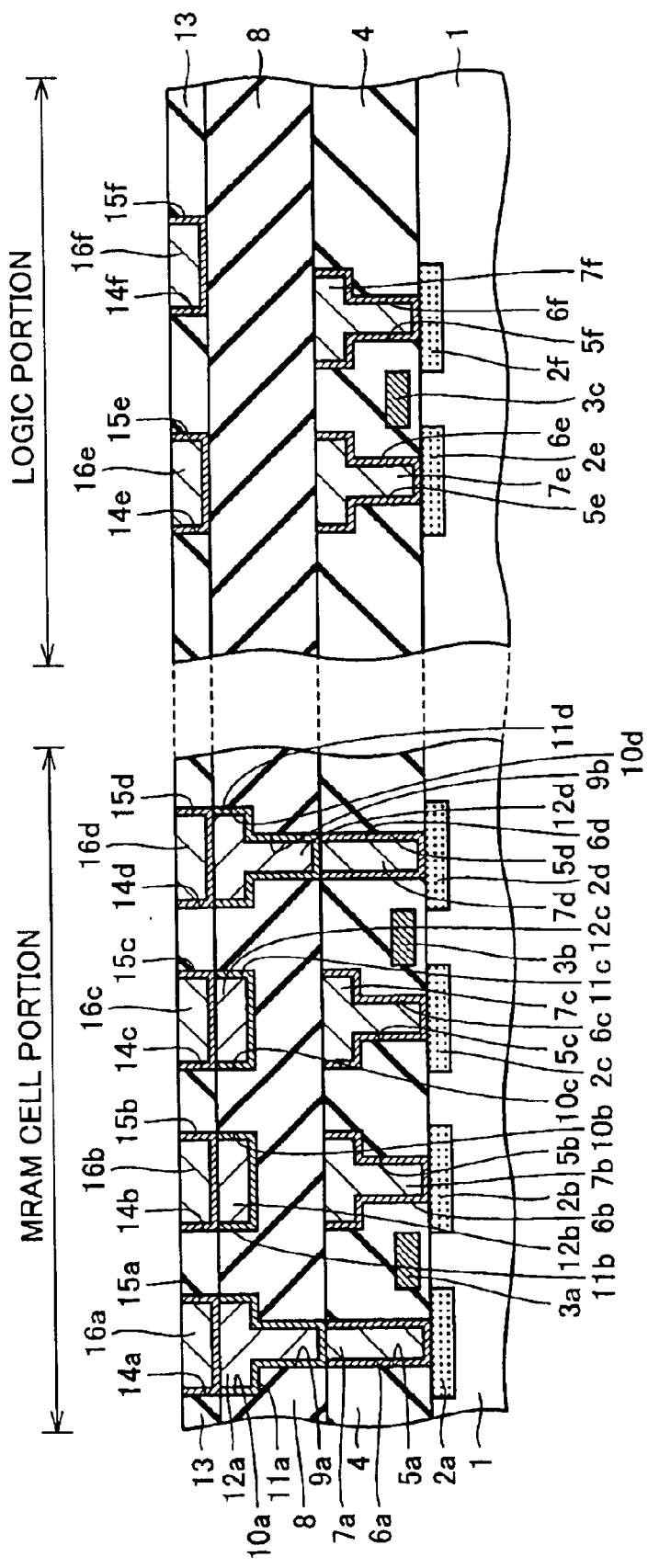
Figure 23:
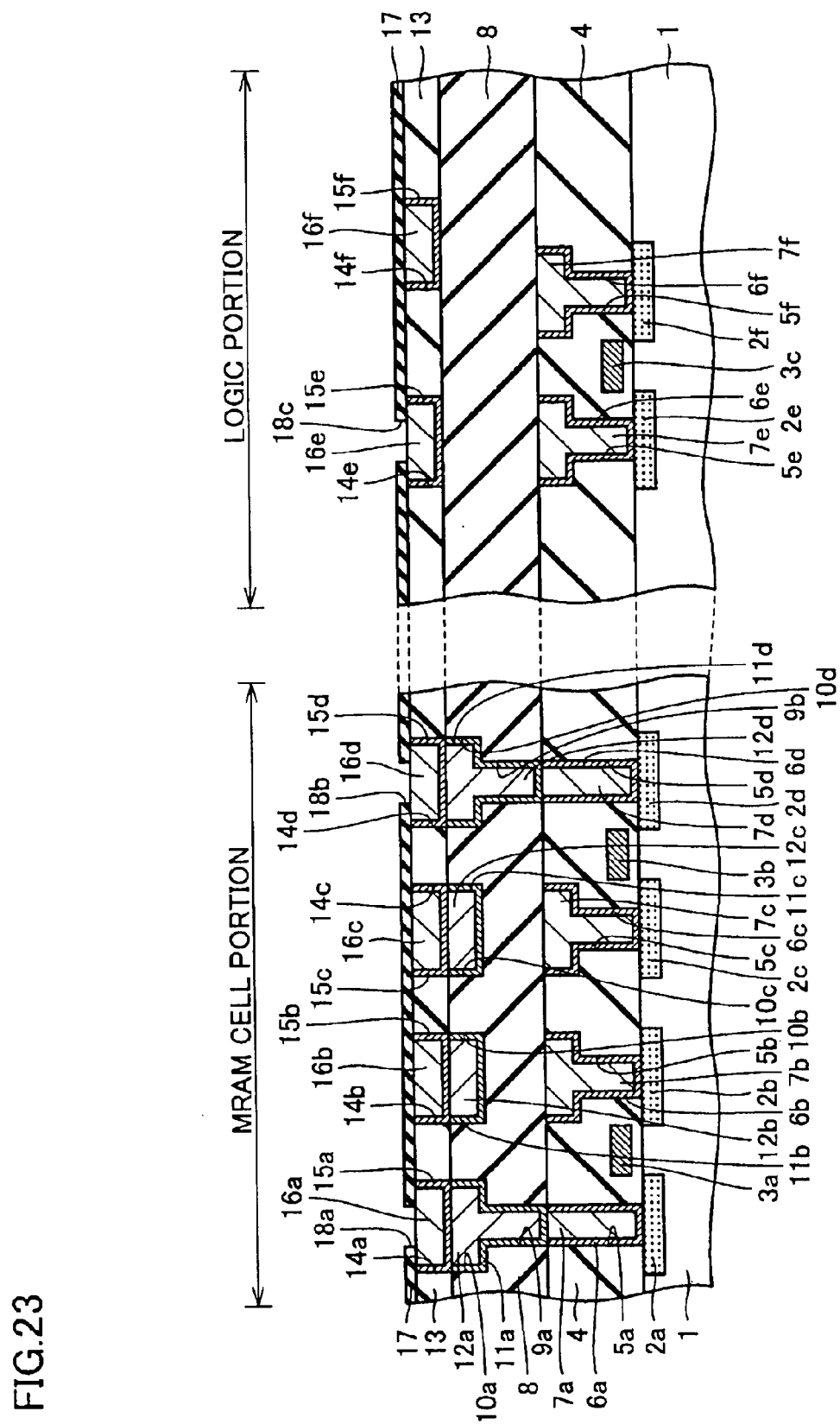

After the process step shown in FIG. 22, relatively thin interlayer insulating film 17 is formed on interlayer insulating film 13, as shown in FIG. 23. A resist film (not shown) having a pattern is formed on interlayer insulating film 17. Using this resist film as a mask, interlayer insulating film 17 is partially removed by etching, and the resist film is then removed. As a result, in interlayer insulating film 17, openings 18a–18c are formed in the regions immediately above conductors 16a, 16b and 16e, respectively. The structure shown in FIG. 23 is thus obtained.

Figure 24:
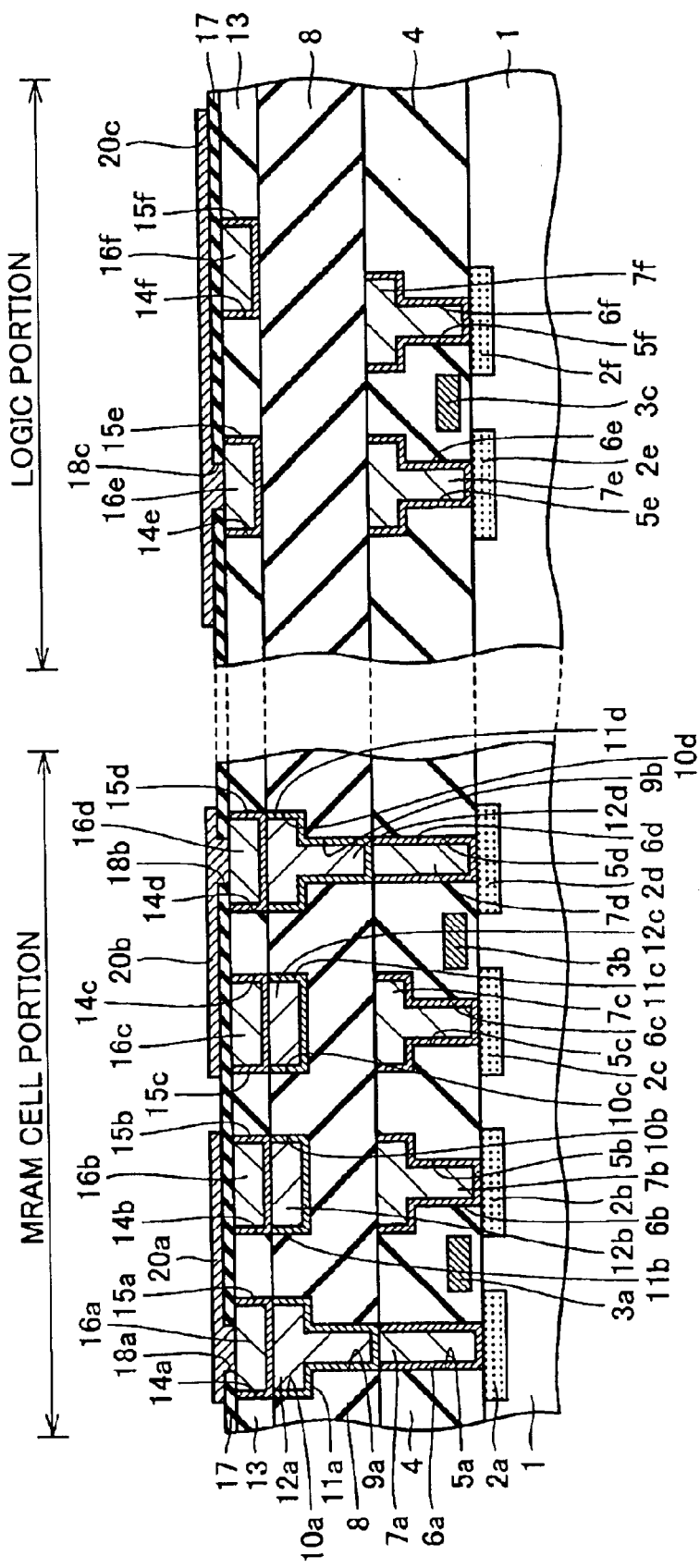

Next, referring to FIG. 24, a conductor film to be straps 20a, 20b and conductor 20c is formed on the upper surface of interlayer insulating film 17. A resist film (not shown) having a pattern is formed on this conductor film. Using the resist film as a mask, the conductor film is partially removed by etching, and the resist film is removed. As a result, straps 20a, 20b constituting the MRAM cells, and conductor film 20c in the logic portion are formed. Straps 20a, 20b are electrically connected to conductors 16a, 16b via openings 18a, 18b, respectively. Conductor film 20c is electrically connected to conductor 16e via opening 18c. The structure shown in FIG. 24 is thus obtained.

Figure 25:
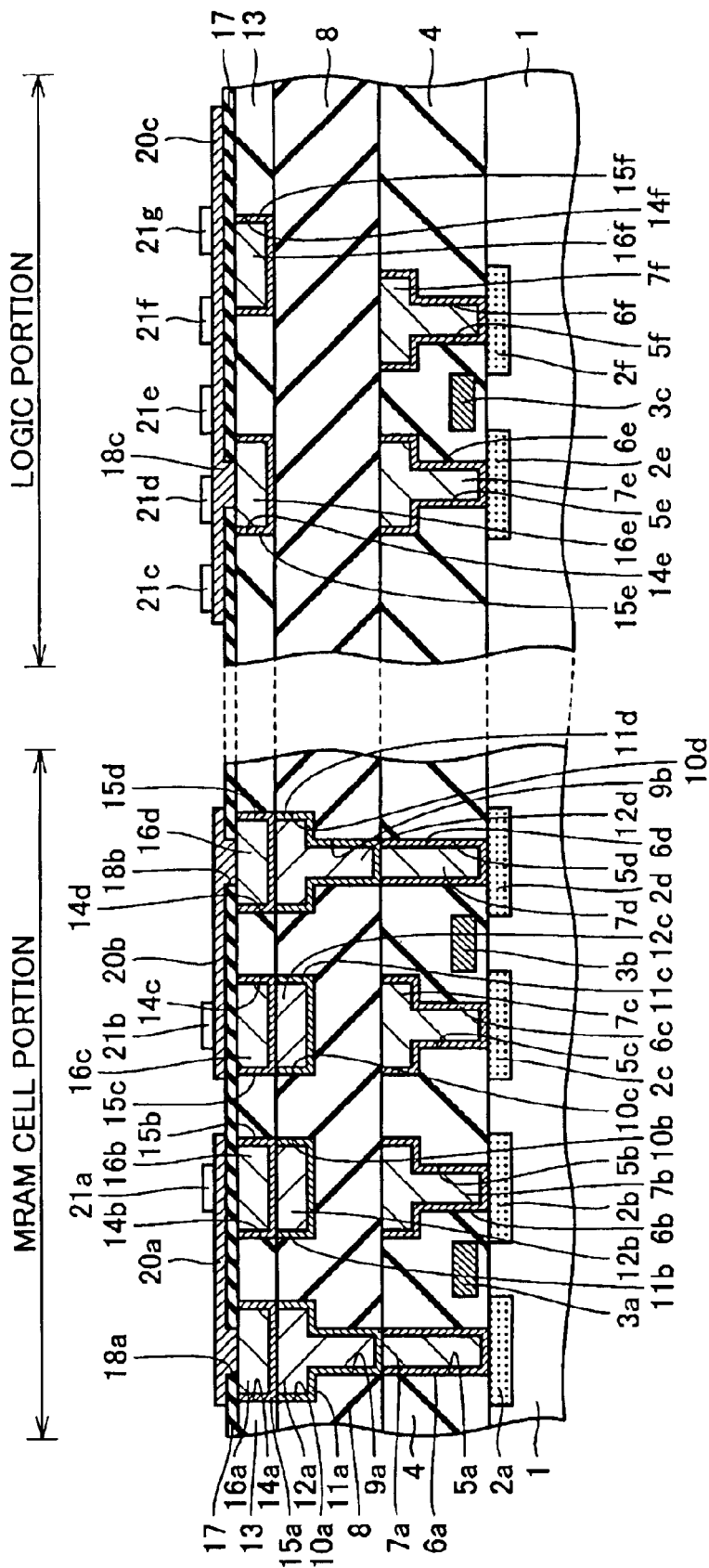

Next, the same steps as in FIG. 7 are performed to form TMR cells 21a, 21b and TMR dummy cells 21c–21g. As a result, the structure shown in FIG. 25 is obtained.

Figure 26:
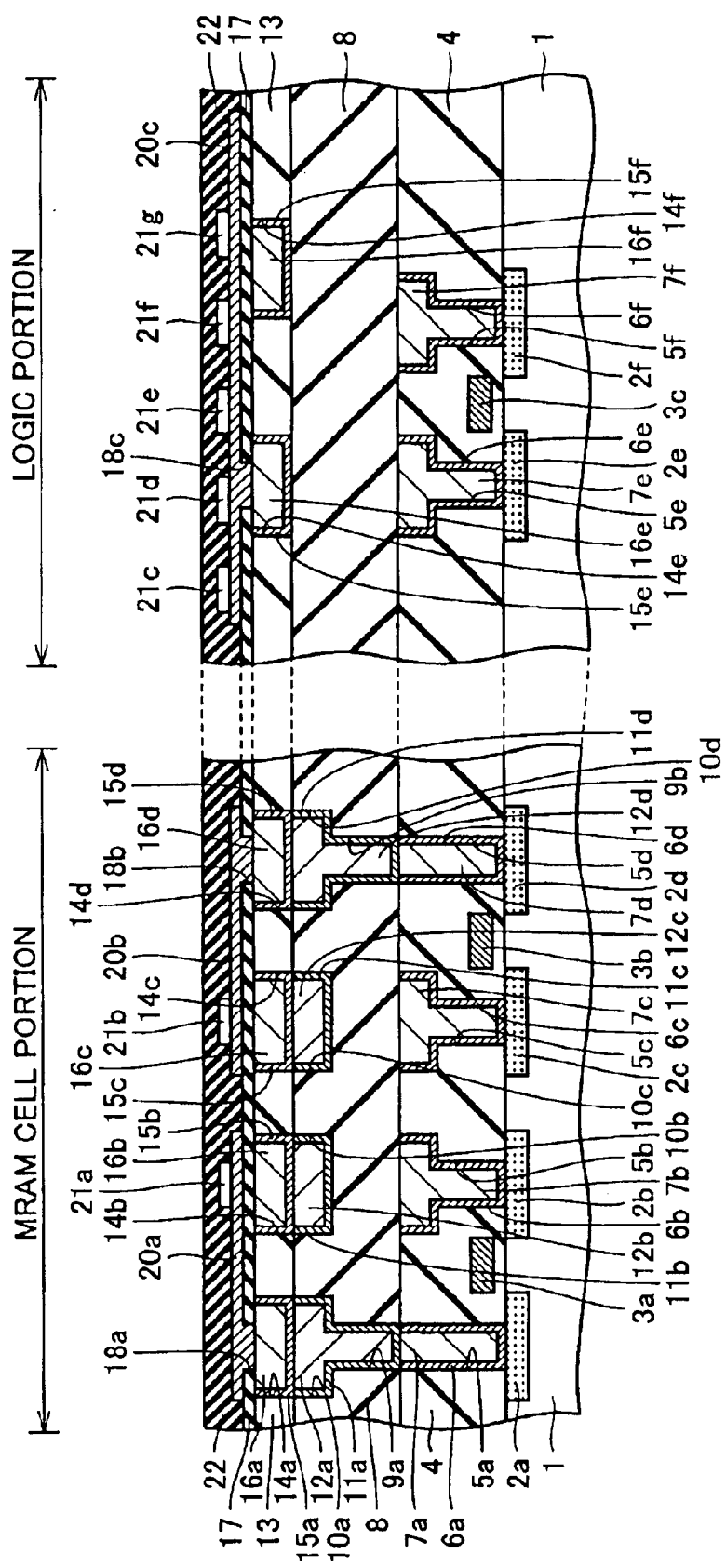

The same step as in FIG. 8 is then carried out to form interlayer insulating film 22 on TMR cells 21a, 21b and TMR dummy cells 21c–21g, as shown in FIG. 26.

Figure 27:
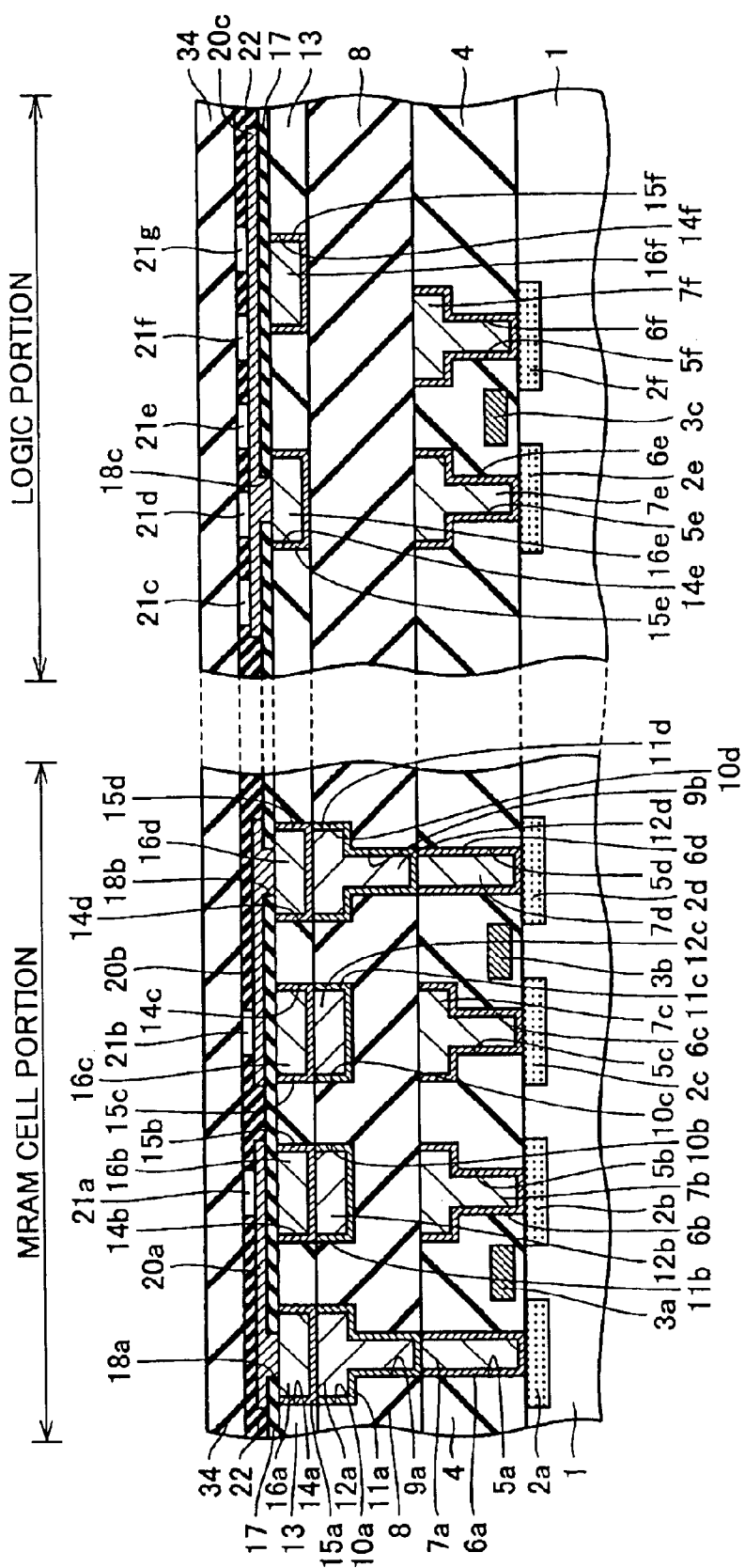

Next, referring to FIG. 27, the surface of interlayer insulating film 22 is partially removed by CMP to expose the upper surfaces of TMR cells 21a, 21b and TMR dummy cells 21c–21g. Thereafter, interlayer insulating film 34 is formed on the upper surface of interlayer insulating film 22. The upper surface of interlayer insulating film 34 is planarized by CMP. In the logic portion, the dummy interconnections of barrier metal films 15e, 15f and conductors 16e, 16f and TMR dummy cells 21c–21g have been formed as dummy structures. Thus, the thickness of interlayer insulating film 34 after subjected to CMP is approximately the same in the MRAM cell portion and in the logic portion. This means that formation of a physical step is prevented in the upper surface of interlayer insulating film 34 at the boundary between the MRAM cell portion and the logic portion. The structure shown in FIG. 27 is thus obtained.

Figure 28:
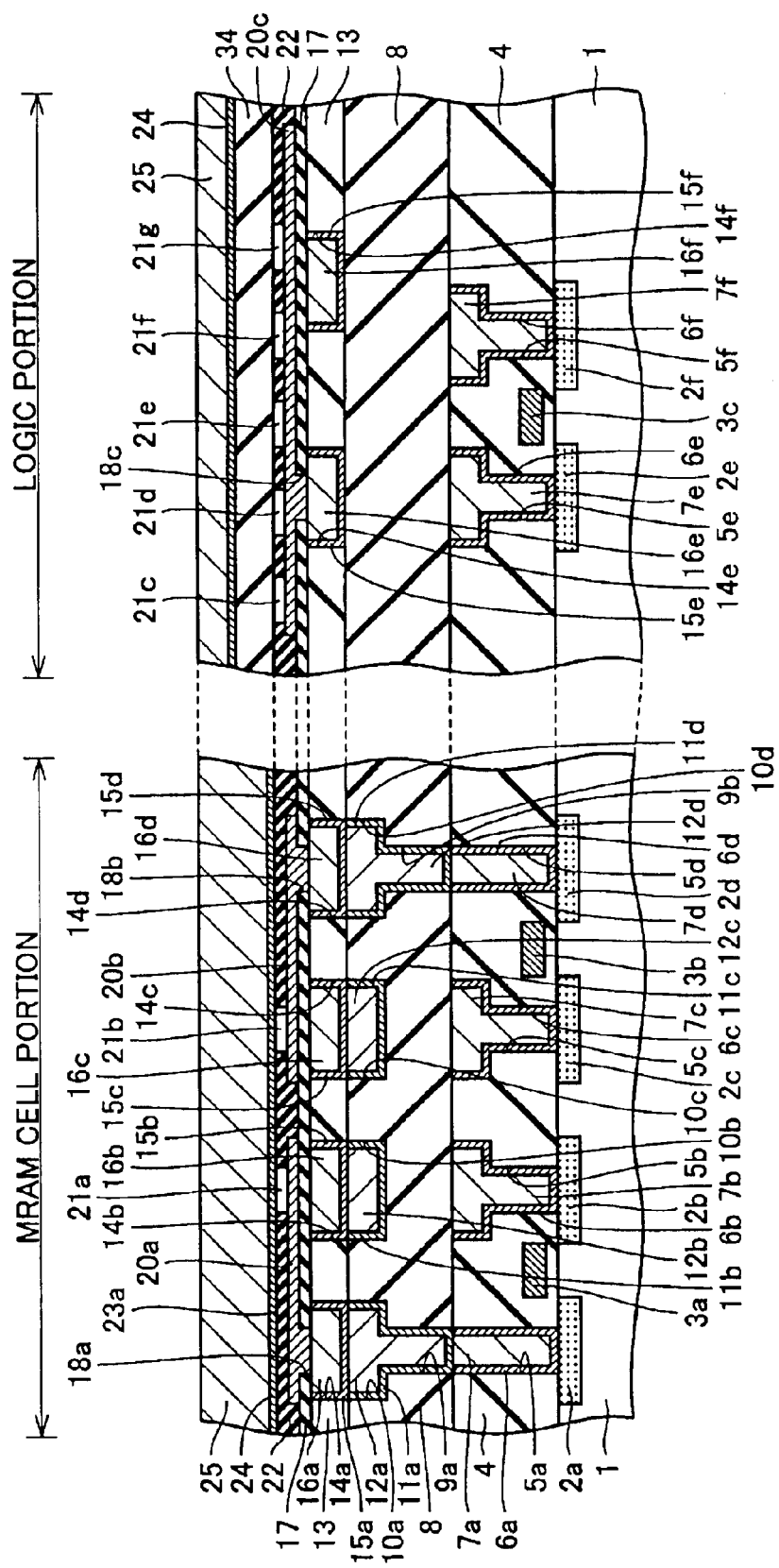

Next, referring to FIG. 28, a resist film (not shown) having a pattern is formed on the upper surface of interlayer insulating film 34. Using this resist film as a mask, interlayer insulating film 34 is partially removed by etching, and the resist film is removed. As a result, interconnection groove 23a is formed through the regions immediately above TMR cells 21a, 21b. The upper surfaces of TMR cells 21a, 21b are exposed at the bottom of groove 23a. Barrier metal film 24 is formed on the inner wall of groove 23a and on the upper surface of interlayer insulating film 34. Thereafter, conductor 25 is formed to fill in groove 23a and to cover the upper surface of interlayer insulating film 34. Thus, the structure shown in FIG. 28 is obtained.

Figure 29:
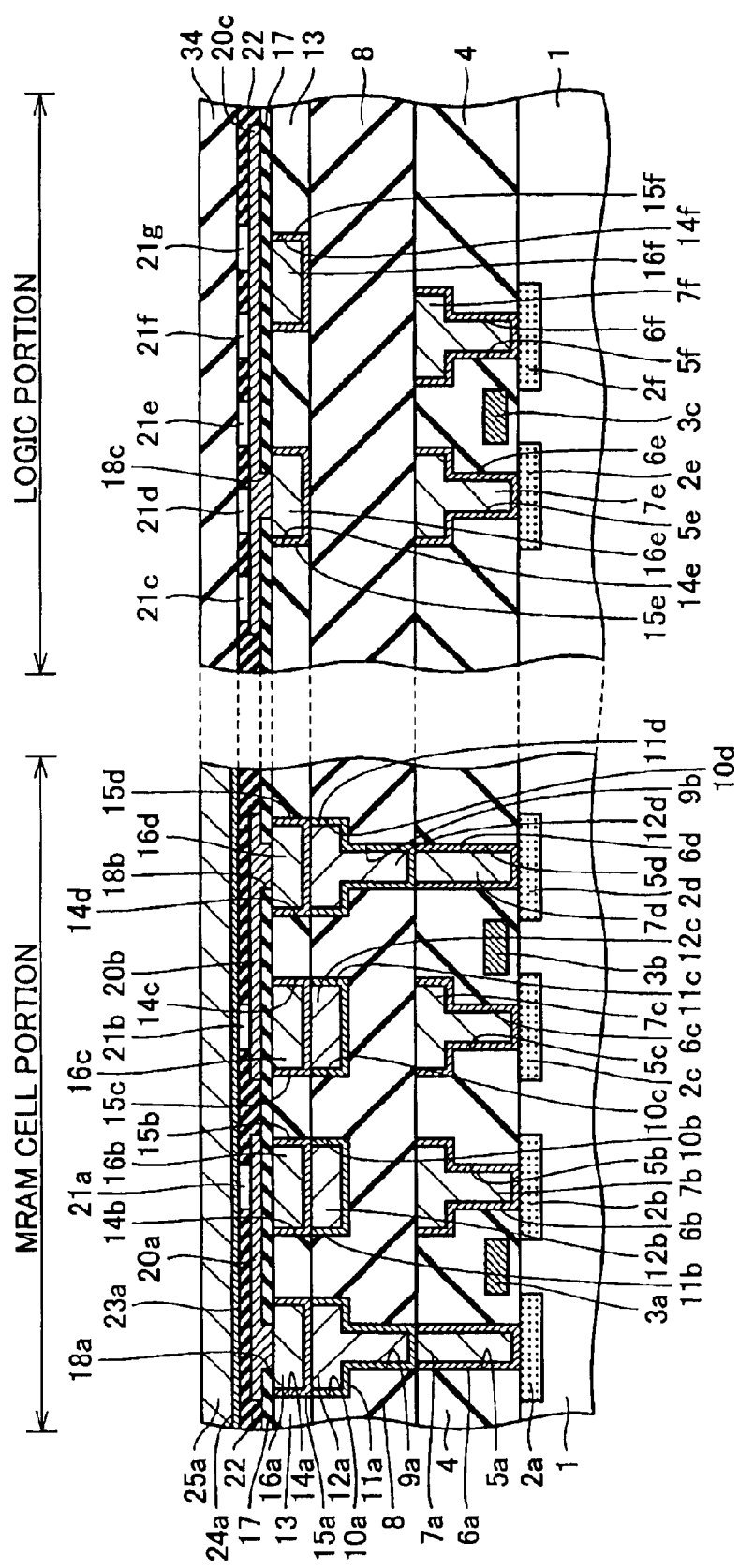

Barrier metal film 24 and conductor 25 located on the upper surface of interlayer insulating film 34 are removed by CMP. As a result, the structure shown in FIG. 29 is obtained. The interconnection as the bit line is formed in groove 23a with barrier metal film 24a and conductor 25a.

Thereafter, the same steps as in the first embodiment of forming interlayer insulating films 26, 30, interconnection grooves 27a–27c, 31a, 31b, barrier metal films 28a–28c, 32a, 32b and conductors 29a–29c, 33a, 33b are carried out, so that the semiconductor device shown in FIG. 19 is obtained.

Fourth Embodiment

The fourth embodiment of the semiconductor device according to the present invention is explained with reference to FIG. 30.

Figure 30:
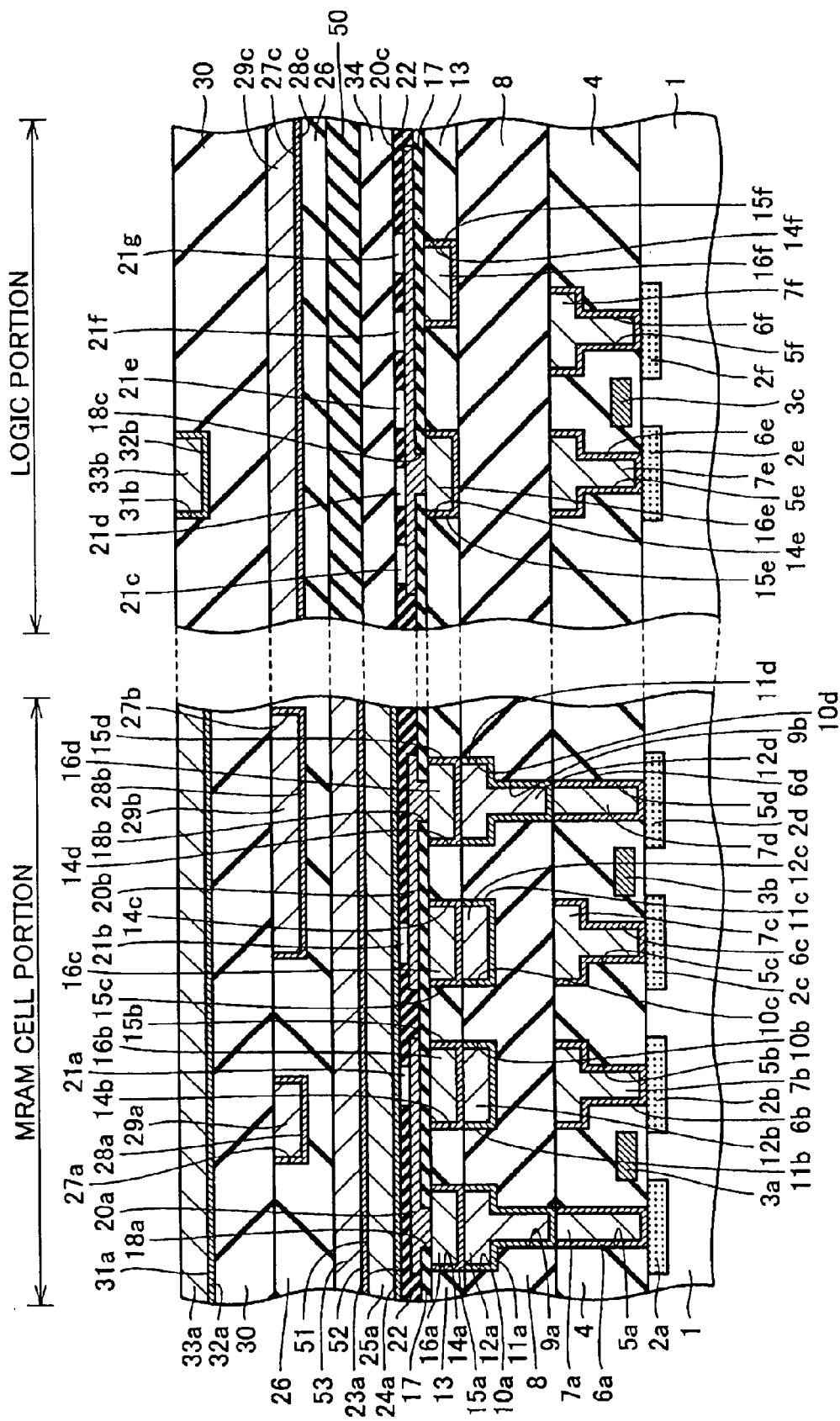
FIG. 30 is a schematic cross sectional view of a fourth embodiment of the semiconductor device according to the present invention.

Referring to FIG. 30, the semiconductor device is provided with an MRAM cell portion and a logic portion. The structure of the MRAM cell portion of the semiconductor device shown in FIG. 30 is identical to that of the third embodiment, except for the structure of the bit line electrically connected to TMR cells 21a, 21b. In the present embodiment shown in FIG. 30, the bit line is formed as a stacked interconnection having two damascene interconnections stacked one on the other.

Specifically, in the MRAM cell portion shown in FIG. 30, an interlayer insulating film 34 is formed on TMR cells 21a, 21b. In interlayer insulating film 34, an interconnection groove 23a is formed to expose the upper surfaces of TMR cells 21a, 21b. A barrier metal film 24a is formed on the inner wall of groove 23a, and a conductor 25a is formed on barrier metal film 24a to fill in groove 23a. An interlayer insulating film 50 is then formed on conductor 25a and on interlayer insulating film 34.

In interlayer insulating film 50, an interconnection groove 51 is formed in the region immediately above the interconnection made of barrier metal film 24a and conductor 25a. Conductor 25a is exposed at the bottom of groove 51. A barrier metal film 52 is formed on the inner wall of groove 51. A conductor 53 is formed on barrier metal film 52 to fill in groove 51. The lower damascene interconnection made of barrier metal film 24a and conductor 25a and the upper damascene interconnection made of barrier metal film 52 and conductor 53 constitute the bit line of stacked structure. The upper damascene interconnection is formed at least in the regions immediately above TMR cells 21a, 21b; it is partially unprovided in the regions other than the regions immediately above the TMR cells.

The structure of the logic portion of the semiconductor device shown in FIG. 30 is basically identical to that of the third embodiment shown in FIG. 19, except that interlayer insulating film 50 is additionally formed between interlayer insulating film 34 and interlayer insulating film 26 in the present embodiment. The same effects as in the semiconductor device of the third embodiment can be obtained with the semiconductor device of the present embodiment shown in FIG. 30.

To briefly describe the characteristic configuration of the semiconductor device shown in FIG. 30 as an example of the magnetic memory device according to the present invention, the semiconductor device includes: TMR cells 21a, 21b being the magneto-resistive elements operating as the memory elements; and the bit line as the interconnection arranged to contact TMR cells 21a, 21b (the bit line of stacked structure formed with the lower damascene interconnection as the first interconnection layer made of barrier metal film 24a and conductor 25a and the upper damascene interconnection as the second interconnection layer made of barrier metal film 52 and conductor 53). The bit line of stacked structure is thicker in the portions facing TMR cells 21a, 21b than in the remaining portions. That is, the bit line of stacked structure includes the lower damascene interconnection as the first interconnection layer and the upper damascene interconnection as the second interconnection layer, and the upper damascene interconnection is stacked on the lower damascene interconnection in the regions overlying the TMR cells 21a, 21b.

With such a configuration, the bit line (the stacked structure of two layers of the lower and upper damascene interconnections) in the MRAM cell portion can be made thick in the portions located above TMR cells 21a, 21b, resulting in reduction of resistance of the bit line. Thus, a current amount being passed through the bit line can be made small, and potential decrease attributable to the electric resistance in the bit line can be lessened. As a result, a channel width of each driver transistor for causing the current to pass through the bit line can be made small, and thus, downsizing and higher integration of the semiconductor device become possible.

Since the upper damascene interconnection is stacked on the lower damascene interconnection, it is readily possible to form the lower and upper damascene interconnections by repeating the identical steps, as will be described below.

A manufacturing method of the semiconductor device according to the fourth embodiment is described with reference to FIGS. 31–35.

Figure 31:
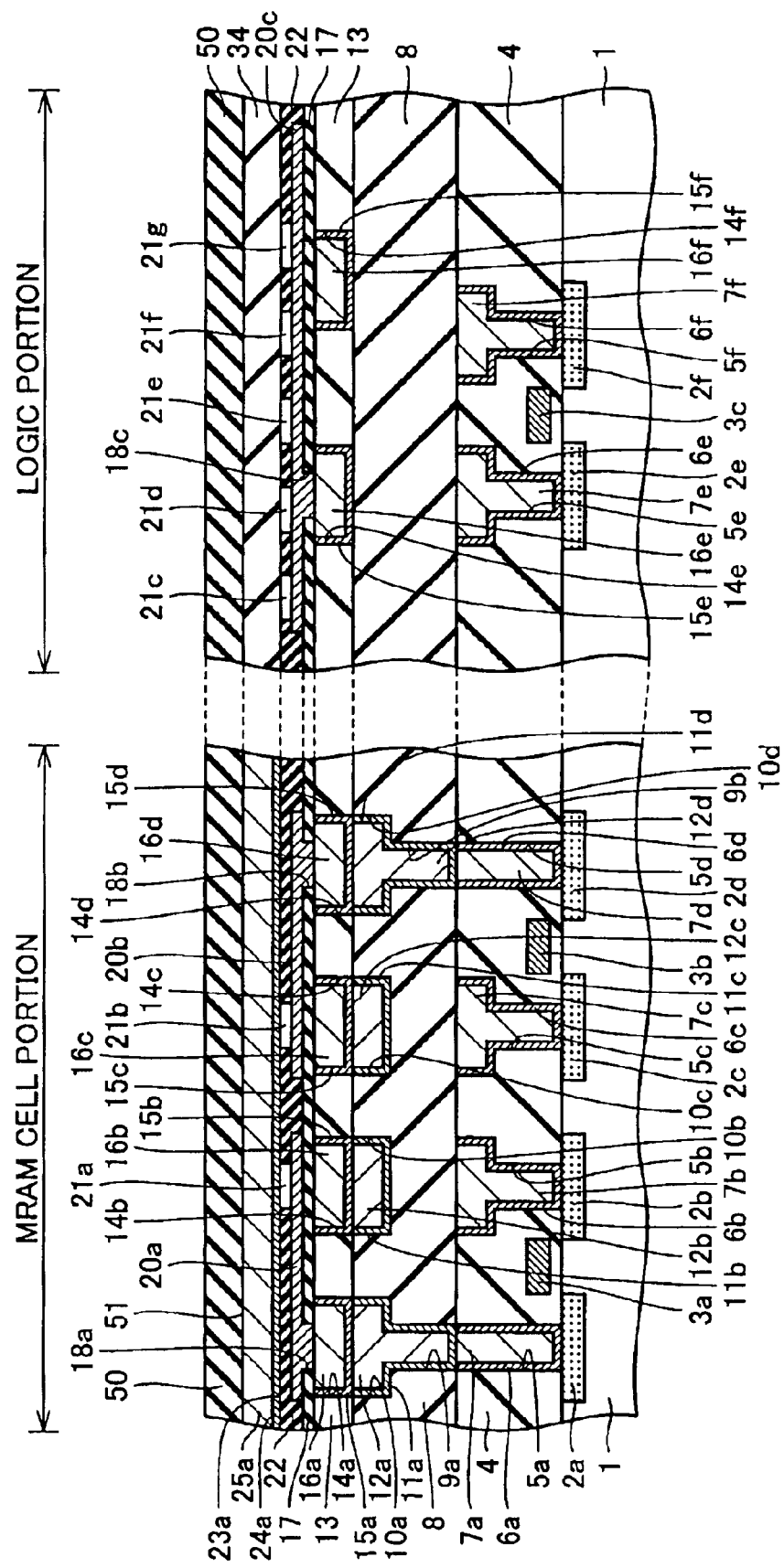
FIGS. 31–35 are schematic cross sectional views illustrating first through fifth steps of the manufacturing method of the semiconductor device shown in FIG. 30.

Following the steps as shown in FIGS. 20–29, interlayer insulating film 50 is formed on the upper surface of interlayer insulating film 34. As a result, the structure shown in FIG. 31 is obtained.

Figure 32:
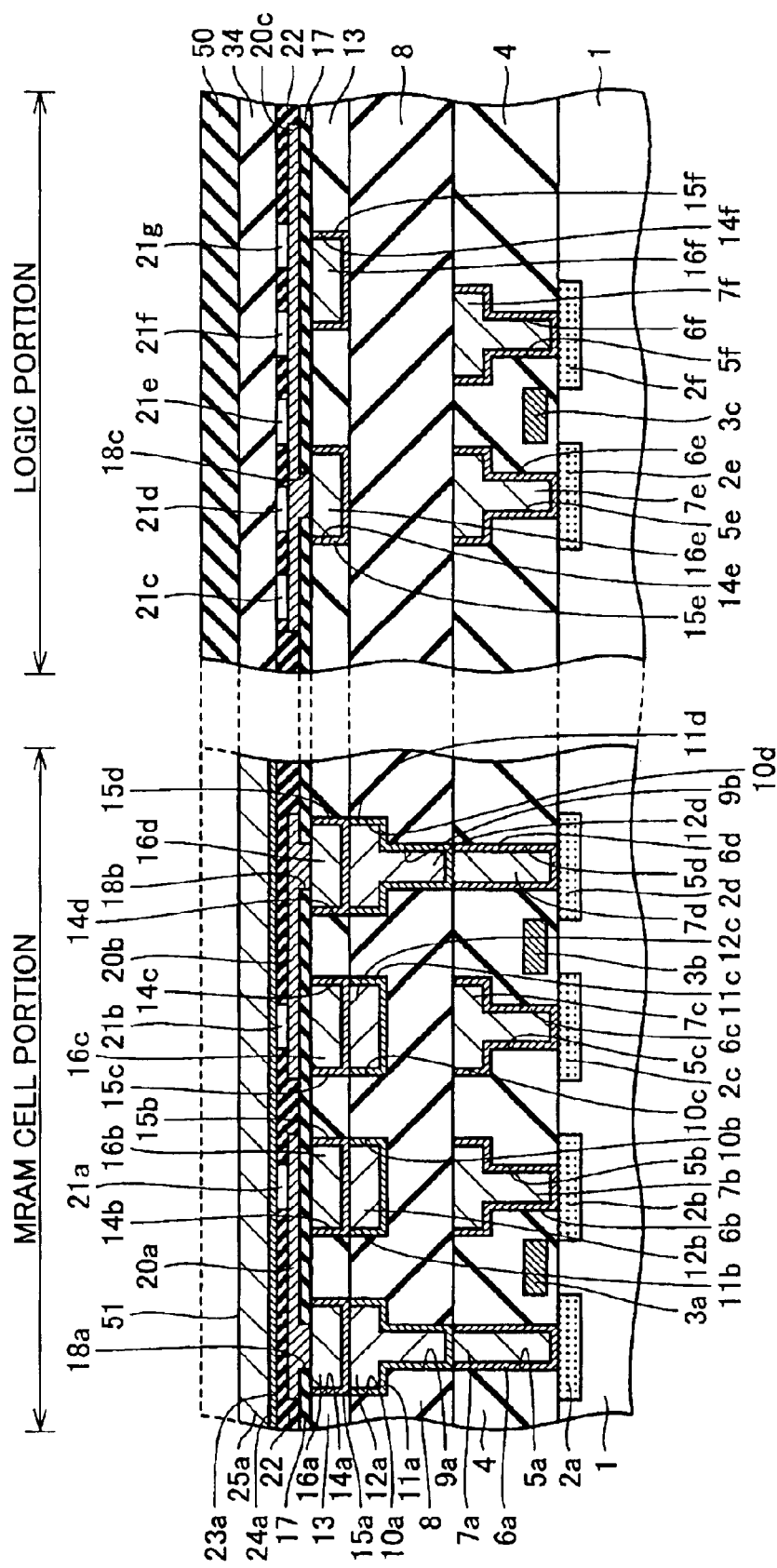

Next, a resist film (not shown) having a pattern is formed on the upper surface of interlayer insulating film 50. Using this resist film as a mask, interlayer insulating film 50 is partially removed, and then the resist film is removed. As a result, interconnection groove 51 is formed on conductor 25a, as shown in FIG. 32. Conductor 25a is exposed at the bottom of interconnection groove 51.

Figure 33:
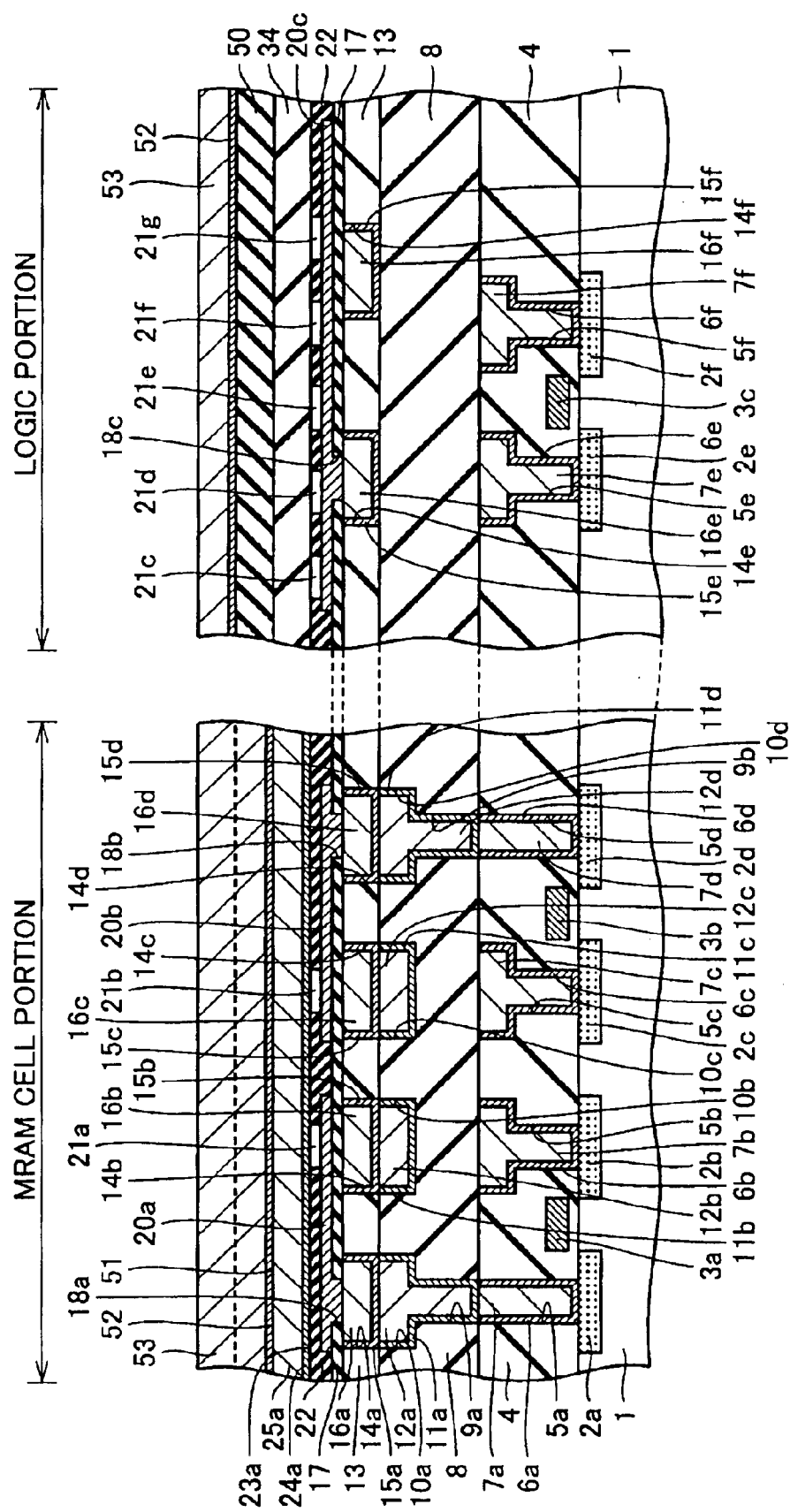

Next, referring to FIG. 33, barrier metal film 52 is formed on the inner wall of groove 51 and on the upper surface of interlayer insulating film 50. Conductor 53 is formed on barrier metal film 52 to fill in groove 51 and to cover interlayer insulating film 50. As a result, the structure shown in FIG. 33 is obtained.

Figure 34:
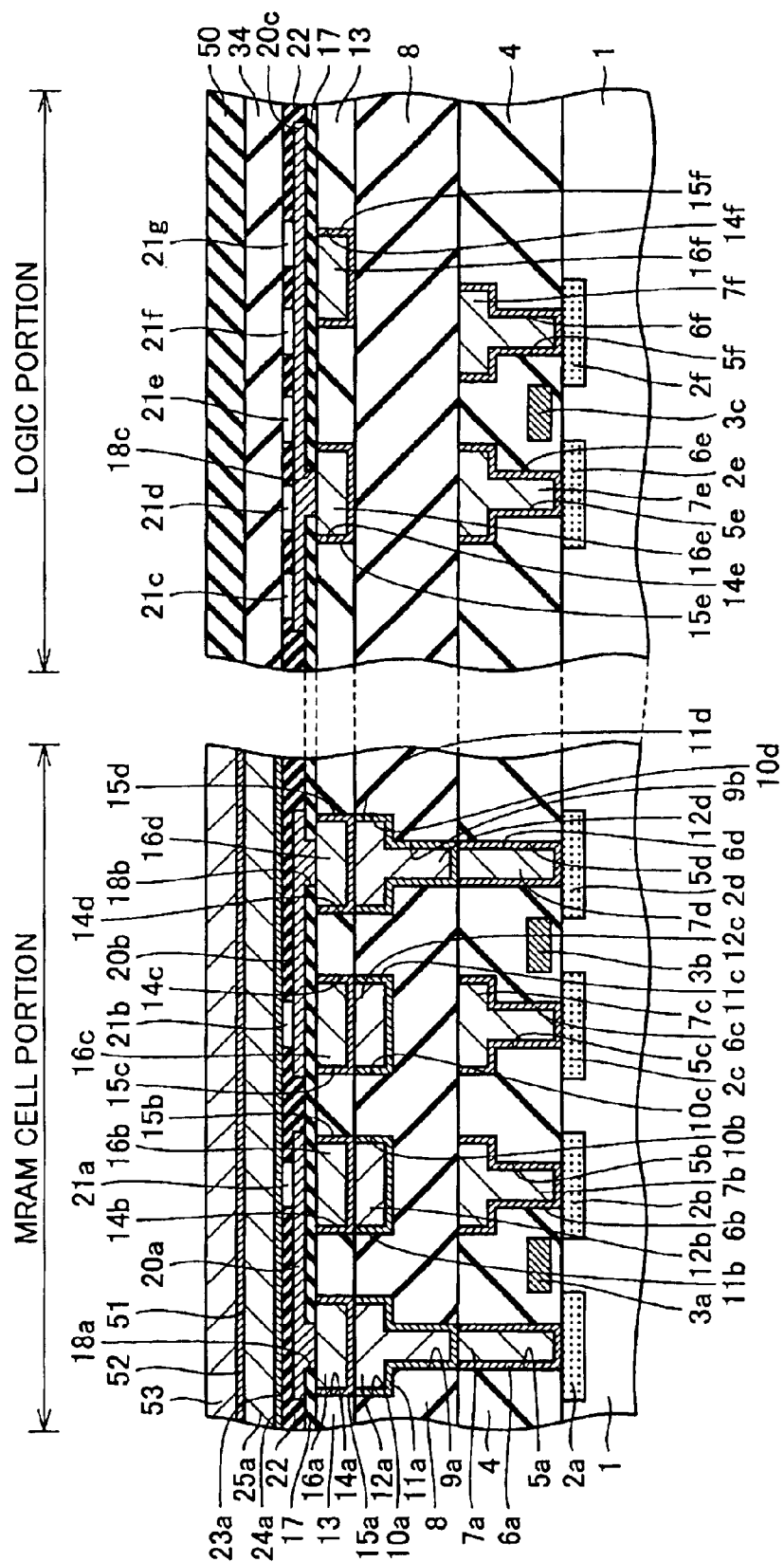

Next, conductor 53 and barrier metal film 52 located on the upper surface of interlayer insulating film 50 are removed by CMP. As a result, as shown in FIG. 34, the upper damascene interconnection is formed in groove 51 with barrier metal film 52 and conductor 53. Accordingly, the bit line of stacked structure consisting of the lower damascene interconnection of barrier metal film 24a and conductor 25a and the upper damascene interconnection as described above is formed.

Figure 35:
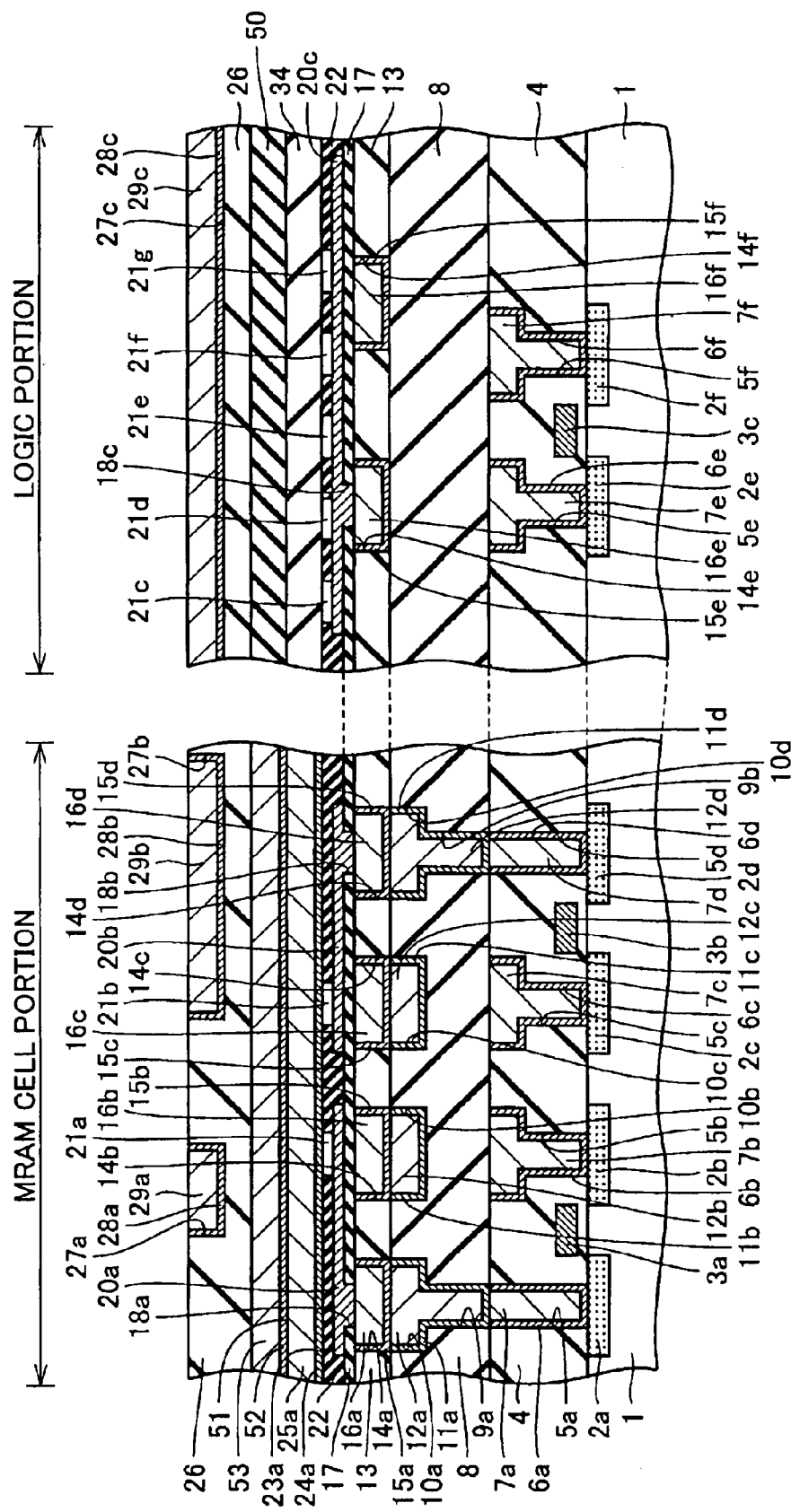

Next, referring to FIG. 35, interlayer insulating film 26 is formed on interlayer insulating film 50. A resist film having a pattern is formed on interlayer insulating film 26. Using the resist film as a mask, interlayer insulating film 26 is partially removed by etching, and the resist film is removed. As a result, interconnection grooves 27a–27c are formed in the upper surface of interlayer insulating film 26. A barrier metal film is formed on the inner walls of grooves 27a–27c and on the upper surface of interlayer insulating film 26. A conductor is formed on the barrier metal film to fill in grooves 27a–27c and to cover the upper surface of interlayer insulating film 26. The barrier metal film and the conductor located on the upper surface of interlayer insulating film 26 are removed by CMP. As a result, damascene interconnections are formed in grooves 27a–27c with barrier metal films 28a–28c and conductors 29a–29c. Thus, the structure shown in FIG. 35 is obtained.

Thereafter, returning to FIG. 30, the same steps as the steps of forming interlayer insulating film 26, interconnection grooves 27a–27c, barrier metal films 28a–28c and conductors 29a–29c are carried out to form interlayer insulating film 30, interconnection grooves 31a, 31b, barrier metal films 32a, 32b and conductors 33a, 33b. The semiconductor device shown in FIG. 30 is obtained accordingly.

Fifth Embodiment

The fifth embodiment of the semiconductor device according to the present invention is explained with reference to FIG. 36.

Figure 36:
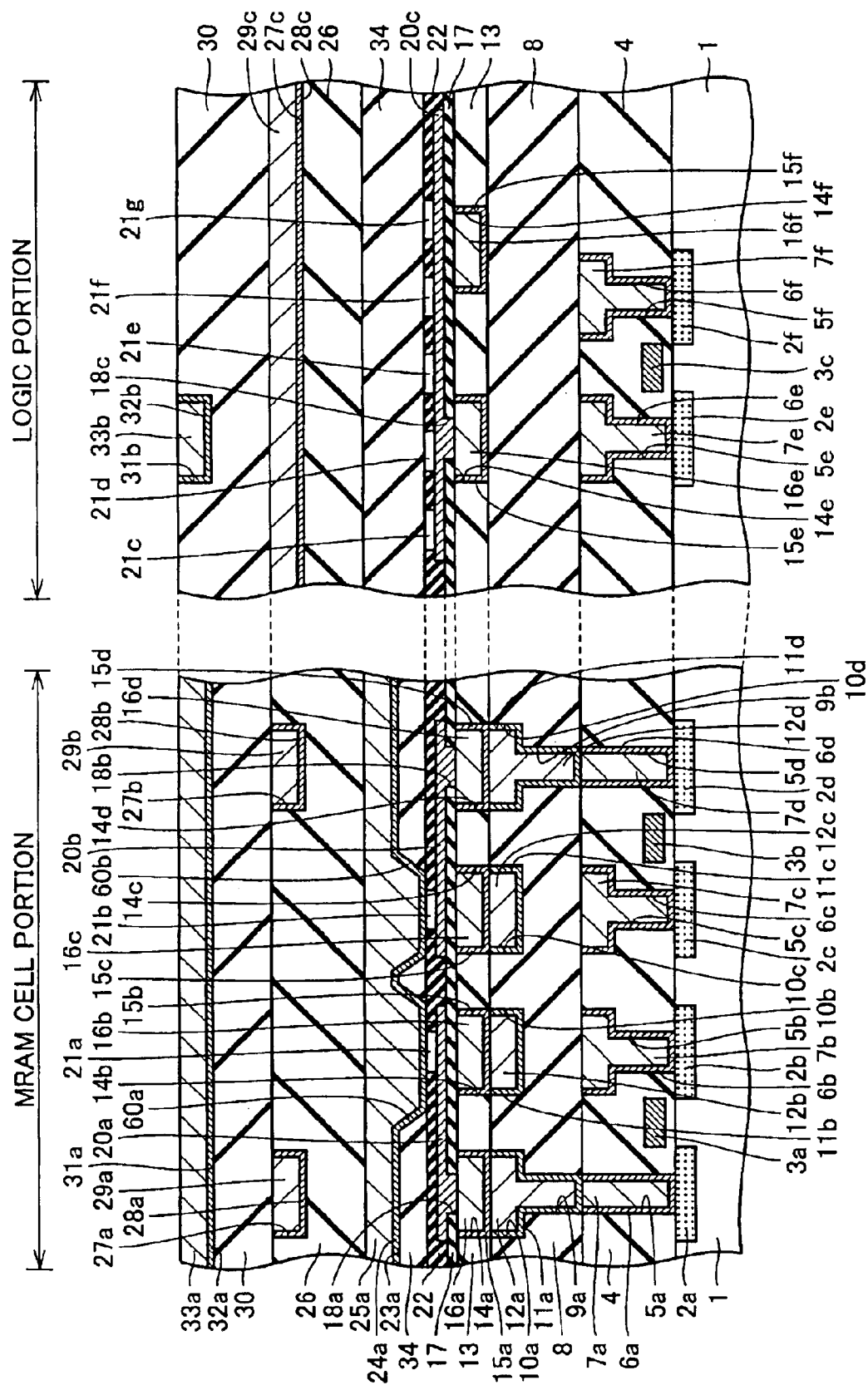
FIG. 36 is a schematic cross sectional view of a fifth embodiment of the semiconductor device according to the present invention.
Figure 37:
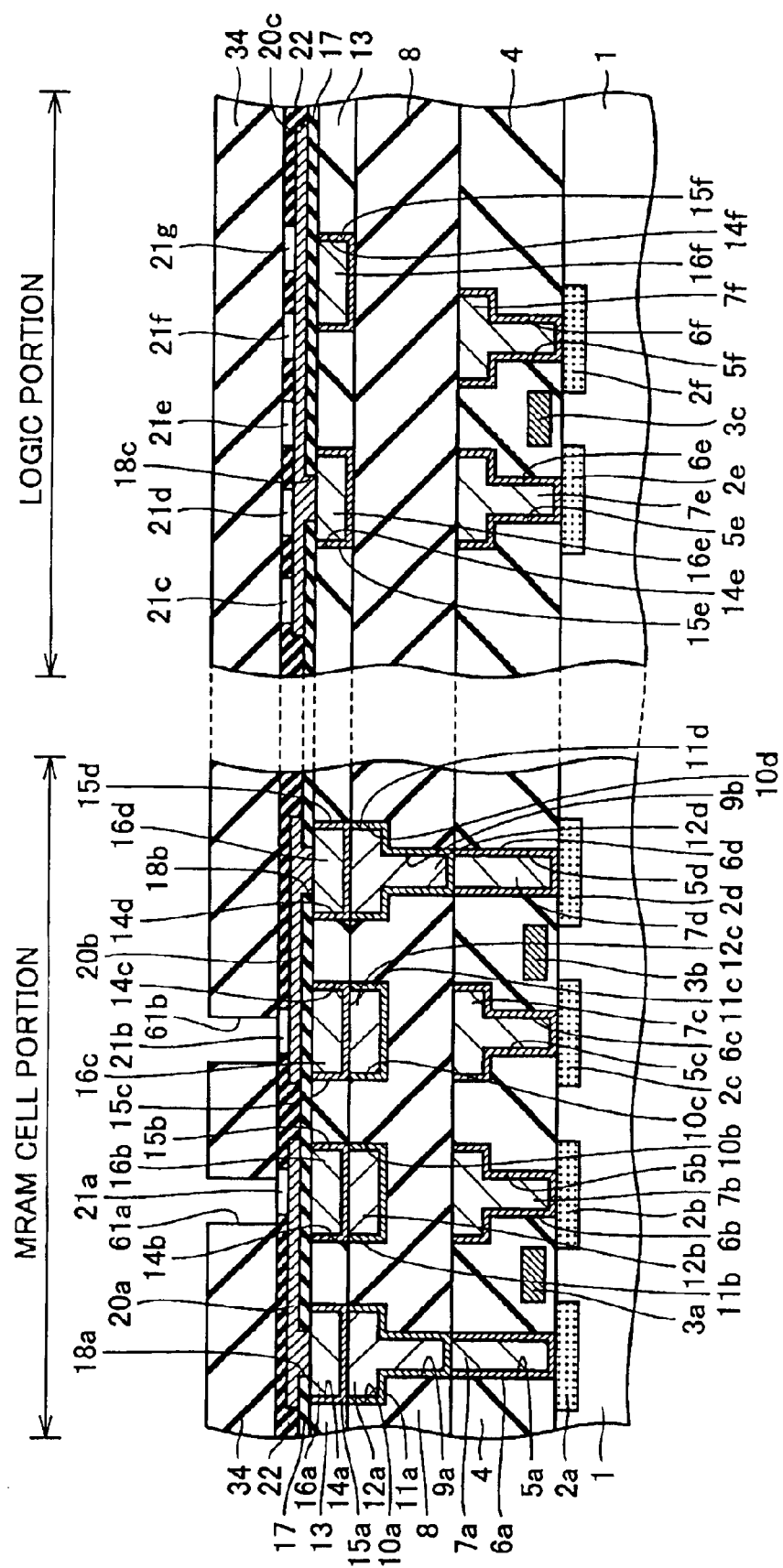
FIGS. 37–42 are schematic cross sectional views illustrating first through sixth steps of the manufacturing method of the semiconductor device shown in FIG. 36.

The semiconductor device shown in FIG. 36 has basically the same structure as that of the semiconductor device shown in FIG. 19, except for the structure of a connect portion between the bit line made of barrier metal film 24a and conductor 25a and TMR cells 21a, 21b. Specifically, in the MRAM cell portion of the semiconductor device in FIG. 36, interconnection groove 23a having the interconnection as the bit line (24a, 25a) arranged therein, includes concave portions 60a, 60b with tapered sidewalls that are formed in the regions immediately above TMR cells 21a, 21b, respectively. The upper surfaces of TMR cells 21a, 21b are exposed at the bottoms of concave portions 60a, 60b. Barrier metal film 24a is formed on the inner wall of interconnection groove 23a including concave portions 60a, 60b. Conductor 25a is formed to fill in groove 23a and concave portions 60a, 60b.

To briefly describe the characteristic configuration of the semiconductor device shown in FIG. 36 as an example of the magnetic memory device according to the present invention, the semiconductor device includes: TMR cells 21a, 21b as the magneto-resistive elements operating as the memory elements; and the interconnection (as the bit line made of barrier metal film 24a and conductor 25a) arranged to contact TMR cells 21a, 21b. The interconnection is thicker in the portions facing TMR cells 21a, 21b (i.e., the portions having concave portions 60a, 60b formed therein) than in the remaining portions (i.e., the portions unprovided with concave portions 60a, 60b). In other words, the interconnection includes an interconnection portion as the first interconnection layer, made of barrier metal film 24a and conductor 25a formed in interconnection groove 23a, and an interconnection portion as the conductor film, made of barrier metal film 24a and conductor 25a arranged in concave portions 60a, 60b.

The interconnection portion as the first interconnection layer in groove 23a is arranged opposite to TMR cells 21a, 21b, with interlayer insulating film 34 as the insulating film interposed therebetween. The interconnection portion as the conductor film fills in concave portions 60a, 60b as the openings that are formed in interlayer insulating film 34 in the regions located between the interconnection portion as the first interconnection layer and TMR cells 21a, 21b. The interconnection portions as the conductor films arranged in concave portions 60a, 60b, electrically connect the interconnection portion as the first interconnection layer arranged in interconnection groove 23a, to corresponding TMR cells 21a, 21b.

The bit line can also be made thick in the regions immediately above TMR cells 21a, 21b in this manner. The electric resistance of the bit line can be reduced in the regions above TMR cells 21a, 21b, and thus, the electric resistance of the bit line as a whole can be reduced. As a result, the same effect as in the fourth embodiment, i.e., reduction in size of the transistors constituting the bit line drivers, can be enjoyed. This is because the potential decrease of the current flowing through the bit line becomes small by virtue of the small electric resistance of the bit line, and thus, the potential being applied to the source/drain regions of the transistors constituting the bit line drivers can be increased.

Further, the current path in the bit line has a central position closer to TMR cells 21a, 21b in the regions immediately above TMR cells 21a, 21b than in the remaining regions. That is, in the region above each TMR cell 21a, 21b, the distance from the central position of the current path to the relevant TMR cell 21a, 21b becomes small. As a result, of the magnetic field generated by the bit line current, attenuation in intensity of the magnetic field acting on TMR cells 21a, 21b can be restricted.

A manufacturing method of the semiconductor device shown in FIG. 36 is described with reference to FIGS. 37–42.

Firstly, the manufacturing steps shown in FIGS. 20–27 are carried out. The step of forming TMR cells 21a, 21b shown in FIG. 25 corresponds to the step of forming the magneto-resistive elements operating as the memory elements. The step of forming interlayer insulating film 34 shown in FIG. 27 corresponds to the step of forming an insulating film (interlayer insulating film 34) on the magneto-resistive elements (TMR cells 21a, 21b). Thereafter, referring to FIG. 37, a resist film (not shown) having a pattern is formed on the upper surface of interlayer insulating film 34. Using the resist film as a mask, interlayer insulating film 34 is partially removed by etching, and the resist film is then removed. As a result, via holes 61a, 61b are formed in interlayer insulating film 34 in the regions immediately above TMR cells 21a, 21b, respectively. The step of forming via holes 61a, 61b corresponds to the step of forming openings in the insulating film (interlayer insulating film 34) to expose portions of the surfaces of TMR cells 21a, 21b. Via hole 61a, 61b may have the bottom areas partially exposing the upper surfaces of TMR cells 21a, 21b. Via holes 61a, 61b may be positioned such that at least portions thereof overlap TMR cells 21a, 21b (they may be offset or displaced from TMR cells 21a, 21b to a certain extent).

Figure 38:
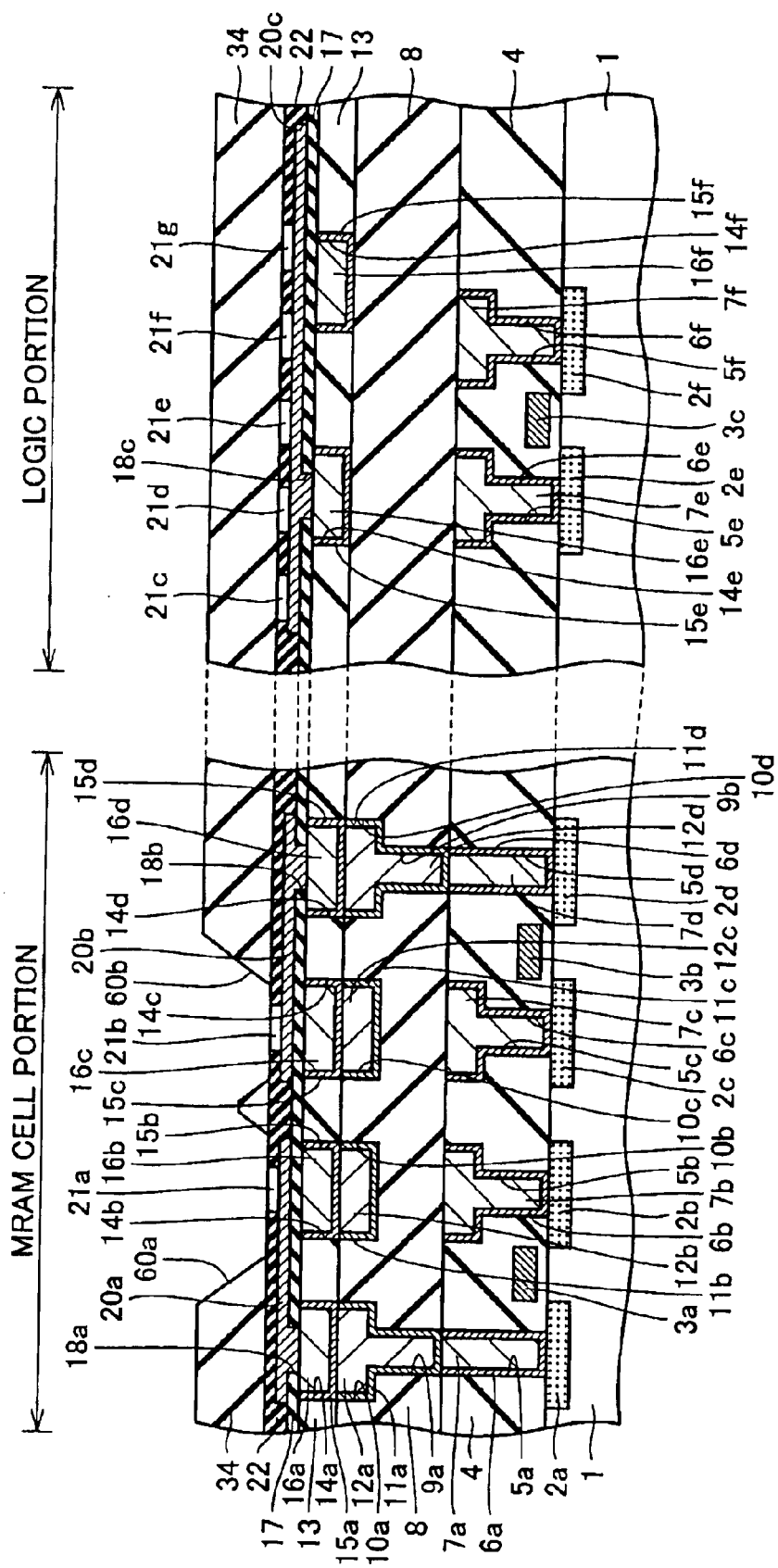

Next, sidewalls of via holes 61a, 61b are removed by isotropic wet etching. As a result, concave portions 60a, 60b having tapered sidewalls are formed in interlayer insulating film 34 in the regions immediately above TMR cells 21a, 21b, as shown in FIG. 38. The step of forming concave portions 60a, 60b corresponds to the step of widening the widths of via holes 61a, 61b as the openings by isotropic etching. The tapered angles of the sidewalls of concave portions 60a, 60b (i.e., inclined angles of the sidewalls with respect to the main surface of semiconductor substrate 1) can be changed as appropriate by changing etching conditions of the wet etching, such as processing time, type and concentration of etchant, and others. Provision of concave portions 60a, 60b having such tapered sidewalls prevents voids from being created within the relevant portions 60a, 60b during formation of barrier metal film and conductor as will be describe below.

Figure 39:
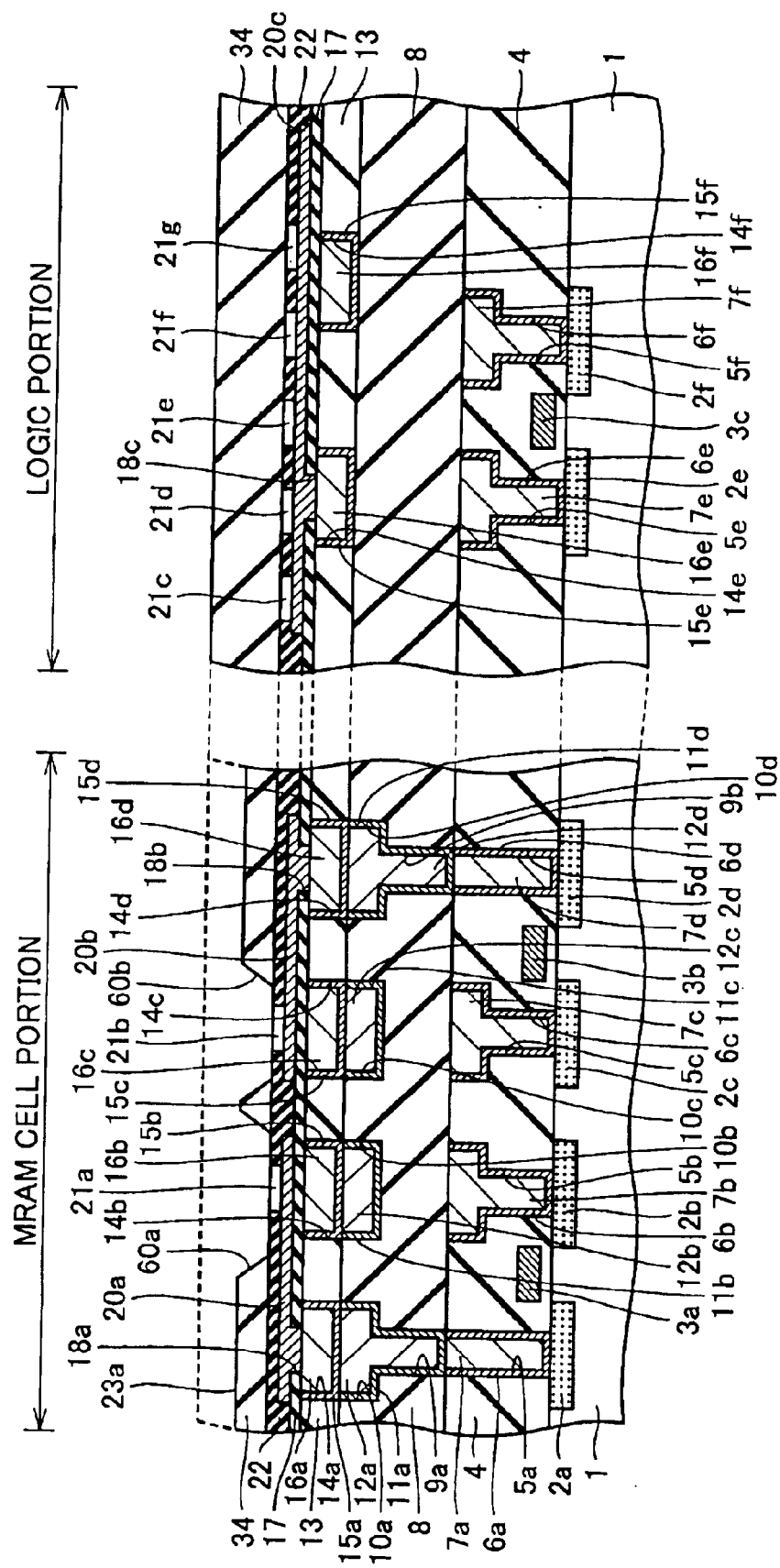

A resist film (not shown) having a pattern is formed on the upper surface of interlayer insulating film 34. Using the resist film as a mask, interlayer insulating film 34 is partially removed by etching, and the resist film is removed. As a result, interconnection groove 23a is formed through the regions overlying TMR cells 21a, 21b, as shown in FIG. 39.

Figure 40:
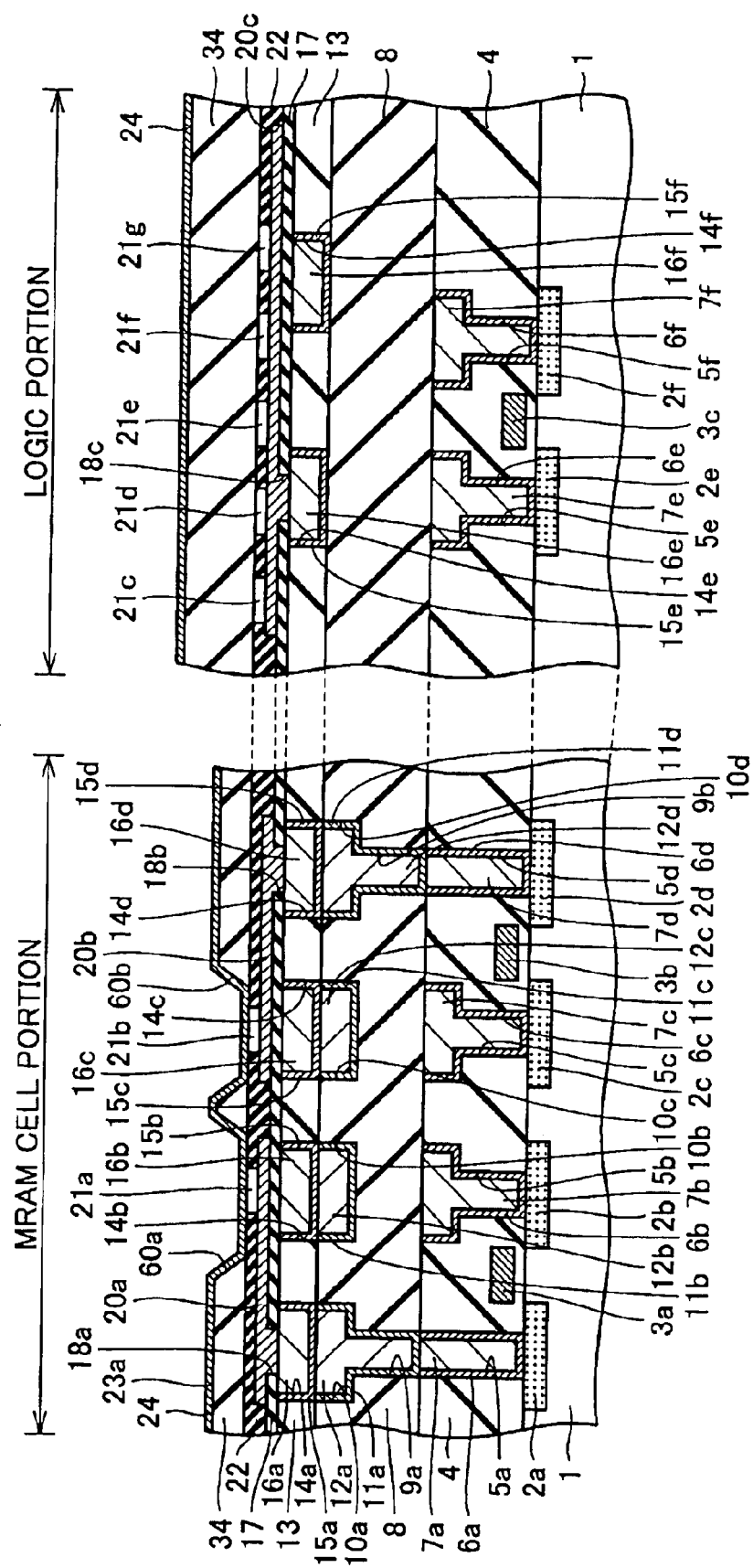

Next, as shown in FIG. 40, barrier metal film 24 is formed on the inner wall of groove 23a and on the upper surface of interlayer insulating film 34.

Figure 41:
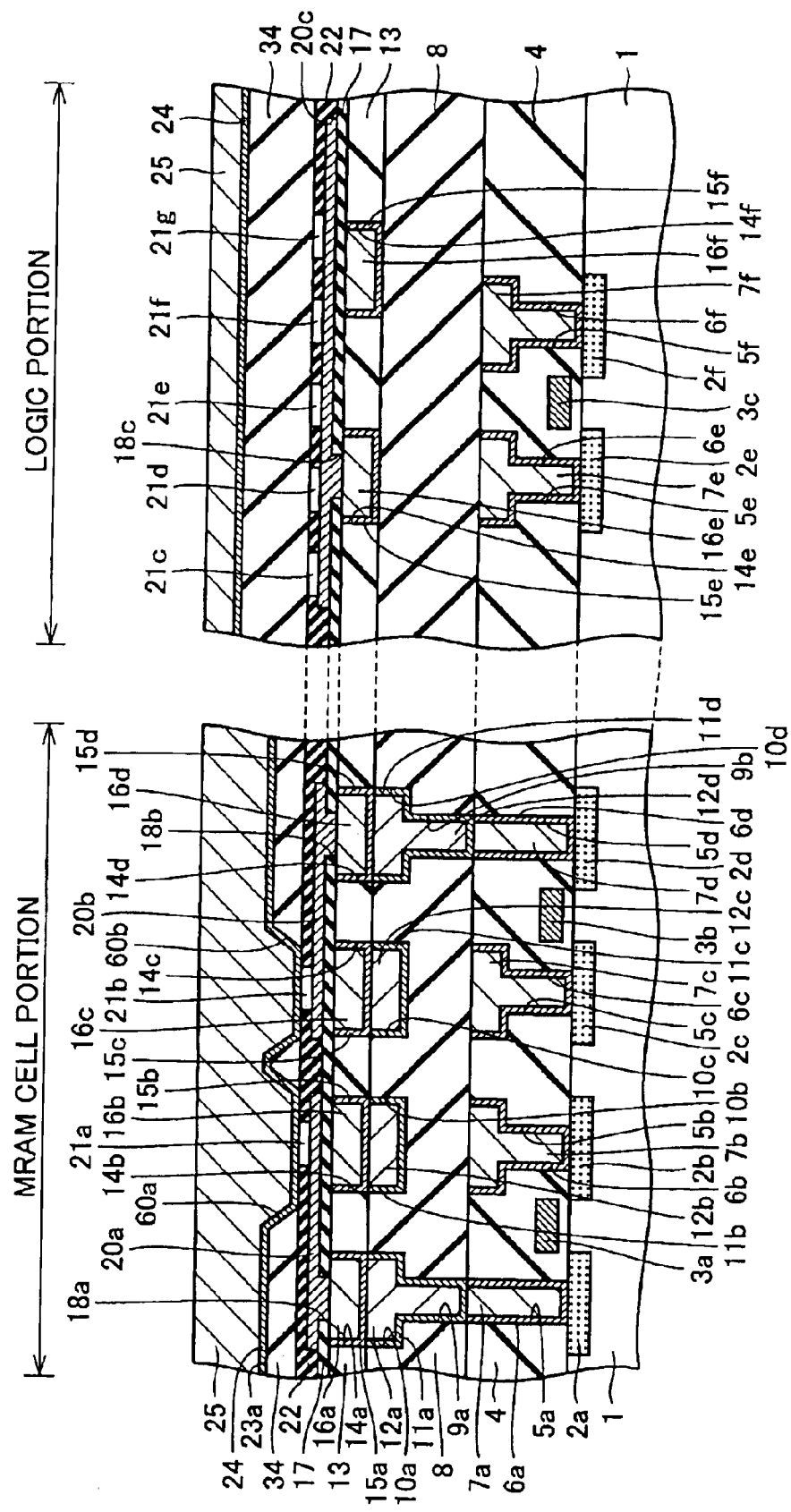

Next, as shown in FIG. 41, conductor 25 is formed on barrier metal film 24 to fill in groove 23a and to cover the upper surface of interlayer insulating film 34.

Figure 42:
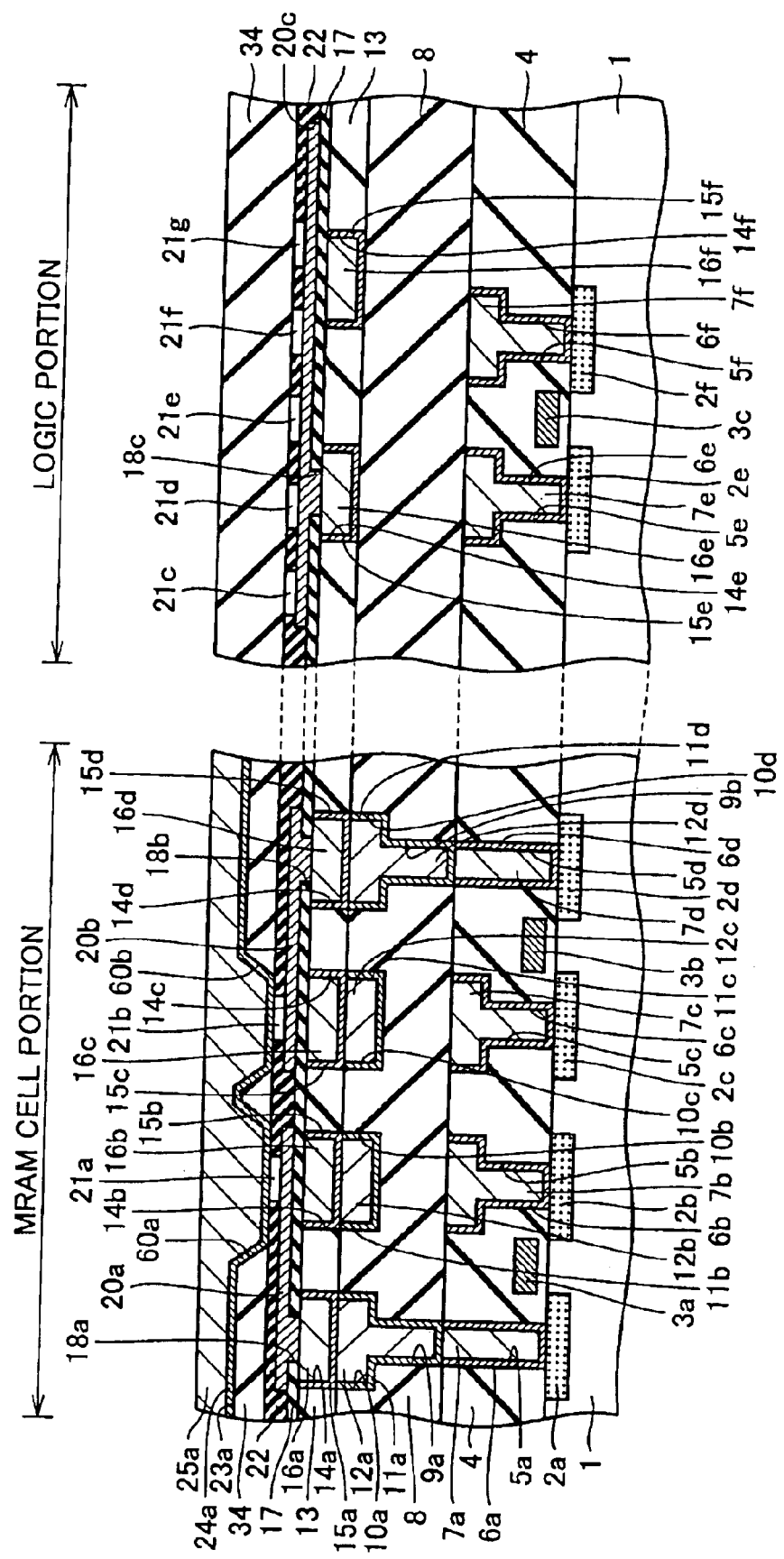

Conductor 25 and barrier metal film 24 located on the upper surface of interlayer insulating film 34 are removed by CMP. As a result, the interconnection as the bit line made of barrier metal film 24a and conductor 25a is formed in groove 23a and concave portions 60a, 60b, as shown in FIG. 42. The step of forming the interconnection as the bit line with barrier metal film 24a and conductor 25a corresponds to both the step of forming the conductor (the portion of barrier metal film 24a and conductor 25a located in concave portions 60a, 60b) in contact with TMR cells 21a, 21b inside the openings having the widened widths (concave portions 60a, 60b) and the step of forming the interconnection layer (the portion of barrier metal film 24a and conductor 25a located in groove 23a) opposite to TMR cells 21a, 21b with interlayer insulating film 34 as the insulating film interposed therebetween and also connected to the conductor.

Thereafter, returning to FIG. 36, the same steps as shown in FIG. 29 are performed to form interlayer insulating films 26, 30, interconnection grooves 27a–27c, 31a, 32b, barrier metal films 28a–28c, 32a, 32b, and conductors 29a–29c, 33a, 33b. Thus, the semiconductor device shown in FIG. 36 is readily obtained.

In the first and third to fifth embodiments above, the semiconductor device having the MRAM cells and the logic circuit mounted together on a single chip has been described as an example of the magnetic memory device according to the present invention. However, the present invention is applicable to any other magnetic memory device as long as it has an element utilizing magnetism as the memory element.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a logic portion;
   a memory element; and
   an interconnection line arranged to face said memory element and said logic portion, said interconnection line passing a current for generating a magnetic field;
   said interconnection line being thicker in a portion facing said memory element than in the logic portion.

2. The semiconductor memory device according to claim 1, wherein
   said memory element includes a magneto-resistive element, and
   said interconnection line is for applying the magnetic field to said magneto-resistive element.

3. The semiconductor memory device according to claim 1, wherein
   said memory element and said interconnection line are formed in a memory cell region on a substrate, with said memory element being arranged above said interconnection line to overlie said interconnection line,
   said interconnection line includes
   a first interconnection layer, and
   a second interconnection layer stacked on said first interconnection layer in a region located immediately beneath said memory element,
   the semiconductor memory device further comprising:
   an upper interconnection line formed to contact an upper surface of said memory element; and
   a logic interconnection line and an upper logic interconnection line formed in said logic portion, with the same layers as said first interconnection layer and said upper interconnection line, respectively.

4. The semiconductor memory device according to claim 3, further comprising a dummy interconnection line formed in the logic portion, with the same layer as said second interconnection layer.

5. A nonvolatile memory device having a memory cell portion with a memory cell formed therein and a logic portion with a logic circuit formed therein on a substrate,
   said logic portion comprising:
   a first interconnection line formed above the substrate;
   a second interconnection line formed above said first interconnection line, with solely a layer other than a conductor layer constituting said logic circuit being interposed therebetween; and
   a partial element constituting a memory cell arranged between said first and second interconnection lines; and
   said memory cell portion comprising:
   a third interconnection line formed with the same layer as said first interconnection line;
   a fourth interconnection line formed with the same layer as said second interconnection line; and
   a memory element and a conductor layer formed between said third and fourth interconnection lines to constitute said memory cell.

6. The nonvolatile memory device according to claim 5, wherein said memory element includes a magneto-resistive element.

7. The nonvolatile memory device according to claim 5, wherein said conductor layer includes a fifth interconnection line formed between said third and fourth interconnection lines and connected to said memory element.

8. A magnetic memory device, comprising:
   a magneto-resistive element operating as a memory element; and
   an interconnection, as a bit line, arranged to contact said magneto-resistive element;
   said interconnection being thicker in a portion facing said magneto-resistive element than in a portion other than the portion facing said magneto-resistive element.

9. The magnetic memory device according to claim 8, wherein
   said interconnection includes
   a first interconnection layer and
   a second interconnection layer stacked on said first interconnection layer in a region overlying said magneto-resistive element.

10. The magnetic memory device according to claim 8, wherein
    said interconnection includes
    a first interconnection layer arranged opposite to said magneto-resistive element with an insulating film interposed therebetween, and
    a conductor film filling an opening formed in said insulating film in a region located between said first interconnection layer and said magneto-resistive element to electrically connect said first interconnection layer to said magneto-resistive element.

* * * * *